(12) United States Patent
Zhu

(10) Patent No.: US 11,380,689 B2
(45) Date of Patent: Jul. 5, 2022

(54) SEMICONDUCTOR MEMORY DEVICE, METHOD OF MANUFACTURING THE SAME, AND ELECTRONIC DEVICE INCLUDING THE SEMICONDUCTOR MEMORY DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 192 days.

(21) Appl. No.: 16/626,793

(22) PCT Filed: Sep. 21, 2018

(86) PCT No.: PCT/CN2018/107038
§ 371 (c)(1),
(2) Date: Dec. 26, 2019

(87) PCT Pub. No.: WO2020/042255
PCT Pub. Date: Mar. 5, 2020

(65) Prior Publication Data
US 2021/0335789 A1    Oct. 28, 2021

(30) Foreign Application Priority Data

Aug. 28, 2018    (CN) .......................... 201810992854.0

(51) Int. Cl.
*H01L 27/108*    (2006.01)
*G11C 11/408*    (2006.01)
(Continued)

(52) U.S. Cl.
CPC .... *H01L 27/10805* (2013.01); *G11C 11/4085* (2013.01); *G11C 11/4097* (2013.01); *H01L 29/42392* (2013.01)

(58) Field of Classification Search
CPC ......... H01L 27/10805; H01L 27/10814; H01L 27/10855; H01L 27/10873;
(Continued)

(56) References Cited

U.S. PATENT DOCUMENTS 8,058,683 B2    11/2011    Yoon et al.
2008/0173936 A1    7/2008    Yoon et al.
(Continued)

FOREIGN PATENT DOCUMENTS

CN    101090117    12/2007
CN    101226960    7/2008
(Continued)

OTHER PUBLICATIONS

International Search Report, issued in the corresponding PCT application No. PCT/CN2018/107038, dated Jun. 5, 2019, 4 pages.
(Continued)

*Primary Examiner* — Brook Kebede
(74) *Attorney, Agent, or Firm* — Hamre, Schumann, Mueller & Larson, P.C.

(57) ABSTRACT

A semiconductor memory device, a method of manufacturing the same, and an electronic device including the semiconductor memory device are disclosed. According to an embodiment, the semiconductor memory device may include a substrate; an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region
(Continued)

between the source/drain regions; and a plurality of bit lines formed on the substrate, wherein each of the bit lines is located below a corresponding one of the columns of memory cells and is electrically connected to the source/drain regions at lower ends of the respective memory cells in the corresponding column, wherein each of the memory cells further comprises a gate stack formed around a periphery of a corresponding channel region, and a respective one of the rows of memory cells has gate conductor layers included in the gate stacks of the respective memory cells in the row extending continuously in a direction of the row to form a corresponding one of word lines.

25 Claims, 47 Drawing Sheets

(51) Int. Cl.
  *G11C 11/4097* (2006.01)
  *H01L 29/423* (2006.01)
(58) Field of Classification Search
  CPC ......... H01L 27/10885; H01L 27/11519; H01L 27/11521; H01L 27/11556; H01L 27/11565; H01L 27/11568; H01L 27/11582; H01L 27/11587; H01L 27/1159; H01L 27/11597; H01L 29/42356; H01L 29/42392; H01L 29/7391; H01L 29/7827; H01L 29/78642; G11C 11/4085; G11C 11/4097
  USPC .......................................................... 257/296
  See application file for complete search history.

(56) References Cited

U.S. PATENT DOCUMENTS

| | | | |
|---|---|---|---|
| 2015/0318299 A1* | 11/2015 | Lai | H01L 27/1157 257/325 |
| 2019/0074363 A1* | 3/2019 | Zhu | H01L 27/11597 |
| 2019/0157345 A1* | 5/2019 | Zhu | H01L 27/228 |
| 2019/0333930 A1* | 10/2019 | Borukhov | H01L 29/0847 |

FOREIGN PATENT DOCUMENTS

| | | |
|---|---|---|
| CN | 102522407 | 6/2012 |
| KR | 20080068544 | 7/2008 |
| KR | 20180059271 | 6/2018 |

OTHER PUBLICATIONS

First Office Action, issued in the corresponding Korean patent application No. 10-2021-7008822, dated Feb. 25, 2022, 20 pages.

\* cited by examiner

1

SEMICONDUCTOR MEMORY DEVICE, METHOD OF MANUFACTURING THE SAME, AND ELECTRONIC DEVICE INCLUDING THE SEMICONDUCTOR MEMORY DEVICE

CROSS-REFERENCE TO RELATED APPLICATION(S)

This application claims priority to Chinese Patent Application No. 201810992854.0, filed on Aug. 28, 2018, entitled "SEMICONDUCTOR MEMORY DEVICE, METHOD OF MANUFACTURING THE SAME, AND ELECTRONIC DEVICE INCLUDING THE SEMICONDUCTOR MEMORY DEVICE", which is incorporated herein by reference in its entirety.

TECHNICAL FIELD

The present disclosure relates to the field of semiconductors, and more particularly, to a semiconductor memory device based on a vertical device, a method of manufacturing the same, and an electronic device including the semiconductor memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device. A nanowire or nano sheet Vertical Gate-all-around Field Effect Transistor (V-GAAFET) is one of candidates for future integrated devices with high performance and high density.

However, for the vertical device, it is difficult to control a gate length thereof, especially for one with a single-crystalline channel material. In addition, it is difficult to build a buried bit line below a vertical transistor, and it is also difficult to form bit lines with high density. Further, in an array of memories, word lines and bit lines still have large footprints.

SUMMARY

In view of the above, the present disclosure aims to provide, among others, a semiconductor memory device, a method of manufacturing the same, and an electronic device including the semiconductor memory device, which have improved characteristics.

According to an aspect of the present disclosure, there is provided a semiconductor memory device, comprising: a substrate; an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region between the source/drain regions; and a plurality of bit lines formed on the substrate, wherein each of the bit lines is located below a corresponding one of the memory cell columns, and is electrically connected to the source/drain regions at lower ends of the respective memory cells in the corresponding column, wherein each of the memory cells further comprises a gate stack formed around a periphery of a corresponding channel region, and a respective one of the rows of memory cells has gate conductor layers included in the gate stacks of the respective memory cells in the row extending continuously in a direction of the row to form a corresponding one of word lines.

According to another aspect of the present disclosure, there is provided a method of manufacturing a semiconductor memory device, comprising: providing a stack of a first source/drain layer, a channel layer, a second source/drain layer, and a hard mask layer on a substrate; patterning the stack into an array of sub-stacks arranged in rows and columns, wherein in each of the rows, adjacent ones of the sub-stacks have bridge portions therebetween; forming, at lower portions of the first source/drain layer in the respective columns of sub-stacks, a plurality of bit lines extending in a direction of the respective column; and forming gate stacks below the hard mask layer to surround a periphery of the channel layer, wherein in each of the rows, gate stacks have bridge portions corresponding to those of the hard mask layer and forming respective word lines.

According to yet another aspect of the present disclosure, there is provided an electronic device comprising the semiconductor memory device described above.

The semiconductor memory device according to embodiments of the present disclosure is based on vertical devices such as V-GAAFETs. The active region, particularly the channel region therein, may include a single-crystalline semiconductor material, and thus may have high mobility of carriers and low leakage current, thereby improving the device performance. The word lines may be formed by the gate stacks themselves which extend continuously, which may save the area. In addition, the buried bit lines may be formed below the active regions. The configuration of the buried bit lines facilitates the integration of the vertical device and thus saves the area.

According to embodiments of the present disclosure, at least one of the buried bit lines and the word lines may be formed in a self-aligned manner. This can facilitate the manufacturing and helps to save the area.

BRIEF DESCRIPTION OF THE DRAWINGS

The above and other objects, features, and advantages of the present disclosure will become more apparent from following descriptions on embodiments thereof with reference to attached drawings, in which.

Throughout the attached drawings, the same or similar reference numbers denote the same or similar elements.

DETAILED DESCRIPTION

Figure 1:
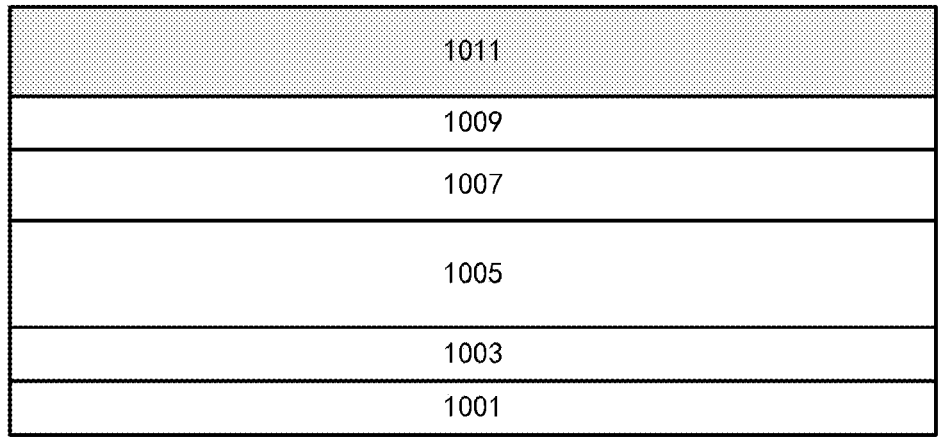
FIGS. 1-26(*c*) are schematic views showing a flow of manufacturing a semiconductor memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be provided directly on the further layer/element, or otherwise there may be an intervening layer/element interposed therebetween. Further, if a layer/element is "on" a further layer/element in an orientation, then the layer/element can be "under" the further layer/element when the orientation is turned.

A semiconductor memory device according to an embodiment of the present disclosure is based on vertical devices. The vertical device may include a pillar-shaped (for example, cylindrical or hexahedral, i.e., having a circular or quadrangular, such as square or rectangular sectional view) active region which extends vertically. When the active region has a small diameter or side length, such a vertical device may constitute a nano V-GAAFET. The active region each may include source/drain regions at upper and lower ends respectively and a channel region between the source/drain regions.

According to an embodiment of the present disclosure, the active region may be provided by epitaxial growth. The source/drain regions and the channel region may advantageously be provided by different semiconductor layers. For example, a first source/drain layer, a channel layer, and a second source/drain layer may be grown respectively to have the lower source/drain region, the channel region, and the upper source/drain region formed therein, respectively. The respective layers may be contiguous to each other, although there may also be other semiconductor layers therebetween, for example, a leakage suppression layer or an On current enhancement layer (i.e., a semiconductor layer having a band gap greater than or less than that of adjacent layers). There may be a clear crystal interface between at least one pair of the adjacent layers, because they are epitaxially grown separately. In addition, the respective layers may be doped respectively so that there may be a doping concentration interface between the at least one pair of the adjacent layers.

According to an embodiment of the present disclosure, the channel layer or the channel region may include single-crystalline semiconductor material to improve the device performance. Of course, the source/drain layers or the source/drain regions may also include single-crystalline semiconductor material. Thus, the entire active region may be made of single-crystalline semiconductor material(s). The single-crystalline semiconductor material of the channel layer or the channel region and the single-crystalline semiconductor material of the source/drain layers or the source/drain regions may be a cocrystal. Mobility of electrons or holes in the single-crystalline semiconductor material of the channel layer or the channel region may be greater than that of the first and second source/drain layers or the first and second source/drain regions. Further, a forbidden band gap of the first and second source/drain layers or the first and second source/drain regions may be greater than that of the single-crystalline semiconductor material of the channel layer or the channel region.

According to an embodiment of the present disclosure, the single-crystalline semiconductor material of the channel layer or the channel region may have the same crystal structure as the first and second source/drain layers or the first and second source/drain regions. In this case, a lattice constant of the first and second source/drain layers or the first and second source/drain regions without being strained may be greater than that of the single-crystalline semiconductor material of the channel layer or the channel region without being strained. Thus, mobility of carriers in the single-crystalline semiconductor material of the channel layer or the channel region may be greater than the mobility of carriers therein if without being strained, or an effective mass of lighter carriers in the single-crystalline semiconductor material of the channel layer or the channel region may be less than the effective mass of lighter carriers therein if without being strained, or a concentration of the light carriers in the single-crystalline semiconductor material of the channel layer or the channel region may be greater than the concentration of the light carriers therein if without being strained. Alternatively, the lattice constant of the first and second source/drain layers or the first and second source/drain regions without being strained may be less than that of the single-crystalline semiconductor material of the channel layer or the channel region without being strained. Thus, mobility of electrons in the single-crystalline semiconductor material of the channel layer or the channel region may be greater than if without being strained, or an effective mass of electrons in the single-crystalline semiconductor material of the channel layer or the channel region may be less than the effective mass of electrons if without being strained, for example, when a <110> direction of the single-crystalline semiconductor material of the channel layer is parallel to a current density vector between the source and the drain.

The vertical device may further comprise a gate stack formed around a periphery of the active region, particularly the channel region. The gate stack is formed in a self-alignment manner. A gate length may be determined by a thickness of the channel region itself, rather than the time-consuming etching as in the conventional art. As described above, the channel layer having the channel region formed therein may be formed by epitaxial growth, and thus the thickness thereof can be well controlled. Therefore, the gate length can be well controlled. The gate stack may be substantially coplanar with the channel layer (channel region). In this way, overlapping of the gate stack with the source/drain regions may be reduced or even avoided, which helps to reduce parasitic capacitance between the gate and the source/drain. According to an embodiment of the present disclosure, the channel layer may include a semiconductor material different from that of the first and second source/drain layers, and the first and second source/drain layers may include the same semiconductor material.

According to an embodiment of the present disclosure, the vertical device may be a conventional Field Effect Transistor (FET). In a case of the conventional FET, the source and drain regions may have the same conductivity type of doping (for example, n-type doping or p-type doping). A conduction channel may be formed by the channel region between the source and drain regions at opposite ends of the channel region. Alternatively, such a semiconductor device may be a tunneling FET. In a case of the tunneling FET, the source and drain regions on the opposite sides of the channel region may have different conductivity types of doping (for example, n-type doping and p-type doping respectively). In this case, charged particles such as electrons may tunnel from the source region into the drain region through the channel region, thereby forming a conduction path between the source and drain regions. Although the conventional FET and the tunneling FET have different conductive mechanisms, they both exhibit an electrical property that the gate controls whether there is a conduction or not between the source and drain regions. Therefore, for both the conventional FET and the tunneling FET, descriptions are made by collectively using the terms "source/drain layer (source/drain region)" and "channel layer (channel region)", although there is no common "channel" in the tunneling FET.

Such a vertical device may act as a switch device in a memory cell, and the memory cell may further include a storage element (for example, a capacitor) connected to the switch device (resulting in, for example, a 1T1C configuration). Alternatively, the memory cell may be entirely based on the vertical device. For example, the gate stack may include a memory configuration such as a floating gate configuration or a charge trapping layer or a ferro-electric material or the like. Those skilled in the art can conceive of other memory cell configurations. Such memory cells may be arranged in an array in rows and columns. The memory cells based on vertical devices are relatively easy for three dimension (3D) integration. In particular, planar arrays of memory cells may be stacked in multiple layers so as to form a 3D array of memory cells. Those memory cells may constitute a Dynamic Random Access Memory (DRAM).

According to an embodiment of the present disclosure, word lines may be formed by bridge portions between gate stacks of respective memory cells in each memory cell row (the bridge portions electrically connect the gate stacks in the same memory cell row to each other). Such bridge portions may be formed by extension of the gate stacks (particularly gate conductor layers therein). For example, a gate stack (particularly a gate conductor layer therein) of each memory cell in each memory cell row may extend continuously in a row direction to form a corresponding word line. Thus, the word lines may be substantially coplanar with the gate stacks (particularly the gate conductor layers therein).

According to an embodiment of the present disclosure, bit lines may be buried below the active regions, more specifically, below the lower source/drain regions. For example, each of the bit lines may extend along a direction of a corresponding one of the memory cell columns to be aligned with the lower source/drain regions of the respective memory cells in the corresponding column. This configuration facilitates electrical connection of the bit line to the lower source/drain regions of the memory cells. For example, the memory cells may have their respective active regions directly stacked on the corresponding bit line, and thus the lower source/drain regions thereof are in direct contact with the bit line and therefore electrically connected to the bit line. This configuration of the buried bit lines facilitates the integration of the memory cells.

According to an embodiment of the present disclosure, the bit lines may be formed based at least partly on a self-alignment technique. For example, a portion (herein, referred to as "a first portion") of a bit line which overlaps with a corresponding memory cell may have at least a part of a periphery which is substantially the same as a part of a periphery of the corresponding memory cell, particularly, an active region thereof. This part of the periphery is formed by using the shape of the periphery of the corresponding memory cell as a mask, and is thus "self-aligned" (and may be further etched to be slightly retracted as described below). That is, the first portion is located directly below and substantially center-aligned with the corresponding memory cell. The self-aligned bit line facilitates electrical contact between the bit line and the lower source/drain regions, and does not occupy extra area because the bit line is aligned below the memory cells.

The bit line may also include second portions which extend between respective first portions. For the convenience of patterning, the second portion may be in a (straight) strip shape. A part of the periphery of the first portion is substantially in the same shape as that of a part of the periphery of the corresponding memory cell as described above. Therefore, the bit line according to the embodiment of the present disclosure may have a variable thickness, unlike a bit line with a substantially uniform thickness in the conventional art. For example, the first portion of the bit line may be thicker than the second portion of the bit line (here, the "thickness" may refer to a dimension perpendicular to a longitudinal direction thereof, and may also be referred to as a line width).

More specifically, the second portion of the bit line may include a first sidewall and a second sidewall which extend substantially along a column direction and oppose to each other; the first portion of the bit line may include a third sidewall connecting the first sidewall of the second portion adjacent to the first portion, and a fourth sidewall connecting the second sidewall of the second portion adjacent to the first portion. At least one of the third sidewall and the fourth sidewall of the first portion of the bit line may be formed by a self-alignment technique, and thus may protrude with respect to a corresponding one of the first or second sidewall in a direction perpendicular to the memory cell column. Due to the self-alignment, at least one of the third sidewall and the fourth sidewall is substantially conformally formed with respect to a part of a periphery of the active region of the corresponding memory cell, so that a pattern with a substantially uniform thickness is defined in a top view by the at least one of the third sidewall and the fourth sidewall and the part of the periphery of the active region of the corresponding memory cell.

According to an embodiment of the present disclosure, lower portions of lower source/drain regions of the respective memory cells in the same memory cell column may extend integrally, and bit lines are formed by a metal semiconductor compound which is produced by reaction of a surface portion of the lower source/drain regions with a metal element. Since this reaction occurs on the surface of the lower source/drain regions, the bit lines are self-aligned below the memory cells.

Such a semiconductor memory device may be manufactured, for example, as follows. According to an embodiment of the present disclosure, a stack of a first source/drain layer, a channel layer, a second source/drain layer and a hard mask layer may be provided on a substrate. Here, the hard mask layer is provided for convenience of patterning. For example, the stack may be provided by epitaxial growth. Thus, the channel layer may be formed of a single-crystalline material (of course, the source/drain layers may also be formed of a single-crystalline material).

Active regions may be defined in the stack, particularly in the first source/drain layer, the channel layer, and the second source/drain layer. For example, the hard mask layer, the second source/drain layer, the channel layer and the first source/drain layer may be selectively etched in sequence into a desired shape. In general, the active regions may be in a pillar (for example, cylindrical or hexahedral) shape. In order to form the array of memory cells, an array of pillar-shaped active regions arranged in rows and columns may be defined. To this end, the stack may be patterned into an array of sub-stacks arranged in rows and columns. In addition, in order to form the bridge portions between the respective gate stacks described above to form bit lines, adjacent ones of sub-stacks in each row may have bridge portions therebetween.

According to an embodiment of the present disclosure, a conductive metal semiconductor compound may be produced by reaction of a semiconductor element in active regions, particularly in the underlying first source/drain layer, with a metal element, to form bit lines. In order to ensure that the bit lines extend continuously below the respective columns of active regions, when the first source/drain layer is patterned, it may be patterned into a plurality of strips which correspond to the respective columns of active regions and extend continuously.

In this case, for the first source/drain layer, on the one hand, lower source/drain regions of the respective memory cells need to be formed, and on the other hand, continuous strips corresponding to the respective columns need to be formed. Therefore, the patterning of the first source/drain layer may be performed in different steps. For example, upper portions of the first source/drain layer may be patterned using a mask defining the array, and the lower portions of the first source/drain layer may be patterned using a mask defining the bit lines.

Patterning of the lower portions of the first source/drain layer may be performed in a self-aligned manner. In this case, a mask layer may be formed on the stack, wherein the mask layer covers regions between sub-stacks adjacent to each other (i.e., adjacent sub-stacks) in the column direction in the respective columns of sub-stacks, exposes regions between the respective columns of sub-stacks, and exposes partially opposing sidewalls of portions of the hard mask layer in adjacent columns of sub-stacks. Due to the exposure of the part of the sidewalls of the hard mask layer, when the first source/drain layer is selectively etched, the exposed part of the sidewalls of the hard mask layer may define shapes of cuts in the first source/drain layer together with the mask layer. Accordingly, boundaries of the bit lines defined by the cuts may be defined by the sidewalls of the hard mask layer (and may possibly be slightly retracted due to further etching). The hard mask layer is self-aligned with the underlying active regions, and therefore the bit lines may also be self-aligned below the columns of sub-stacks. For example, the mask layer may include strip patterns extending between adjacent sub-stacks in the column direction in each column of sub-stacks respectively.

According to an embodiment of the present disclosure, such a mask layer may be formed without a mask. For example, a spacing between adjacent sub-stacks in the column direction may be set to be less than a spacing between adjacent sub-stacks in the row direction. In this case, a mask material layer having a film thickness greater than a half of the spacing between the adjacent sub-stacks in the column direction and less than a half of the spacing between the adjacent sub-stacks in the row direction may be deposited (so that the spacing between the adjacent sub-stacks in the column direction may be filled up, and the spacing between the adjacent sub-stacks in the row direction may not be filled up), and then the deposited mask material layer is etched back by a thickness not less than the film thickness of the deposited mask material layer. Thus, a mask material layer between the adjacent sub-stacks in the row direction may be removed, and a mask material layer between the adjacent sub-stacks in the column direction may be left, so as to obtain the mask layer described above.

According to an embodiment of the present disclosure, particularly in a case where a bulk substrate is used, the stack may further include a sacrificial layer. When the first source/drain layer is patterned, the same mask layer may be used to cut off the sacrificial layer to form cuts in the sacrificial layer. The sacrificial layer may then be processed through these cuts, so that the sacrificial layer is removed.

Since the bottom of the first source/drain layer may be suspended due to the removal of the sacrificial layer, a hold layer may be provided to hold the sub-stacks to prevent them from collapsing during the manufacturing process. To this end, every two adjacent columns of sub-stacks may be taken as a group, and a first hold layer (which may include a dielectric material) is formed at a position between two columns of sub-stacks in each group. In addition, a hold layer may not be formed between respective groups to expose the sacrificial layer, so that the sacrificial layer is processed. Thus, the sacrificial layer may be selectively etched through the exposed portions of the sacrificial layer to remove the sacrificial layer. A second hold layer (which may include a dielectric material, which, for example, is the same as that of the first hold layer) may be formed in a space left due to the removal of the sacrificial layer.

The first hold layer may also be formed without a mask. For example, a spacing between adjacent columns of sub-stacks in each group may be set to be less than a spacing between opposing columns of sub-stacks in two adjacent groups. In this case, a hold material layer having a film thickness greater than a half of the spacing between the adjacent columns of sub-stacks in each group but less than a half of the spacing between the opposing columns of sub-stacks in the two adjacent groups is deposited (so that the spacing between the adjacent columns of sub-stacks in each group may be filled up, and the spacing between the opposing columns of sub-stacks in the two adjacent groups may not be filled up), and then the deposited hold material layer is etched back by a thickness not less than the film thickness of the deposited hold material layer. Thus, a hold material layer between the opposing columns of sub-stacks in the two adjacent groups may be removed, and a hold material layer between the adjacent columns of sub-stacks in each group may be left, so as to obtain the first hold layer.

In addition, due to the presence of the bridge portions, after the lower portions of the first source/drain layer are patterned using the mask layer and the hard mask layer, the lower portions of the first source/drain layer may be connected through the bridge portions between the respective columns. In order to separate the lower portions of the first source/drain layer between the respective columns, the lower portions of the first source/drain layer may further be selectively etched to remove the bridge portions between the respective columns. In addition, an amount of etching is controlled, so that the lower portions of the first source/drain layer remain extended continuously in the column direction. To this end, the strip patterns of the mask layer may have a size in the row direction greater than that of the bridge portions in the column direction.

After the bit lines are formed, gate stacks may be formed around a periphery of the channel layer. For example, the periphery of the channel layer may be recessed inwardly with respect to the periphery of the hard mask layer so as to define spaces for accommodating the gate stacks. For example, this may be done by selective etching. In addition, the bridge portions of the channel layer may be removed to leave spaces below the hard mask layer. Thus, the gate stacks may be formed in the recesses and spaces described above. Thus, the gate stacks may be embedded in the recesses, and gate stacks of respective memory cells in the same row may extend continuously.

In a case where the bit lines are formed by reaction of the first source/drain layer with a metal element, in order to prevent a semiconductor element in the channel layer from reacting with the metal element as well, a sacrificial gate may firstly be formed around the channel layer. Similarly, sidewalls of the channel layer may be recessed inwardly with respect to sidewalls of the hard mask layer by selectively etching the channel layer, so as to define a space for accommodating the sacrificial gate. The sacrificial gate may be formed in this space. The sacrificial gate may prevent the channel layer from coming into contact and thus reacting with the metal element. The sacrificial gate is then replaced with the gate stacks using an alternative gate technique.

Similarly, a protection layer may be formed around sidewalls of the second source/drain layer and the upper portions of the first source/drain layer (which are patterned to correspond to the respective memory cells). For example, the sidewalls of the second source/drain layer and the upper portions of the first source/drain layer may be recessed inwardly with respect to the sidewalls of the hard mask layer by selective etching, so as to define a space for accommodating the protection layer. The protection layer may be formed in this space. The protection layer may prevent the second source/drain layer and the upper portions of the first source/drain layer from coming into contact and thus reacting with the metal element.

According to an embodiment of the present disclosure, when the channel layer is relatively recessed as described above, an amount of selective etching may cause the bridge portions of the channel layer to be removed, and then the channel layer of the respective memory cells is separated. In addition, when the sacrificial gate is formed, the sacrificial gate may still have bridge portions due to the presence of the source/drain layers at the upper and lower ends, which define the bridge portions of the gate stacks (so that gate stacks in the same row may extend continuously).

Similarly, when the second source/drain layer and the upper portions of the first source/drain layer are relatively recessed as described above, the amount of selective etching may cause their respective bridge portions to be removed, and then the source/drain layers of the respective memory cells are separated (especially the second source/drain layer is separated, and the lower portions of the first source/drain layer may extend continuously in the column direction).

As described above, since the bit lines are self-aligned below the sub-stacks, the sub-stacks may be used to form bit line contacts to the bit lines. For example, this may be done by reaction of the active regions in the sub-stack as well during the above reaction. Thus, the bit line contacts may include a metal semiconductor compound at the bottom (contact plugs or the like may also be formed on the top thereof to be further led out to an interconnect layer). Since the formation is done using the same sub-stacks, such a metal semiconductor compound in the bit line contacts may have substantially the same outline as those of the active regions, and may have its top surface substantially coplanar with a top surface of source/drain regions at the upper ends of the memory cells.

In a case where storage elements such as capacitors are additionally formed, a dielectric layer may be formed to cover the stack and the word lines, and the storage elements electrically connected to the second source/drain layer in the respective active regions may be formed in the dielectric layer. An electrical connection between the storage elements and the second source/drain layer may be formed by replacing the hard mask layer with conductive plugs.

The technology of the present disclosure may be implemented in various ways, some of which are exemplified in the following with reference to the drawings.

In the following description, materials of the respective layers are exemplified. The selection of the different materials primarily aims to provide desired etching selectivity. The following expression "selectively etching B (against A)" means that an etching recipe used may primarily act on B without substantially affecting or less affecting A or other material layers which are exposed to the etching recipe when B is etched (in a case where A is not explicitly mentioned or only a part of the material layers is mentioned). Based on these descriptions, those skilled in the art will understand how to select materials of the respective layers, instead of selecting only the materials exemplified herein.

FIGS. 1-26(b) are schematic views showing a flow of manufacturing a semiconductor memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for the convenience of description.

On the substrate 1001, a sacrificial layer 1003, a first source/drain layer 1005, a channel layer 1007, and a second source/drain layer 1009 may be formed in sequence by, for example, epitaxial growth. For the convenience of etching as described below, etching selectivity may be provided between adjacent ones of the layers by, for example, making the adjacent layers from different semiconductor materials. For example, the sacrificial layer 1003 may include SiGe (with an atomic percentage of Ge being about 10-35%) with a thickness of about 10-40 nm; the first source/drain layer 1005 may include Si with a thickness of about 50-200 nm; the channel layer 1007 may include SiGe (with an atomic percentage of Ge being about 10-35%) with a thickness of about 10-50 nm; and the second source/drain layer 1009 may include Si with a thickness of about 20-100 nm. A gate length may then be defined by a thickness of the channel layer 1007. Here, the first source/drain layer 1005 has a relatively large thickness since bit lines may be formed by silicidation reaction in the present embodiment as described below.

The first source/drain layer 1005 and the second source/drain layer 1009 may be in-situ doped while being grown. For example, for an n-type device, n-type doping may be performed on the first source/drain layer 1005 and the second source/drain layer 1009 with a doping concentration of about 1E17-1E20 $cm^{-3}$; and for a p-type device, p-type doping may be performed on the first source/drain layer 1005 and the second source/drain layer 1009 with a doping concentration of about 1E17-1E20 $cm^{-3}$. In addition, the channel layer 1007 may also be doped in-situ to adjust a threshold voltage ($V_t$) of the device. For example, for an n-type device, p-type doping may be performed on the channel layer 1007 with a doping concentration of about 1E15-1E19 $cm^{-3}$; and for a p-type device, n-type doping may be performed on the channel layer 1007 with a doping concentration of about 1E15-1E19 $cm^{-3}$.

In addition, for a junctionless device, the same type of doping may be performed on the first source/drain layer 1005, the channel layer 1007, and the second source/drain layer 1009. For a tunneling device, different types of doping may be performed on the first source/drain layer 1005 and the second source/drain layer 1009. For example, p-type doping may be performed on the first source/drain layer 1005 and n-type doping may be performed on the second source/drain layer 1009, or vice versa.

A hard mask layer 1011 may be provided above the stack of the semiconductor layers. The hard mask layer 1011 may then be used to define a shape of the active regions, (etch or planarize) a stop layer, and protect the underlying semiconductor layers, or the like. For example, the hard mask layer 1011 may include nitride (for example, silicon nitride) with a thickness of about 20-150 nm.

Next, active regions may be defined. Here, in order to form an array of memory cells, an array of active regions may be formed. According to an embodiment of the present disclosure, an image transfer technique may be used. Here, the transfer is performed using a spacer pattern. The limitations on lithography may be alleviated and size control of the pattern may be enhanced using this Spacer Image Transfer (SIT) technology. For example, this can be done as follow.

Figure 2A:
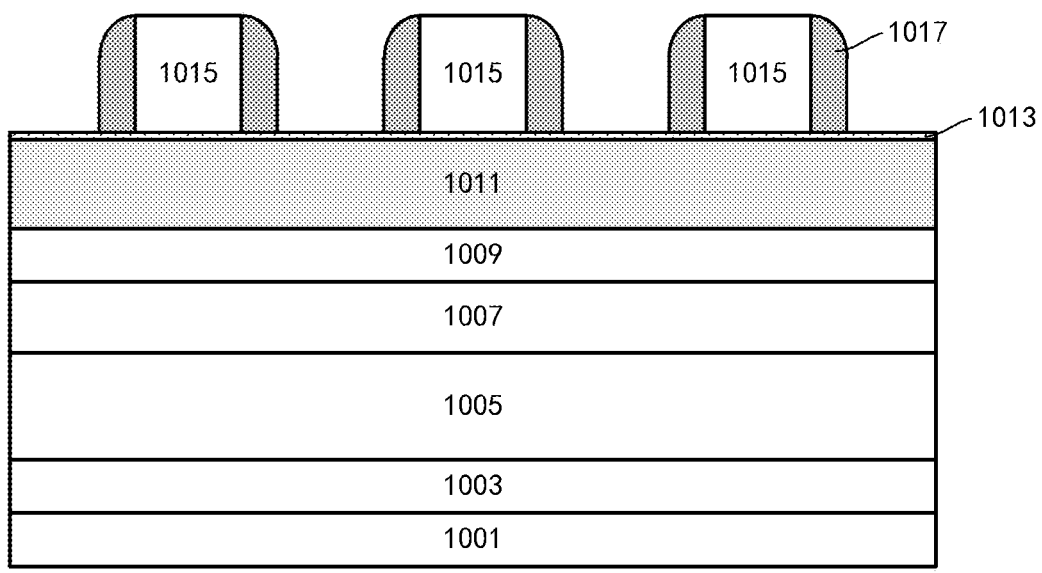
Figure 2B:
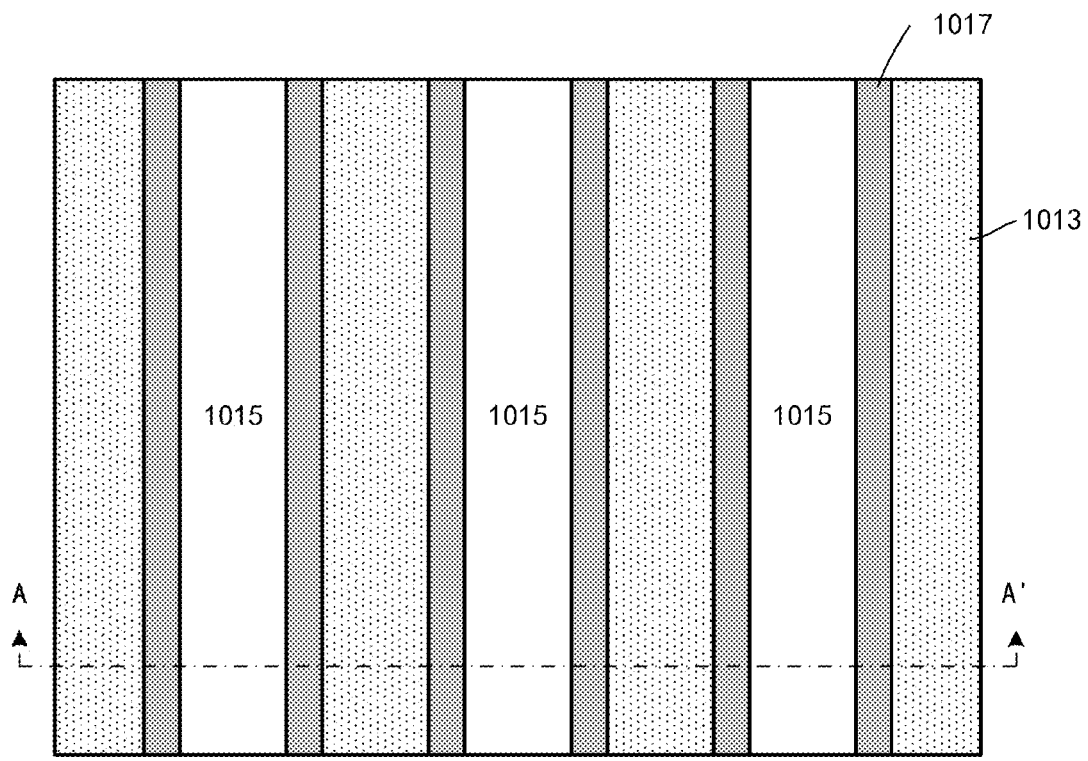

As shown in FIGS. 2(a) and 2(b) (FIG. 2(a) is a sectional view, and FIG. 2(b) is a top view with line AA' indicating a position where the sectional view in FIG. 2(a) is taken), in order to form the spacer pattern, a sacrificial layer 1015 may be formed (for example, deposited) on the stack shown in FIG. 1 and may be patterned (by, for example, Reactive Ion Etching (RIE)) to have vertical sidewalls extending in a first direction (for example, a direction of rows in an array of memory cells, such as a direction perpendicular to a plane of the paper in FIG. 2(a), or a vertical direction in FIG. 2(b)) to provide vertical surfaces required for the formation of spacers. In order to provide suitable etching selectivity, the sacrificial layer 1015 may include amorphous silicon. In addition, for the purpose of etching stop or the like, an etching stop layer 1013 of, for example, oxide (for example, silicon oxide), with a thickness of about 1-10 nm, may be formed (for example, deposited) before the sacrificial layer 1015 is formed.

First spacers 1017 may be formed on the vertical sidewalls of the sacrificial layer 1015 using a spacer formation technique. For example, the first spacers 1017 may include SiC, with a thickness of about 3-20 nm. This formation may be done by depositing a SiC layer, with a thickness of about 3-20 nm, on the stack on which the sacrificial layer 1015 is formed in a substantially conformal manner, and then selectively etching the SiC layer by, for example, RIE, in a direction substantially perpendicular to a substrate surface to remove a lateral extension portion thereof and leave a vertical extension portion thereof. The RIE of the SiC layer may be stopped at the etching stop layer 1013.

As shown in the top view of FIG. 2(b), the first spacers 1017 thus formed extend in the first direction.

Figure 3A:
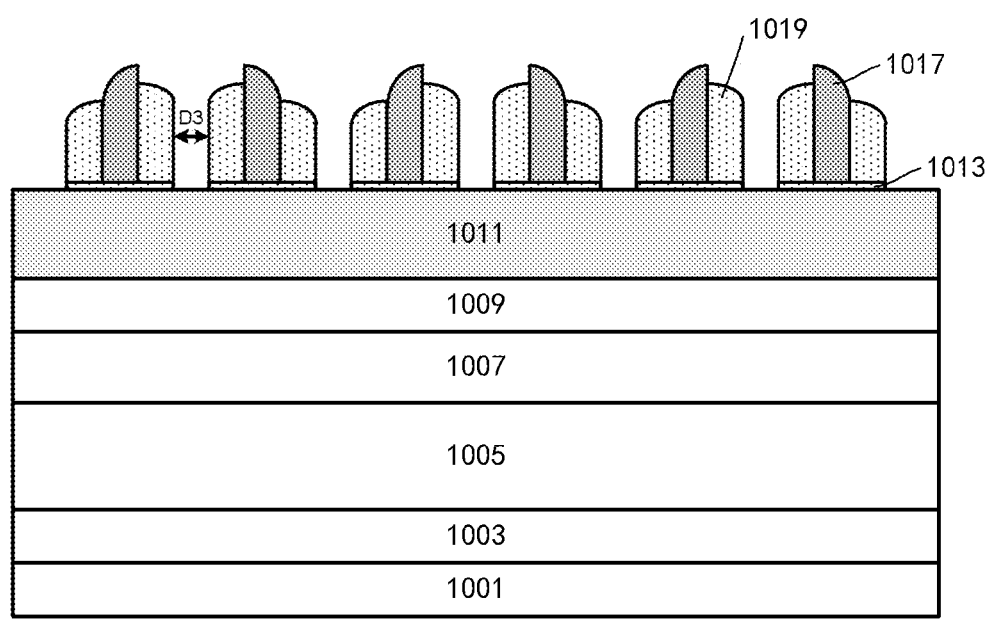
Figure 3B:
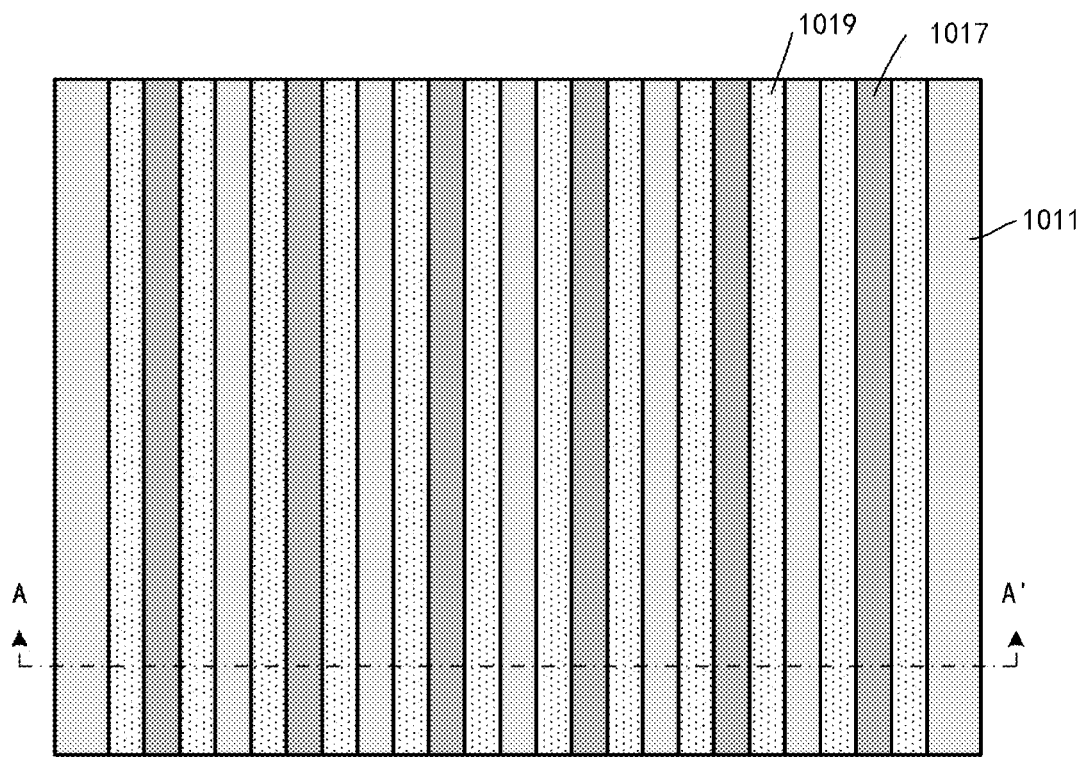

After that, as shown in FIGS. 3(a) and 3(b) (FIG. 3(a) is a sectional view, and FIG. 3(b) is a top view with line AA' indicating a position where the sectional view in FIG. 3(a) is taken), the sacrificial layer 1015 (of amorphous silicon here) may be removed by selective etching (for example, wet etching using a TMAH solution) against the etching stop layer 1013 (of oxide here) and the first spacers 1017 (of SiC here). Thus, the first spacers 1017 extending in the first direction are left on the stack. Then, second spacers 1019 are similarly formed on opposite vertical sidewalls of the respective first spacers 1017 using the spacer formation technique. For example, the second spacers 1019 may include oxide, with a thickness of about 3-30 nm. The etching of the oxide may be stopped at the hard mask layer 1011 when the spacers are formed.

As shown in the top view of FIG. 3(b), the second spacers 1019 thus formed are attached to opposite sides of the respective first spacers 1017 and extend in the first direction. The first spacers 1017 and the respective second spacers 1019 together define positions of memory cell rows.

Next, positions of memory cell columns may be similarly defined by spacers.

Figure 4A:
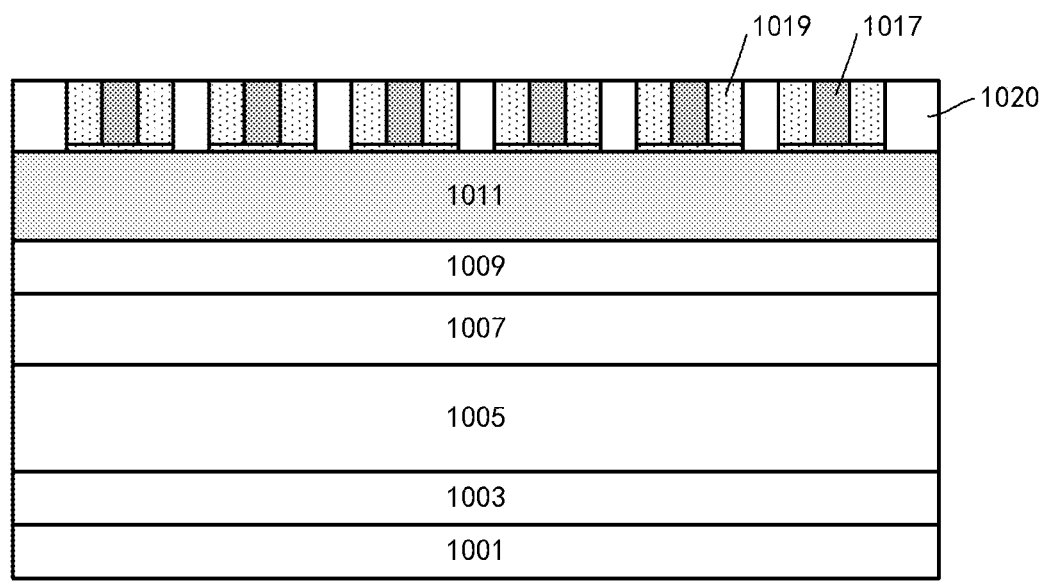
Figure 4B:
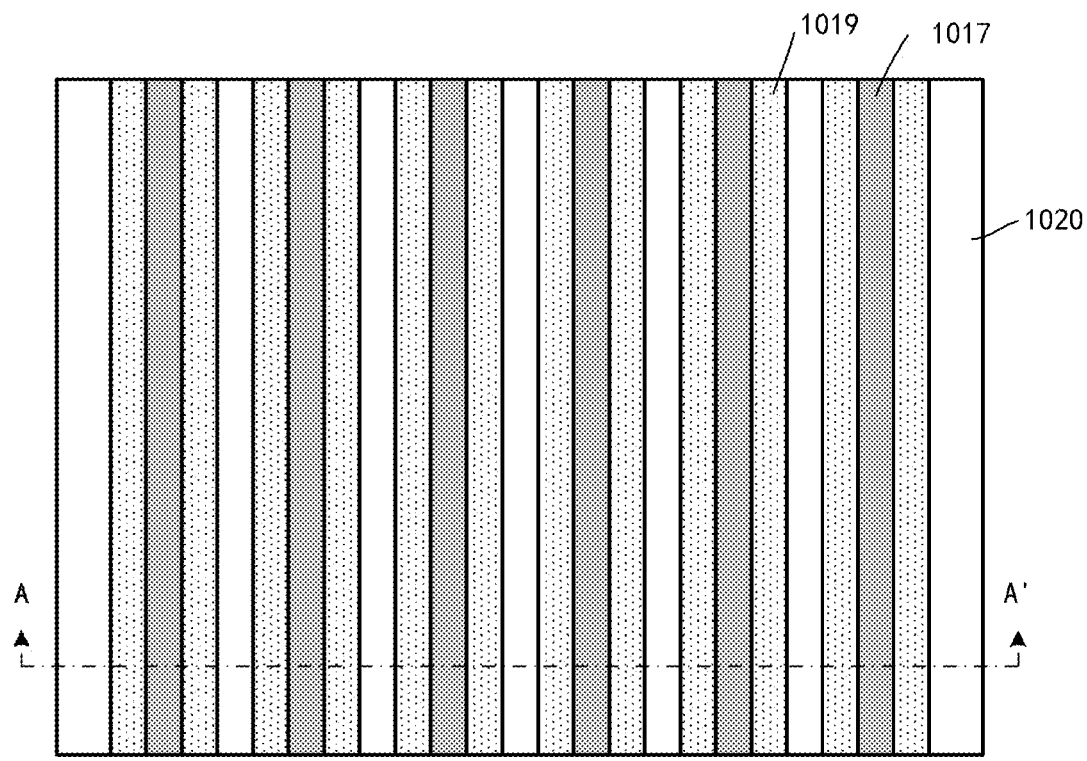

As shown in FIGS. 4(a) and 4(b) (FIG. 4(a) is a sectional view, and FIG. 4(b) is a top view with line AA' indicating a position where the sectional view in FIG. 4(a) is taken), a filling layer 1020 may be formed on the structure shown in FIGS. 3(a) and 3(b) to fill gaps between the first spacers 1017 and the respective second spacers 1019. For example, polysilicon may be deposited and planarized by, for example, Chemical Mechanical Polishing (CMP), to form the filling layer 1020.

Figure 5A:
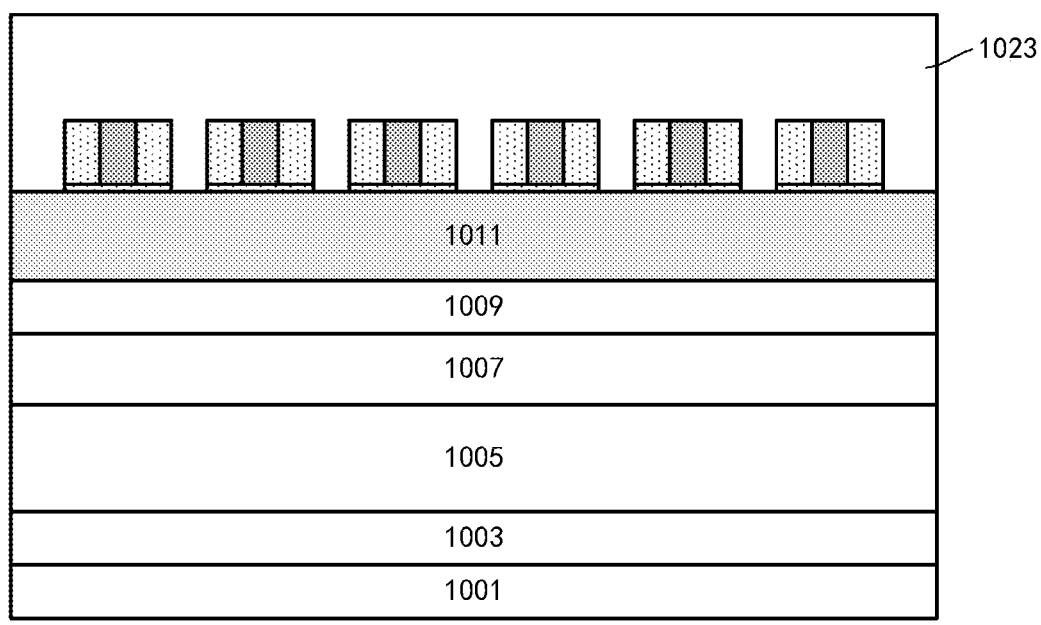
Figure 5B:
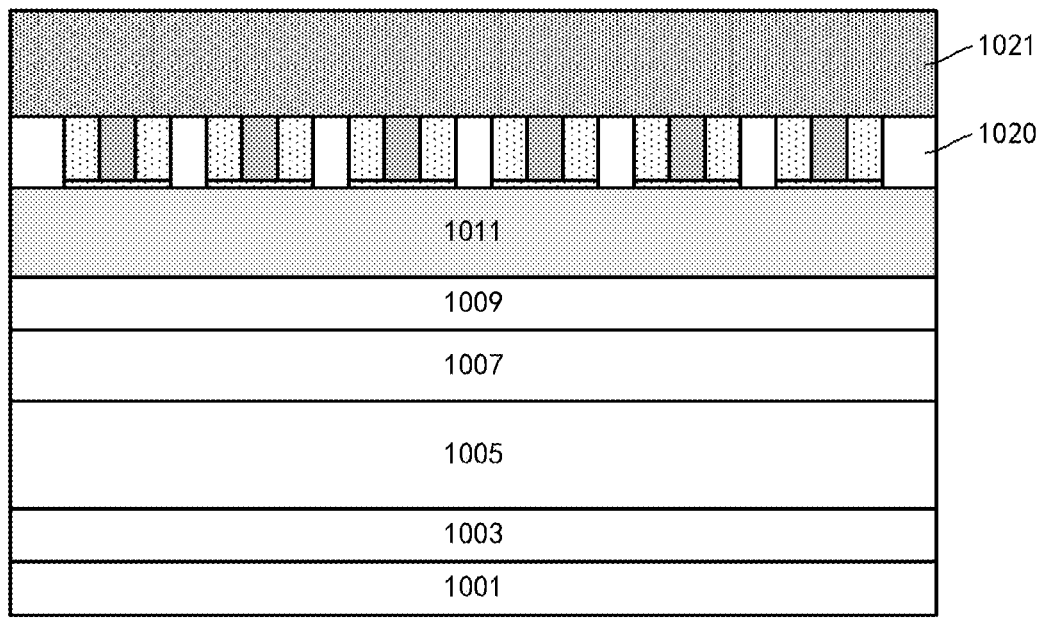
Figure 5C:
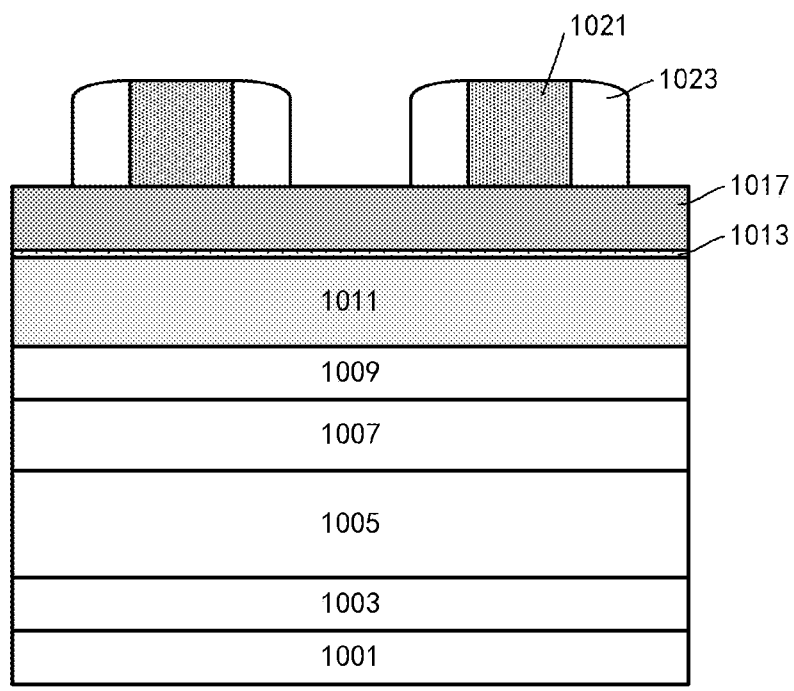
Figure 5D:
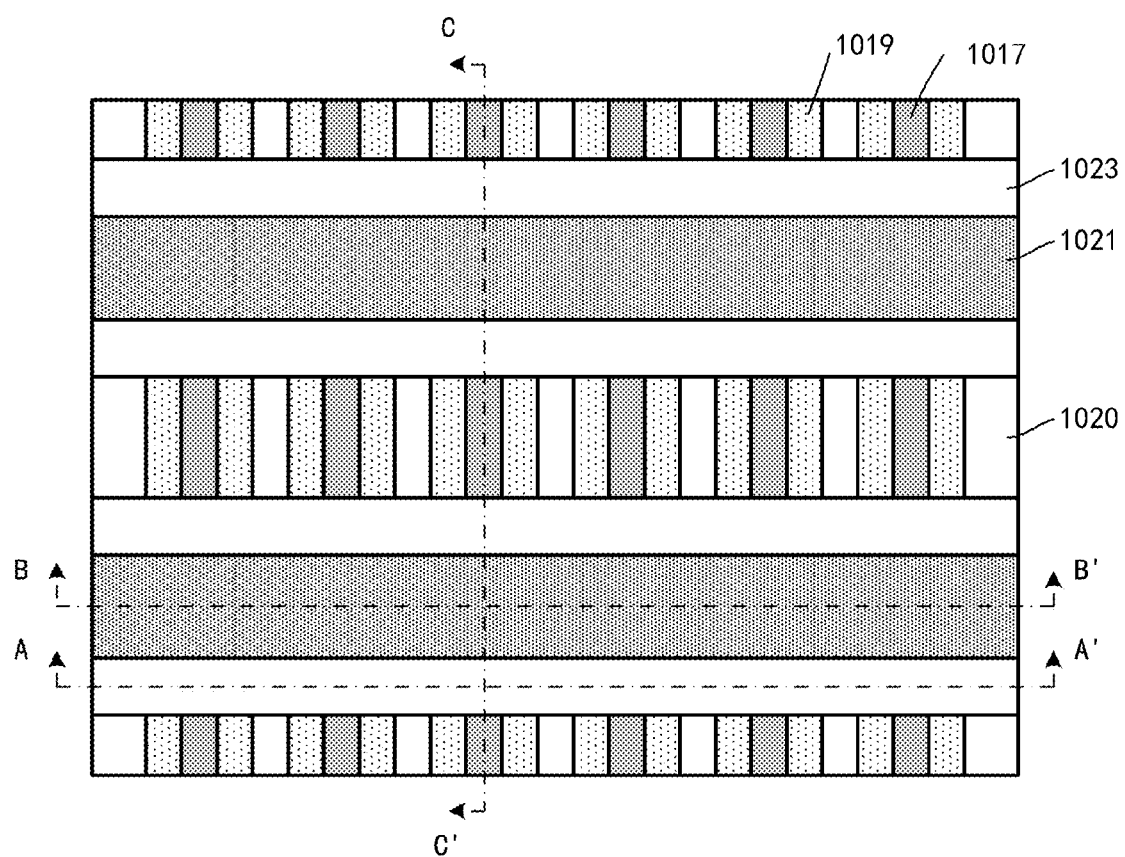

Then, as shown in FIGS. 5(a), 5(b), 5(c) and 5(d) (FIGS. 5(a), 5(b) and 5(c) are sectional views, and FIG. 5(d) is a top view with line AA' indicating a position where the sectional view in FIG. 5(a) is taken, line BB' indicating a position where the sectional view in FIG. 5(b) is taken, and line CC' indicating a position where the sectional view in FIG. 5(c) is taken), another sacrificial layer 1021 may be formed (for example, deposited) on the structure shown in FIGS. 4(a) and 4(b) and may be patterned (by, for example, RIE) to have vertical sidewalls extending in a second direction (for example, a direction of columns in the array of memory cells, such as a horizontal direction in FIGS. 5(a), 5(b) and 5(d) or a direction perpendicular to a plane of the paper in FIG. 5(c)) which intersects (for example, is perpendicular to) the first direction. The sacrificial layer 1021 may have a width of about 15-100 nm. In order to provide suitable etching selectivity, the sacrificial layer 1021 may include polycrystalline SiGe. Similarly, for the purpose of etching stop or the like, an etching stop layer (of, for example, oxide, not shown here) may be formed before the sacrificial layer 1021 is formed.

Here, the horizontal direction in the top view is referred to as "column", and the vertical direction in the top view is referred to as "row" so as to be consistent with definitions of the row and the column which are commonly used for the array of memory cells without any special limitations.

Third spacers 1023 may be formed on sidewalls of the sacrificial layer 1021 using the spacer formation technique. For example, the third spacers 1023 may include polysilicon, with a thickness of about 5-30 nm.

In this example, since the third spacers 1023 and the filling layer 1020 both include polysilicon, they are shown integrally in FIG. 5(a) and are labeled as "1023".

As shown in the top view of FIG. 5(d), the third spacers 1023 thus formed extend in the second direction.

Figure 6A:
Figure 6B:
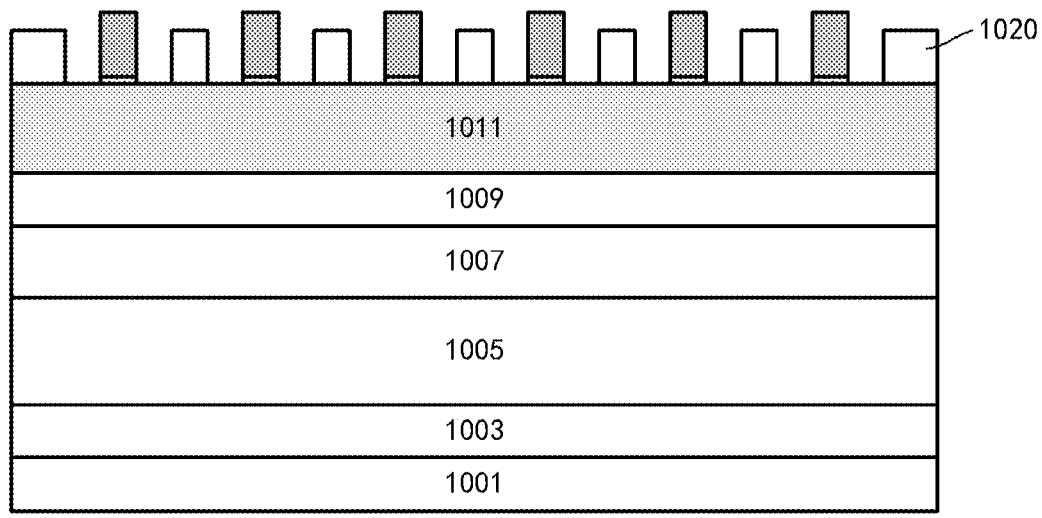
Figure 6C:
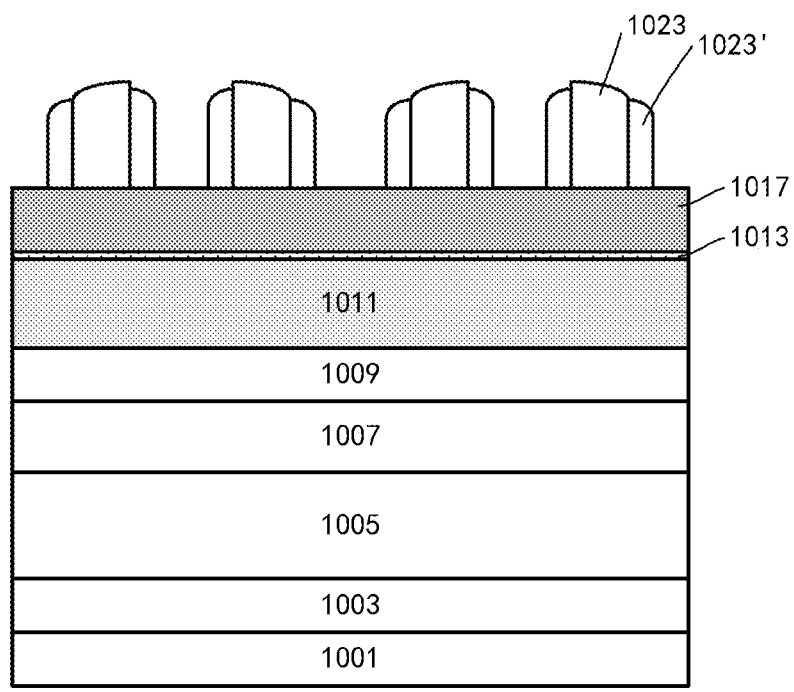
Figure 6D:
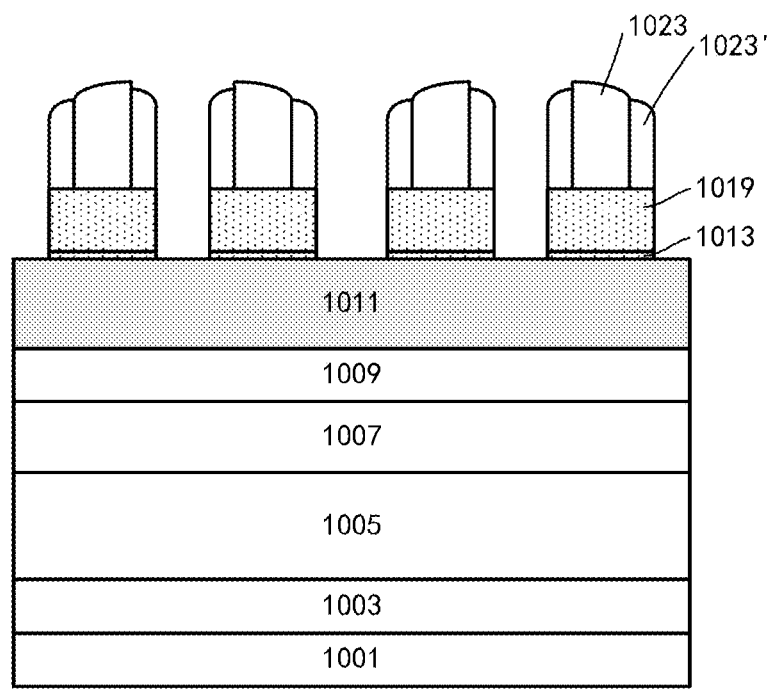
Figure 6E:
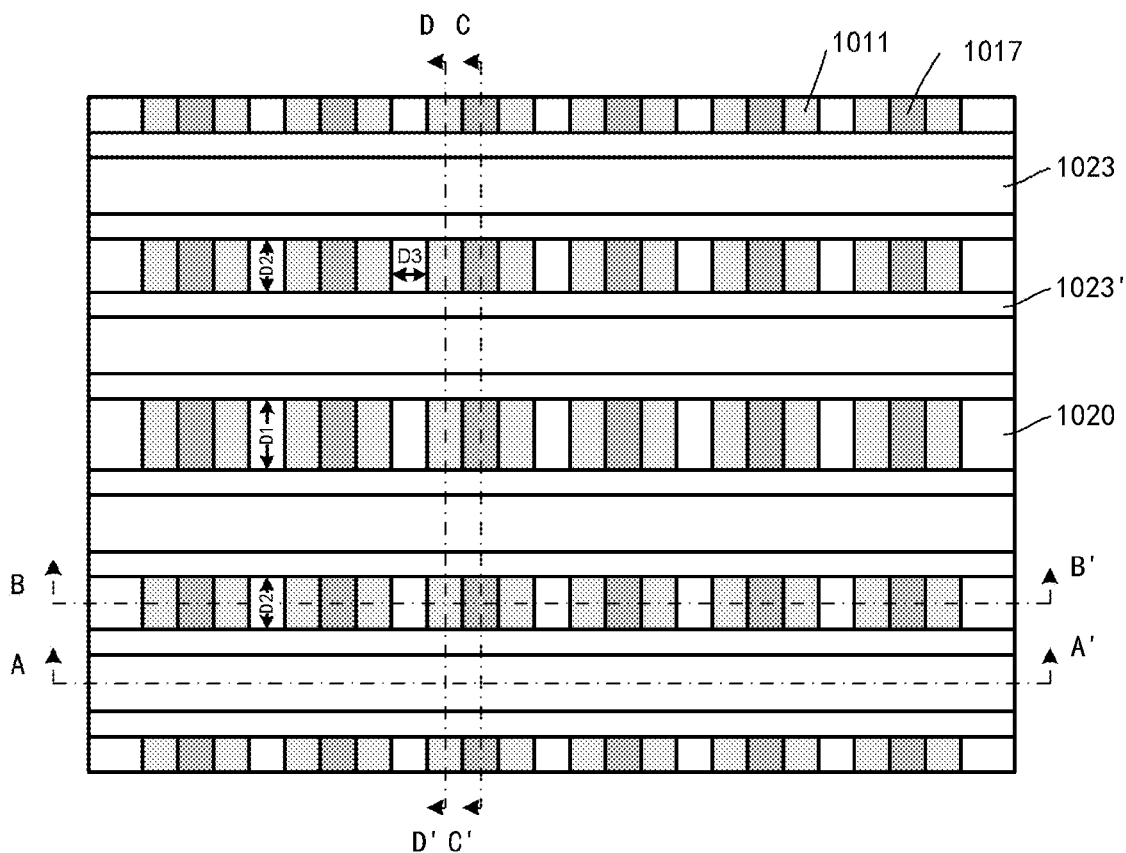

After that, as shown in FIGS. 6(a), 6(b), 6(c), 6(d) and 6(e) (FIGS. 6(a), 6(b), 6(c) and 6(d) are sectional views, and FIG. 6(e) is a top view with line AA' indicating a position where the sectional view in FIG. 6(a) is taken, line BB' indicating a position where the sectional view in FIG. 6(b) is taken, line CC' indicating a position where the sectional view in FIG. 6(c) is taken, and line DD' indicating a position where the sectional view in FIG. 6(d) is taken), the sacrificial layer 1021 may be removed by selective etching. Thus, the third spacers 1023 extending in the second direction are left on the stack. Then, fourth spacers 1023' are similarly formed on opposite vertical sidewalls of the respective third spacers 1023 using the spacer formation technique. For example, the fourth spacers 1023' may include polysilicon or amorphous silicon.

As shown in the top view of FIG. 6(e), the fourth spacers 1023' thus formed are attached to opposite sides of the respective third spacers 1023 and extend in the second direction. The third spacers 1023 and the respective fourth spacers 1023' together define the positions of the memory cell columns. The memory cells (or their active regions) are defined at positions where the rows (defined by the first spacers 1017 and the second spacers 1019) intersect the columns (defined by the third spacers 1023 and the fourth spacers 1023').

In addition, portions of the first spacers 1017 extending in the row direction between the respective columns may define bridge portions. To this end, portions of the second spacers 1019 (of oxide here) between the respective columns may be removed by selective etching (to expose the underlying hard mask layer 1011).

Here, sizes of the respective spacers may be controlled, so that a spacing D3 between the respective rows (a spacing between the respective second spacers 1019 facing each other) (as shown in FIG. 3(a)) is less than spacings D1 and D2 between the respective columns (spacings between the respective fourth spacers 1023' facing each other). In addition, when viewed by taking every two columns as a group, a spacing D2 between two columns in the same group may be less than a spacing D1 between respective groups. This is mainly to reduce a number of masks used in subsequent processes. According to other embodiments of the present disclosure, there are no such requirements on D1, D2, and D3, and bit lines or word lines may be defined using a patterning method (for example, photolithography, or the like) in subsequent steps.

Here, the columns are defined using two steps (of forming the third spacers 1023 and the fourth spacers 1023' respectively), which is primarily to reduce lithographic requirements or limitations on a line width or line spacing of the sacrificial layer 1021. Then, the sacrificial layer 1021 with a relatively large line width or spacing may be used (so that the spacing between the respective third spacers 1023 increases, and is reduced by the fourth spacers 1023' to achieve a desired spacing).

Figure 7A:
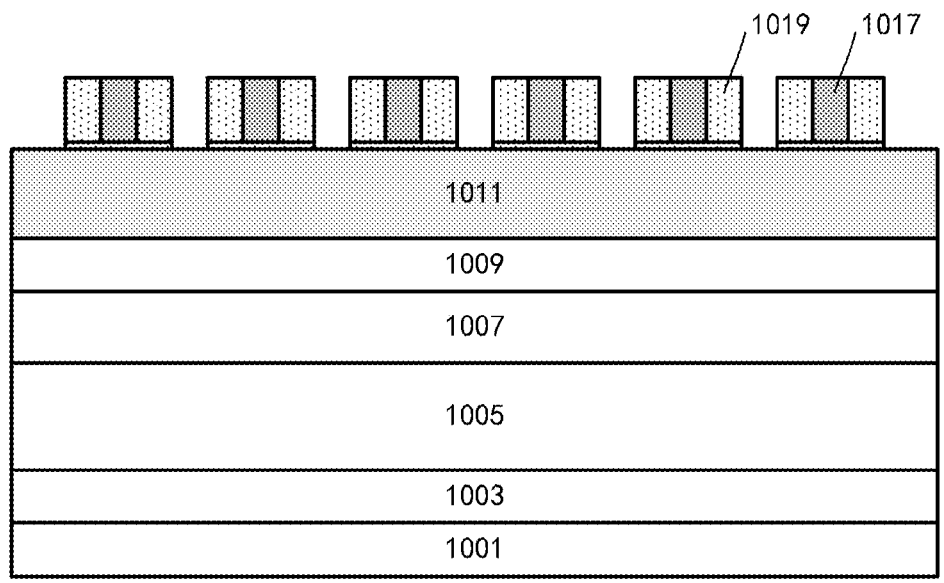
Figure 7B:
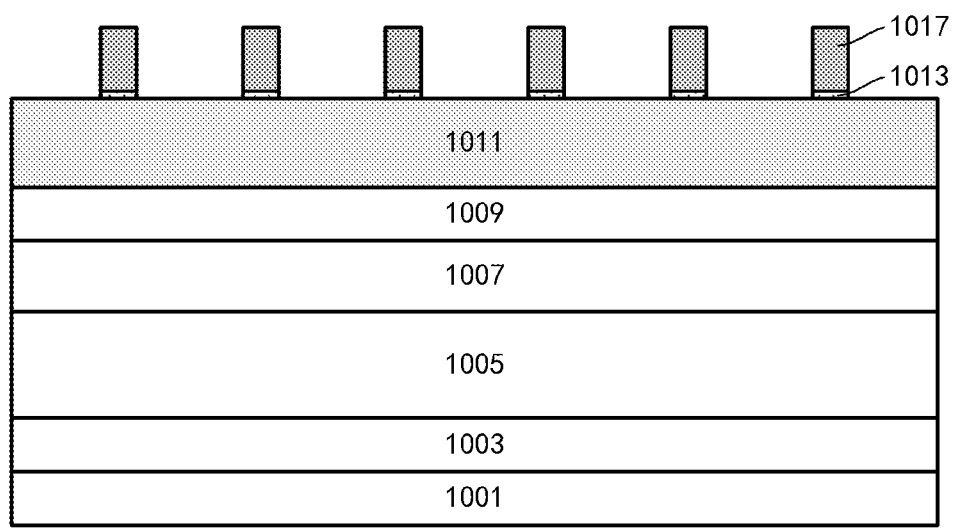
Figure 7C:
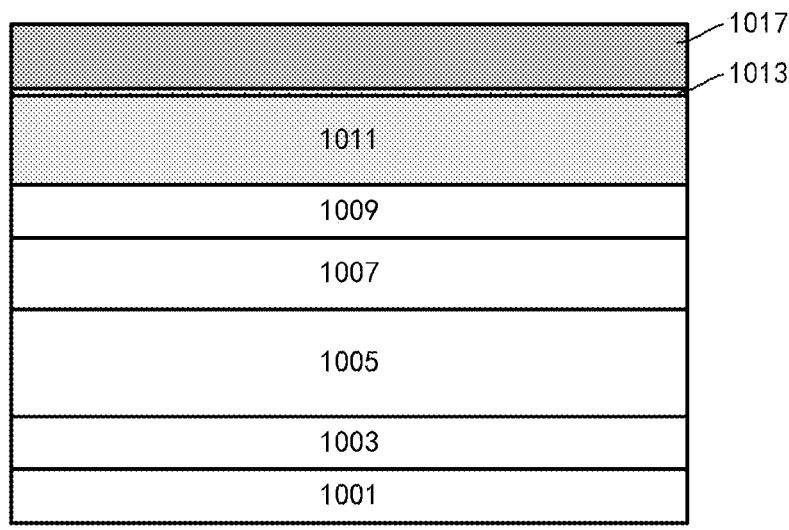
Figure 7D:
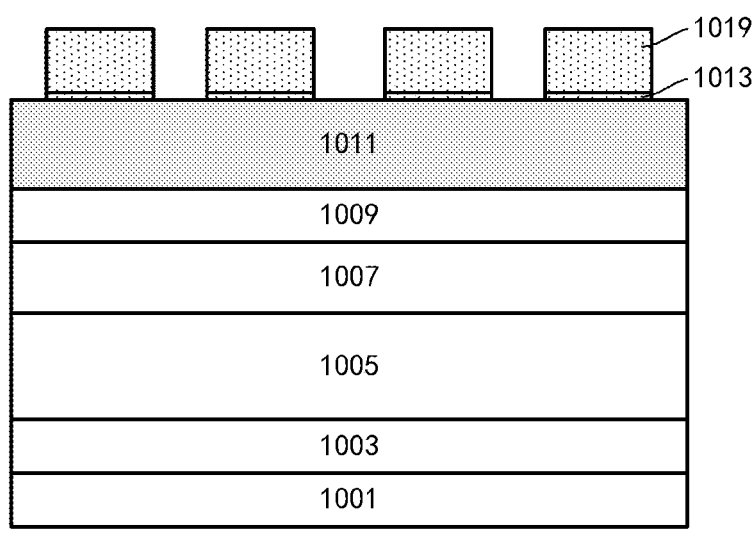
Figure 7E:
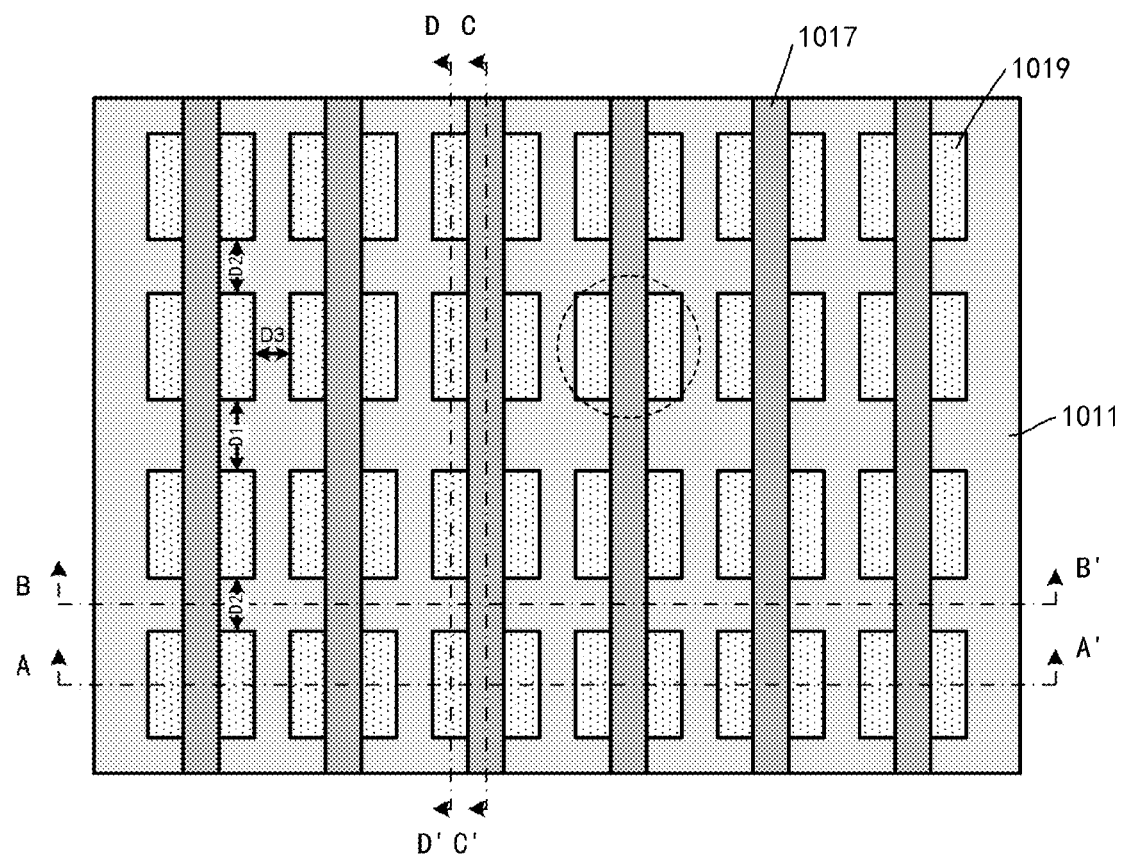

As shown in FIGS. 7(a), 7(b), 7(c), 7(d) and 7(e) (FIGS. 7(a), 7(b), 7(c) and 7(d) are sectional views, and FIG. 7(e) is a top view with line AA' indicating a position where the sectional view in FIG. 7(a) is taken, line BB' indicating a position where the sectional view in FIG. 7(b) is taken, line CC' indicating a position where the sectional view in FIG. 7(c) is taken, and line DD' indicating a position where the sectional view in FIG. 7(d) is taken), the third spacers 1023, the fourth spacers 1023' and the filling layer 1020 (all of polysilicon) may be removed by selective etching (for example, wet etching using a TMAH solution). After the process described above is performed, the second spacers 1019 remain only at positions where the rows intersect the columns. Further, the first spacers 1017 extend continuously in the column direction, and may then define the bridge portions. As shown by a dashed circle in FIG. 7(e), the first spacers 1017 and the second spacers 1019 together define the positions of the memory cells (or their active regions) at positions where the rows intersect the columns. In addition, the first spacers 1017 define bridge portions which extend in the first direction (for example, the row direction in the array of memory cells), between adjacent ones of the columns.

In an example of FIG. 7(e), the defined memory cells have a substantially square shape, in which case a nanowire device may then be formed. According to another example, the defined memory cells have a substantially rectangular shape, in which case a nano sheet device may then be formed. The defined shape may be adjusted by adjusting a size of at least one of the first spacers to the fourth spacers.

In the above example, a case where there are six rows and four columns is illustrated, but the present disclosure is not limited thereto. According to an embodiment of the present disclosure, more rows or more columns may be included. This may be achieved by increasing a number of the spacers.

Although the memory cells or their active regions are defined here using the image transfer technique, the present disclosure is not limited thereto. For example, patterns may be defined using a mask such as photoresist. Of course, in this case, the patterns are not limited to squares or rectangles defined by the spacers, but may be other shapes such as circles or polygons or the like.

Then, the patterns formed as described above may be transferred to the underlying layers.

Figure 8A:
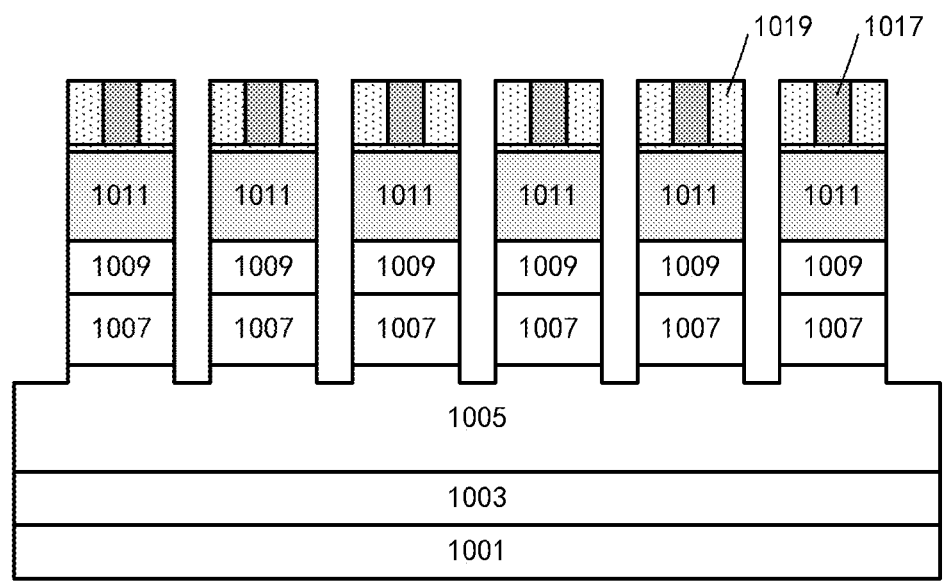
Figure 8B:
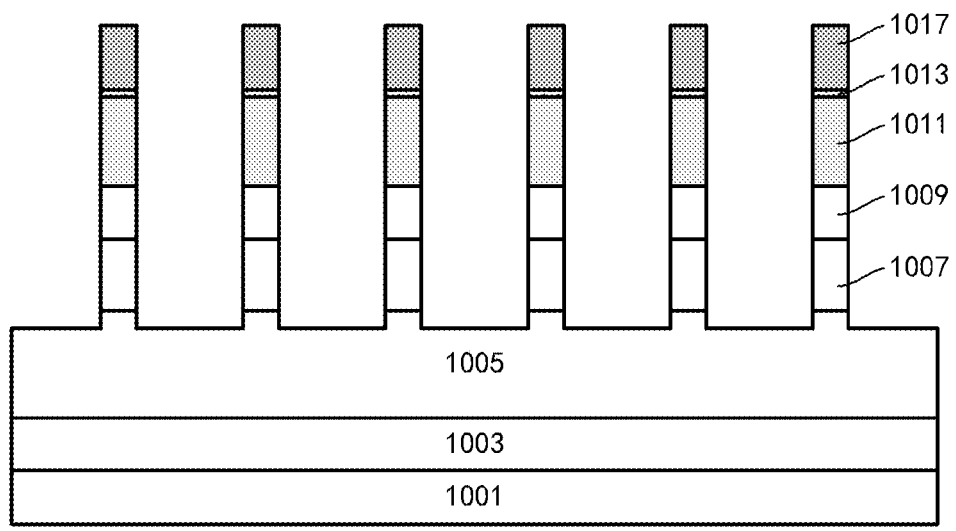
Figure 8C:
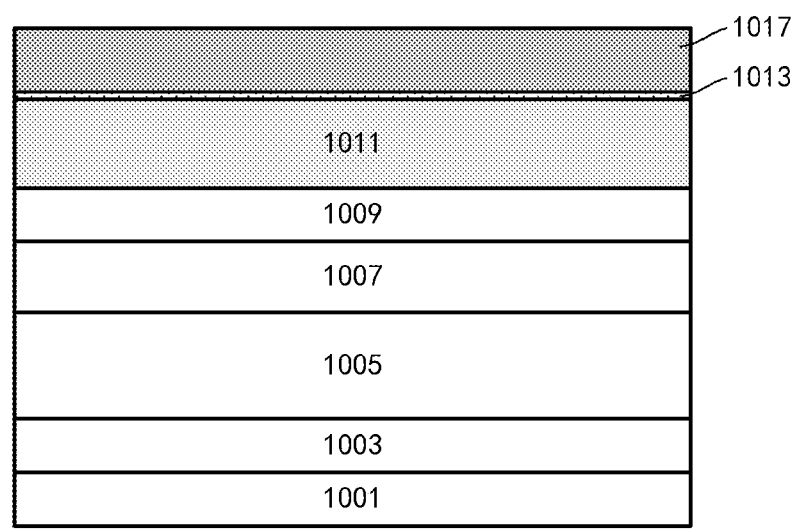
Figure 8D:
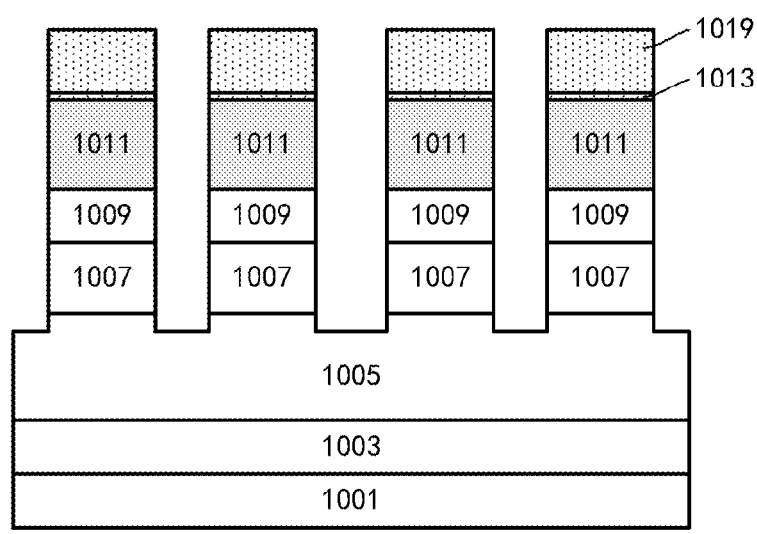
Figure 8E:
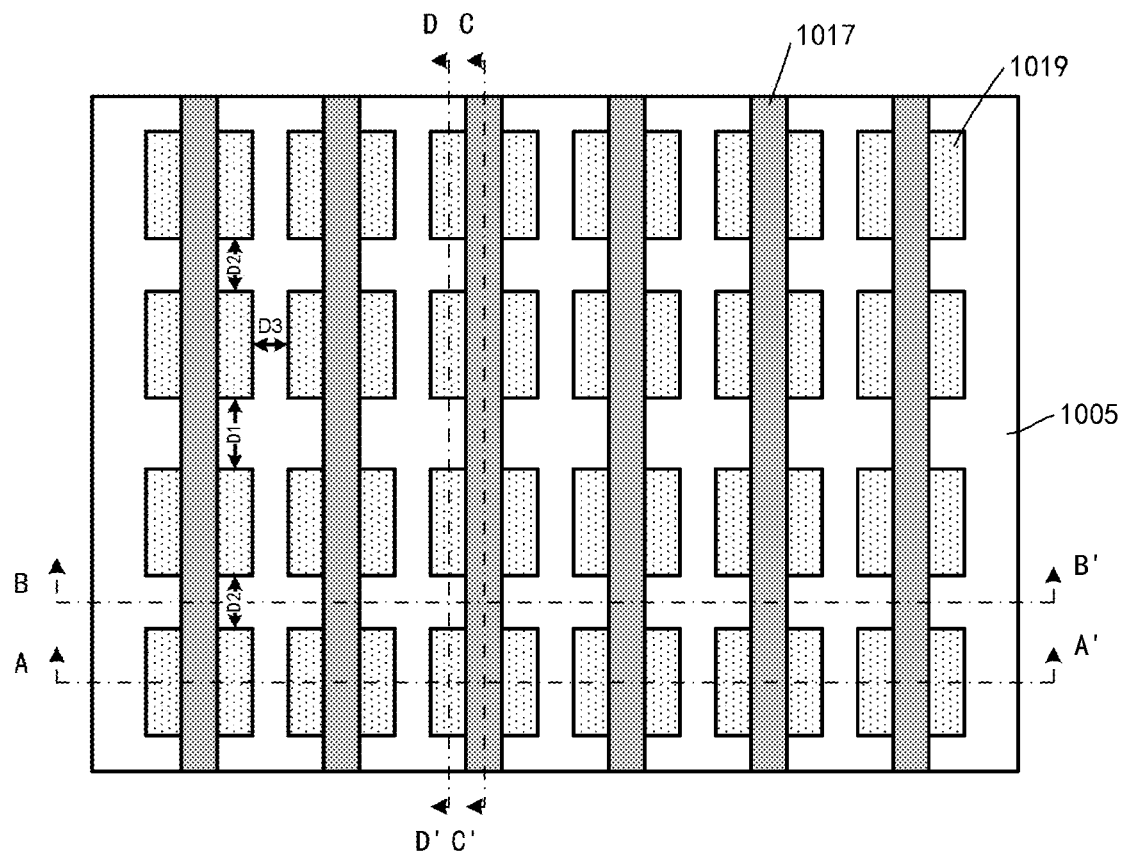

As shown in FIGS. 8(a), 8(b), 8(c), 8(d) and 8(e) (FIGS. 8(a), 8(b), 8(c) and 8(d) are sectional views, and FIG. 8(e) is a top view with line AA' indicating a position where the sectional view in FIG. 8(a) is taken, line BB' indicating a position where the sectional view in FIG. 8(b) is taken, line CC' indicating a position where the sectional view in FIG. 8(c) is taken, and line DD' indicating a position where the sectional view in FIG. 8(d) is taken), the hard mask layer 1011 (of nitride here), the second source/drain layer 1009 (of Si here), the channel layer 1007 (of SiGe here) and the first source/drain layer 1005 (of Si here) may be selectively etched by, for example, RIE in sequence using the first spacers 1017 (of SiC here) and the second spacers 1019 (of oxide here) as a mask. Here, the RIE of the first source/drain layer 1005 is not carried out into a bottom surface of the first source/drain layer 1005, but is stopped therein. Thus, lower portions of the first source/drain layer 1005 remain integrally extended on the substrate 1001.

Thus, the stack is divided into an array of sub-stacks with bridge portions between the respective sub-stacks. The etched second source/drain layer 1009, the etched channel layer 1007, and the etched first source/drain layer 1005 (upper portions thereof) form pillar-shaped (in this example, square pillar-shaped) active regions. The RIE may be performed, for example, in a direction substantially perpendicular to the substrate surface, so that these sub-stacks or the pillar-shaped active regions therein are also substantially perpendicular to the substrate surface.

According to an embodiment of the present disclosure, in order to separate the active regions, as shown in FIGS. 9(a), 9(b), 9(c) and 9(d) (FIGS. 9(a), 9(b), 9(c) and 9(d) are sectional views taken along lines AA', BB', CC' and DD'), the channel layer 1007 (of SiGe here) may be selectively etched, particularly isotropically etched, against the first source/drain layer 1005 and the second source/drain layer 1009 (both of Si here). An amount of etching may be controlled, so that the channel layer 1007 may be removed at the bridge portions. Thus, the channel layer 1007 is separated into portions at the respective memory cells, and these portions may form nanowires. In order to facilitate the control of the amount of etching, Atomic Layer Etching (ALE) or digital etching may be used.

In addition, the selective etching of the channel layer 1007 causes the channel layer 1007 to have sidewalls recessed with respect to sidewalls of the first source/drain layer 1005 (the upper portions thereof) and the second source/drain layer 109 or with respect to sidewalls of the hard mask layer 1011 (in this example, recessed in a lateral direction substantially parallel to the substrate surface). Due to the relative recess of the channel layer 1007, space which is self-aligned with the channel layer 1007 is left, a gate stack may then be formed in the space, and the gate stack thus formed may be self-aligned with the channel layer 1007. The space may be occupied by a sacrificial gate 1025 to prevent subsequent processes from affecting the channel layer 1007 and the space. In order to provide desired etching selectivity, the sacrificial gate 1025 may include, for example, oxynitride (for example, silicon oxynitride). For example, the sacrificial gate 1025 may be filled in the spaces by depositing nitrogen oxide and performing back-etching. Alternatively, a thin etching stop layer (not shown) of oxide may further be formed before the oxynitride is deposited.

Figure 9:
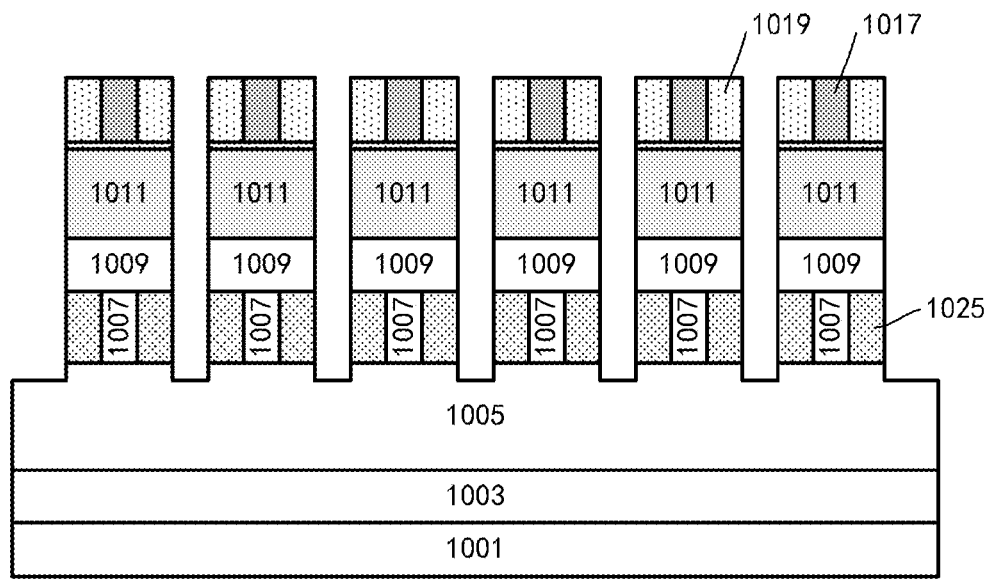
Figure 9:
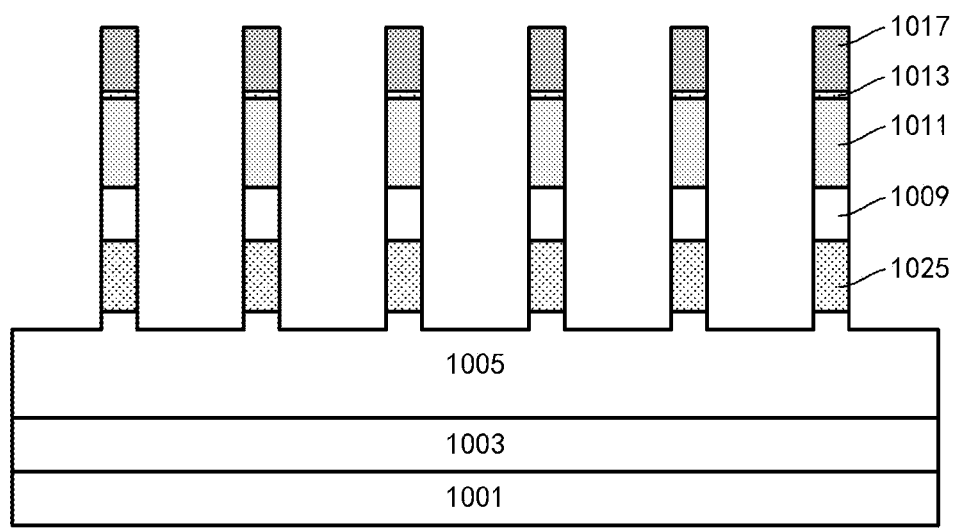
Figure 9C:
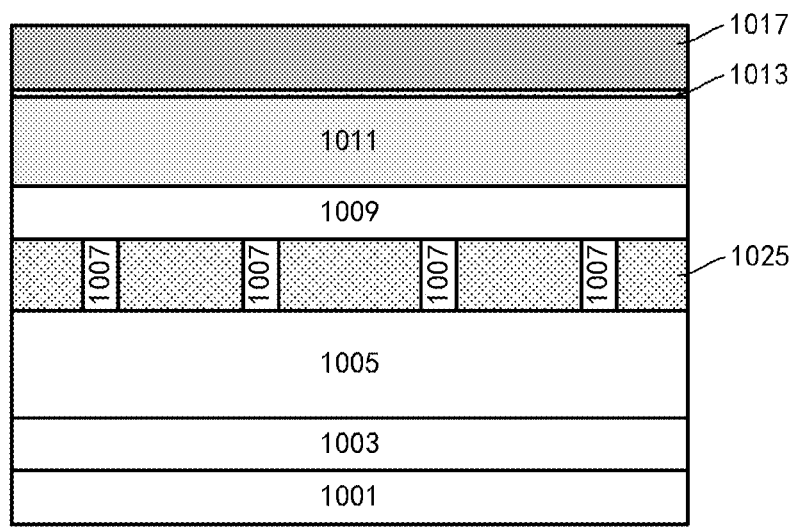
Figure 9D:
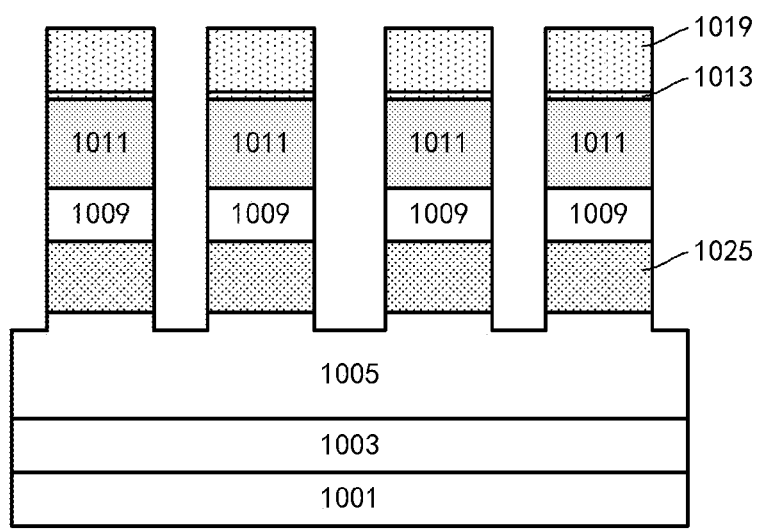
Figure 10A:
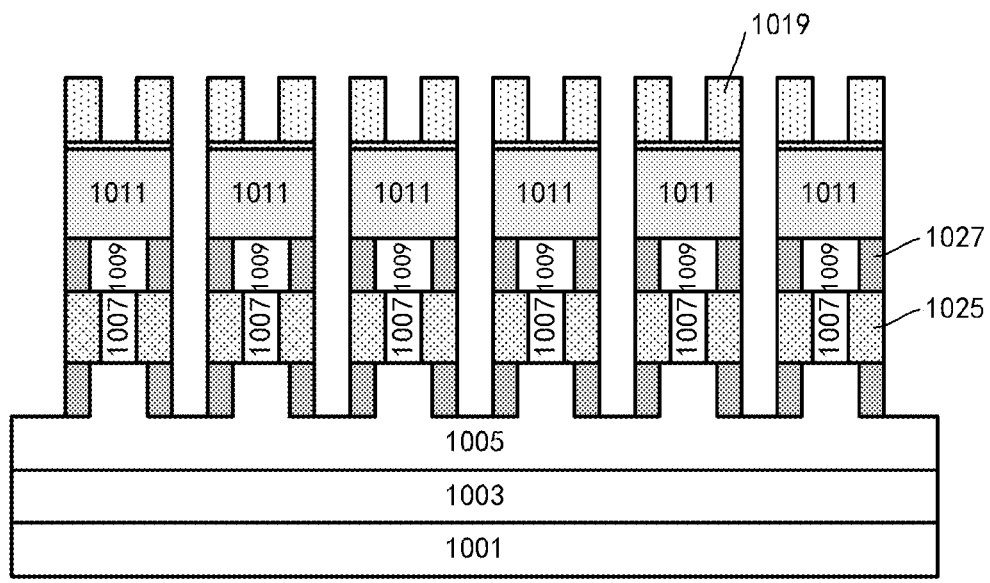
Figure 10B:
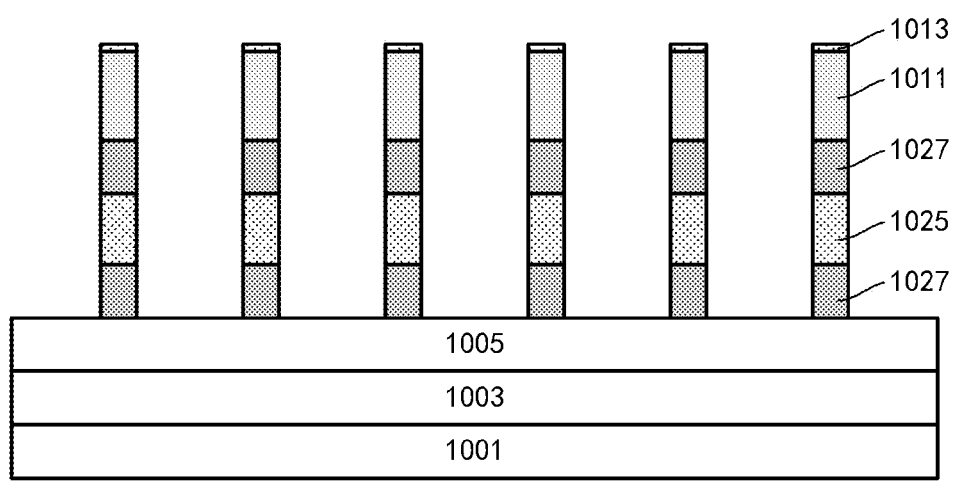
Figure 10C:
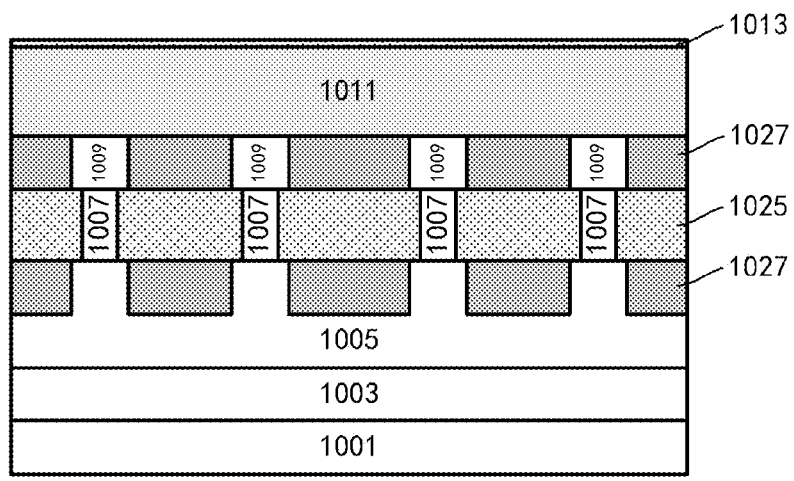
Figure 10D:
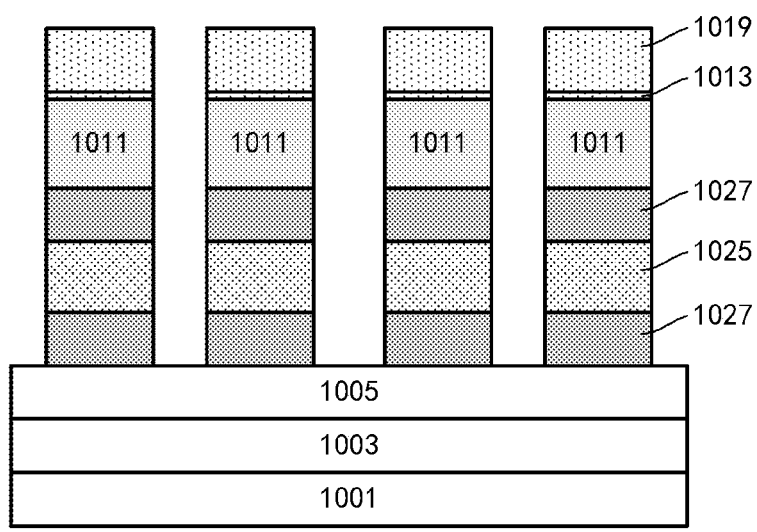
Figure 11A:
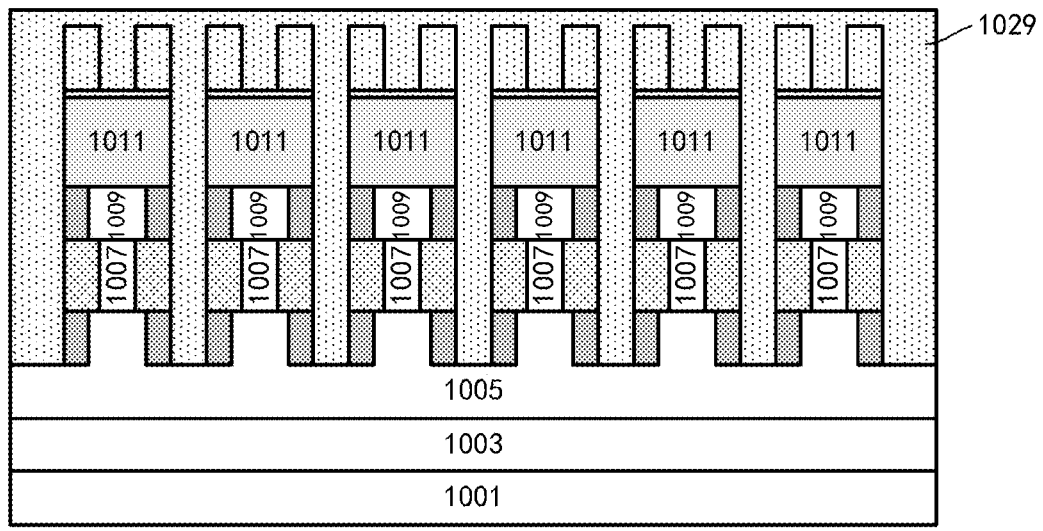
Figure 11B:
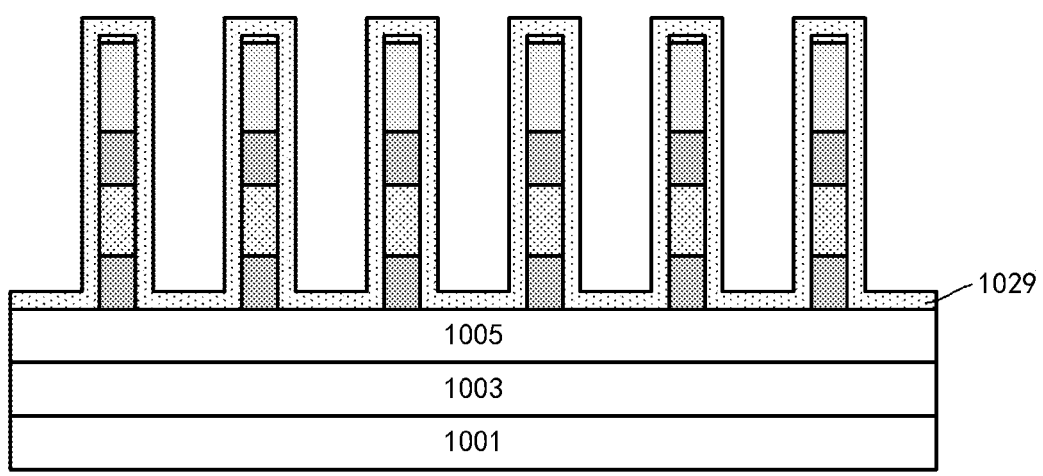
Figure 11C:
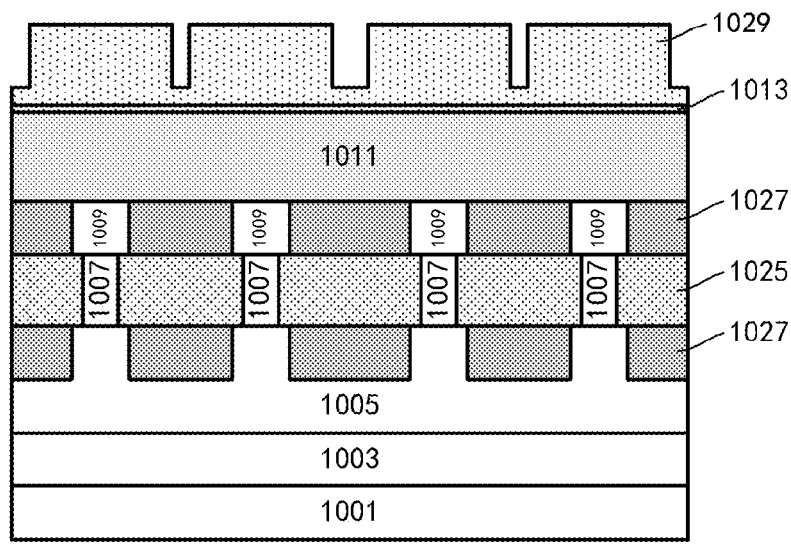
Figure 11D:
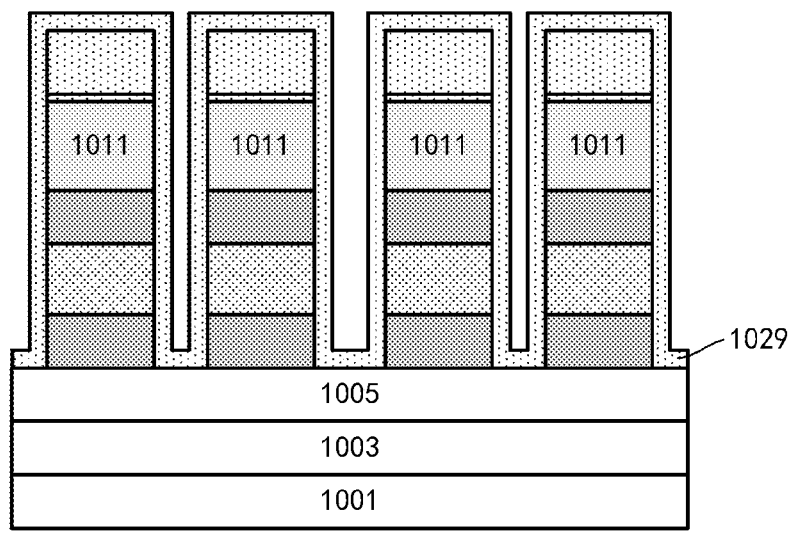
Figure 11E:
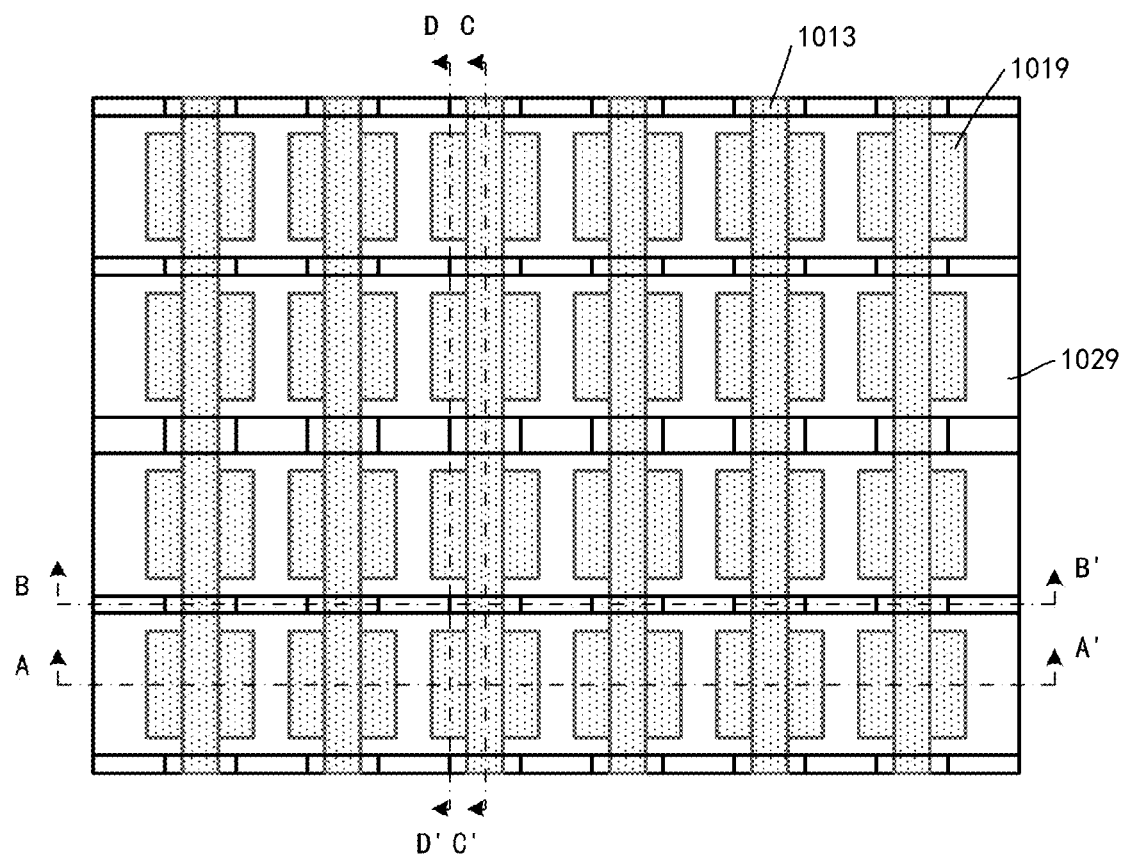
Figure 12A:
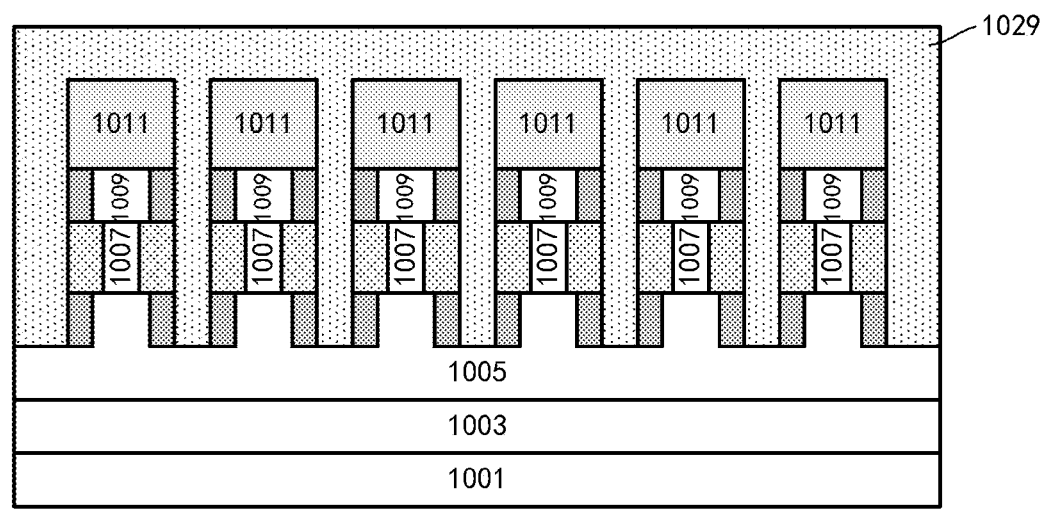
Figure 12B:
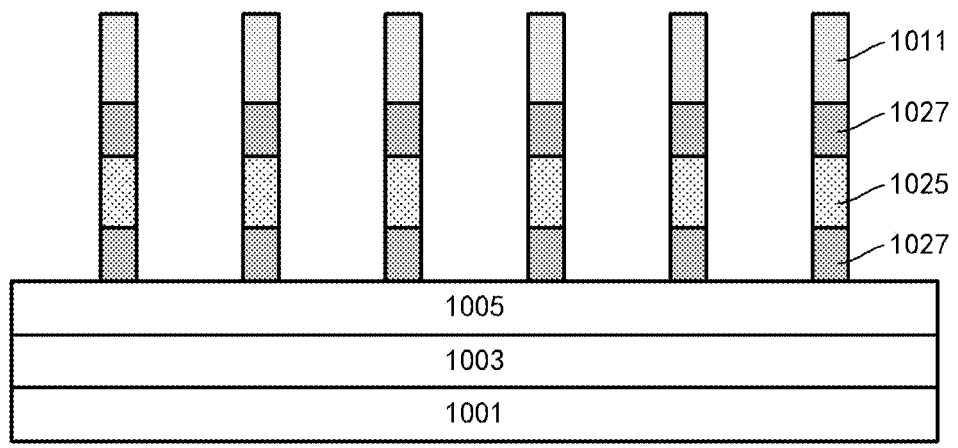
Figure 12C:
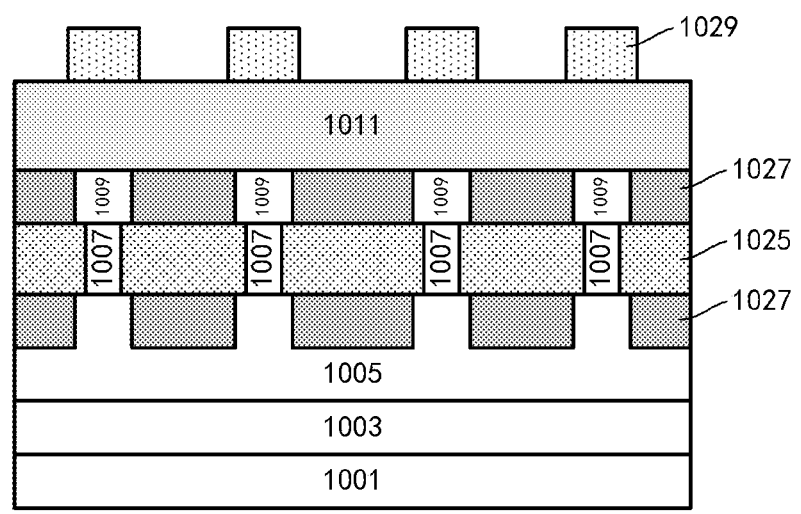
Figure 12D:
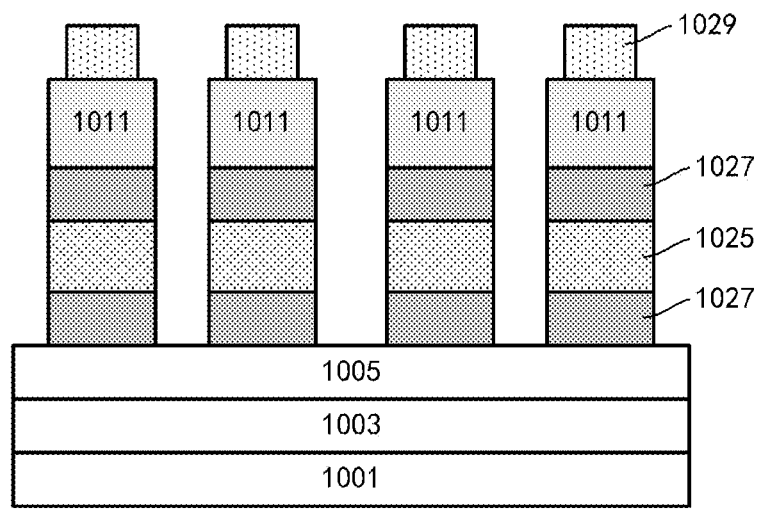
Figure 12E:
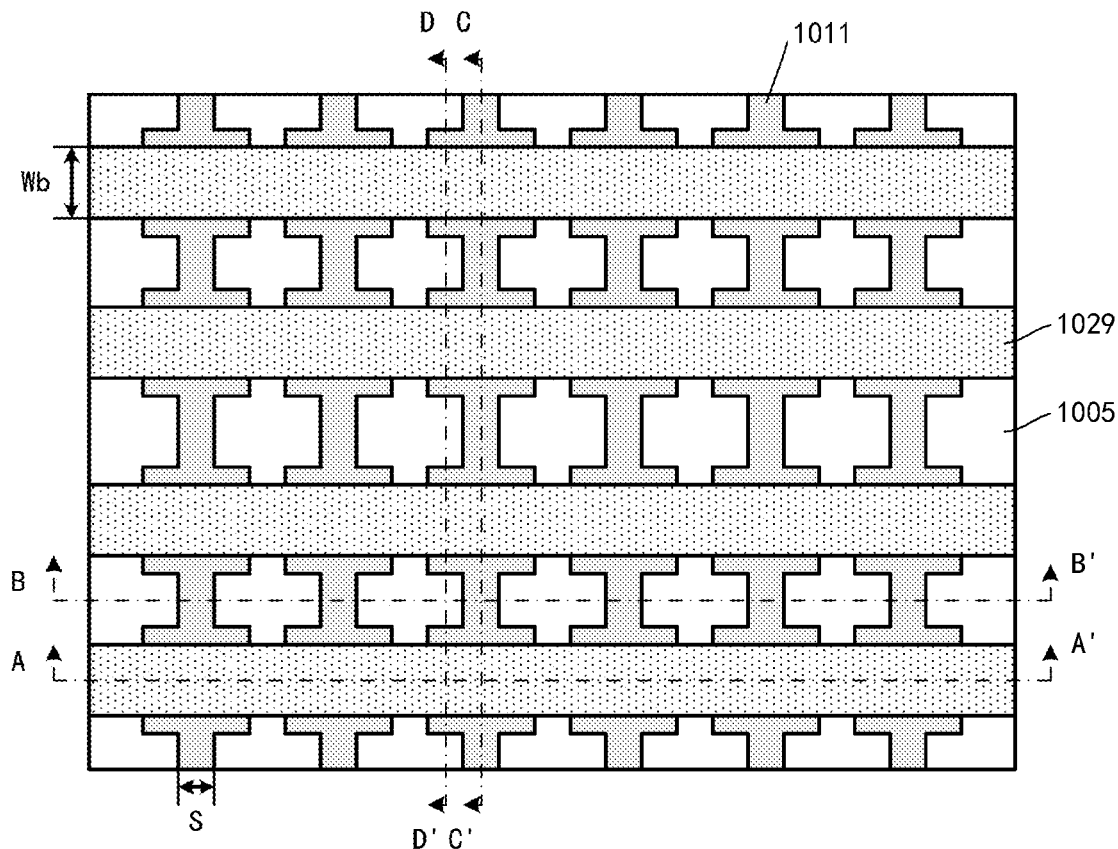
Figure 13A:
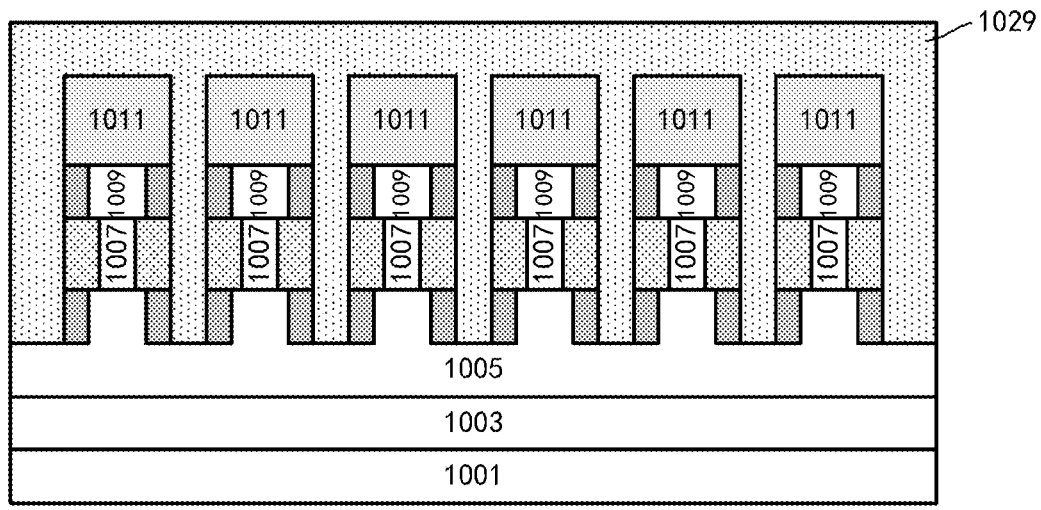
Figure 13B:
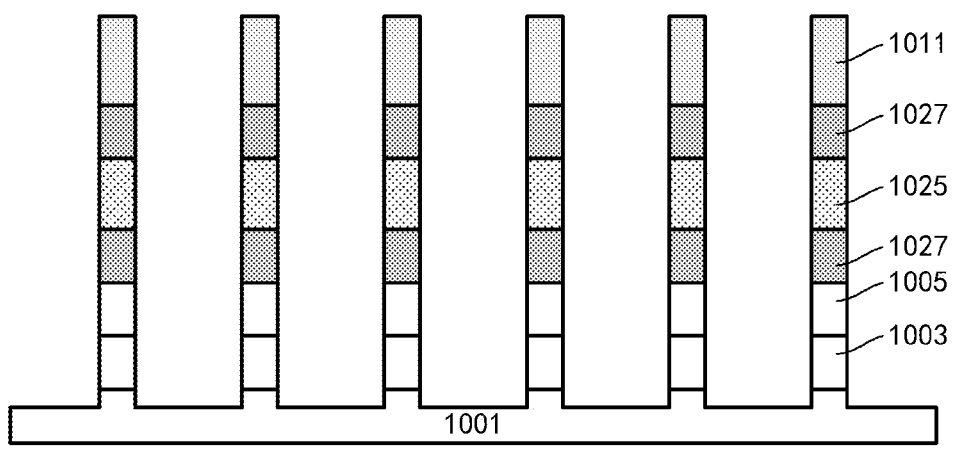
Figure 13C:
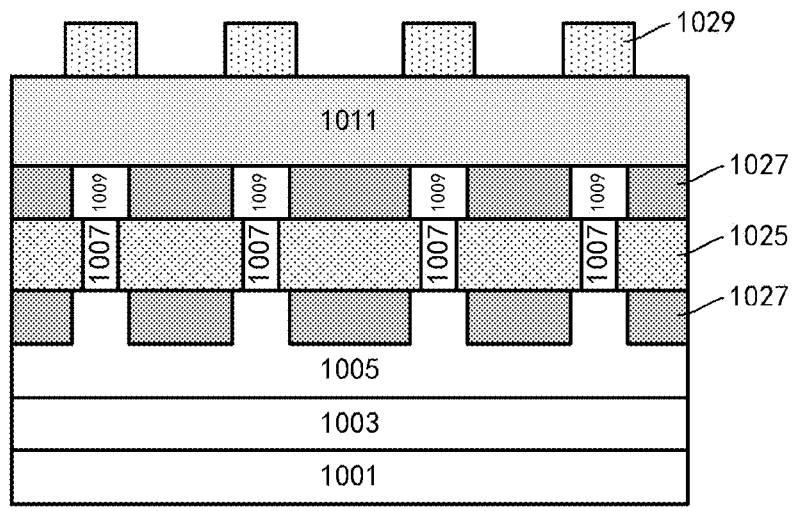
Figure 13D:
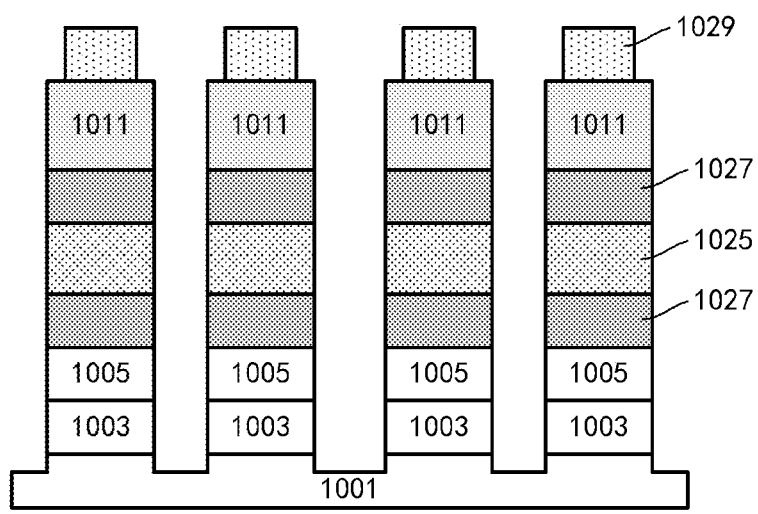
Figure 14A:
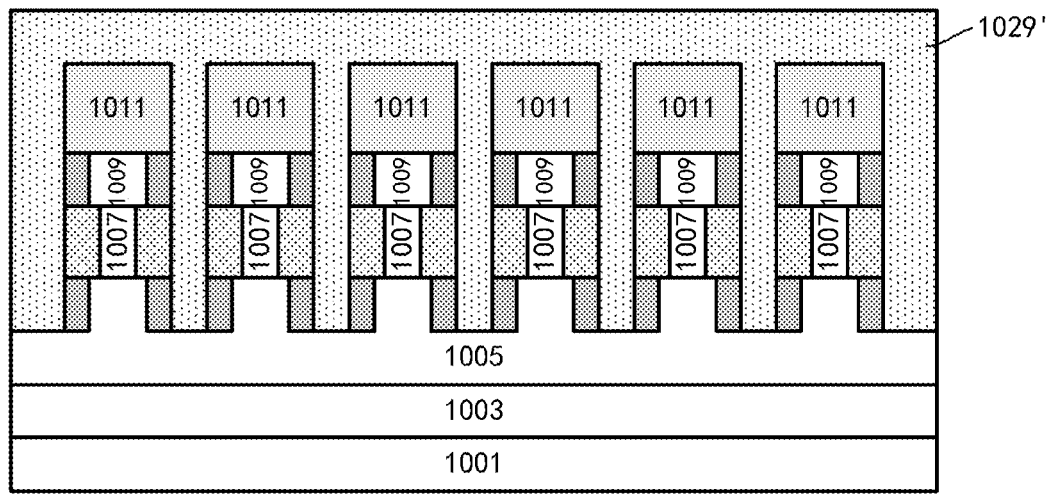
Figure 14B:
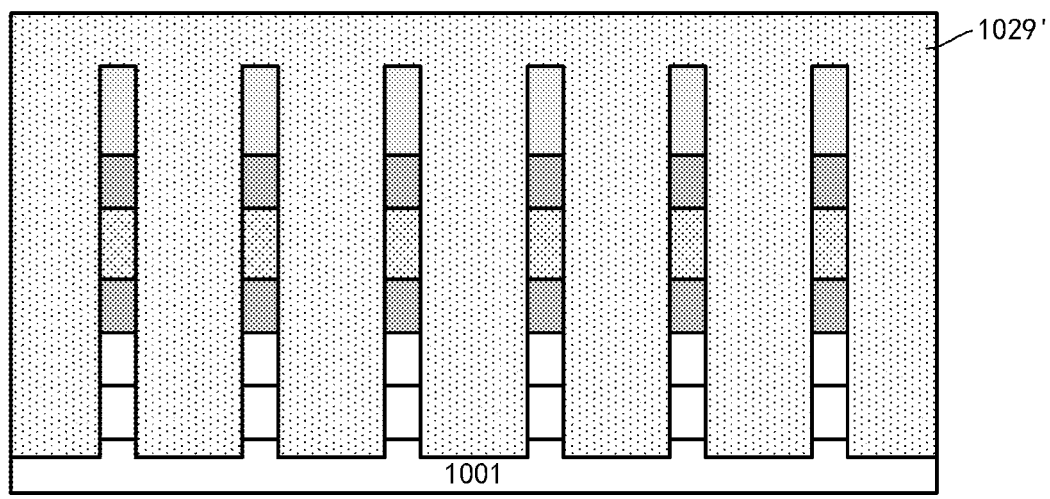
Figure 14C:
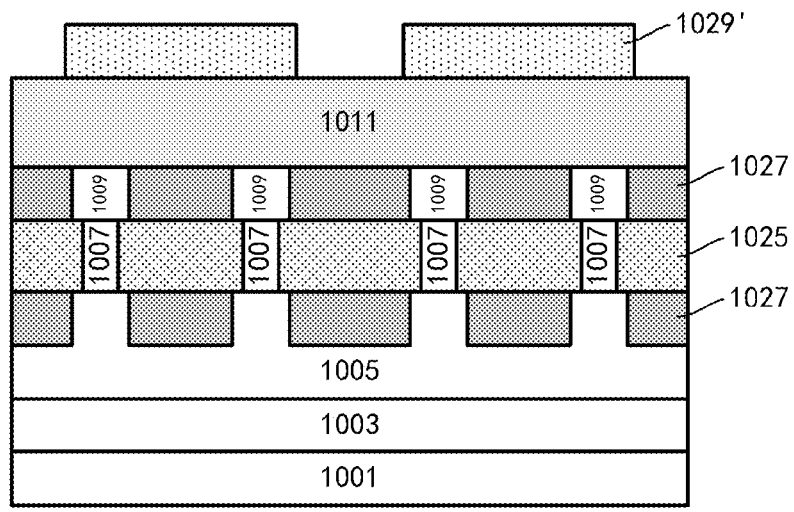
Figure 14D:
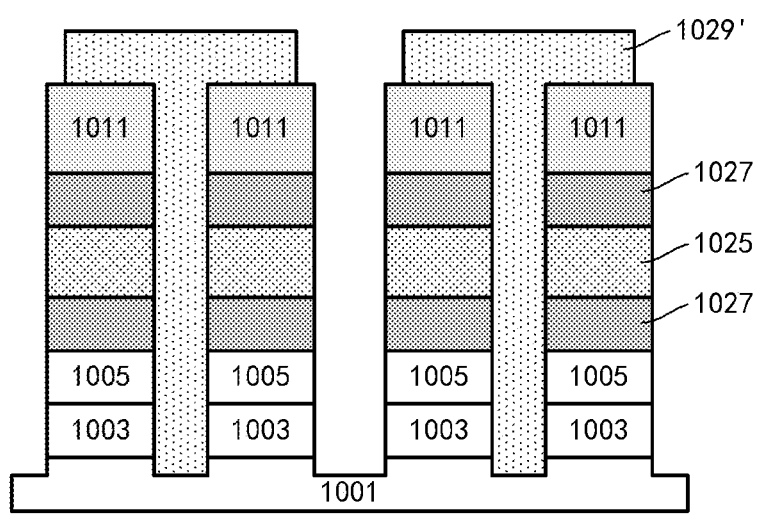
Figure 14E:
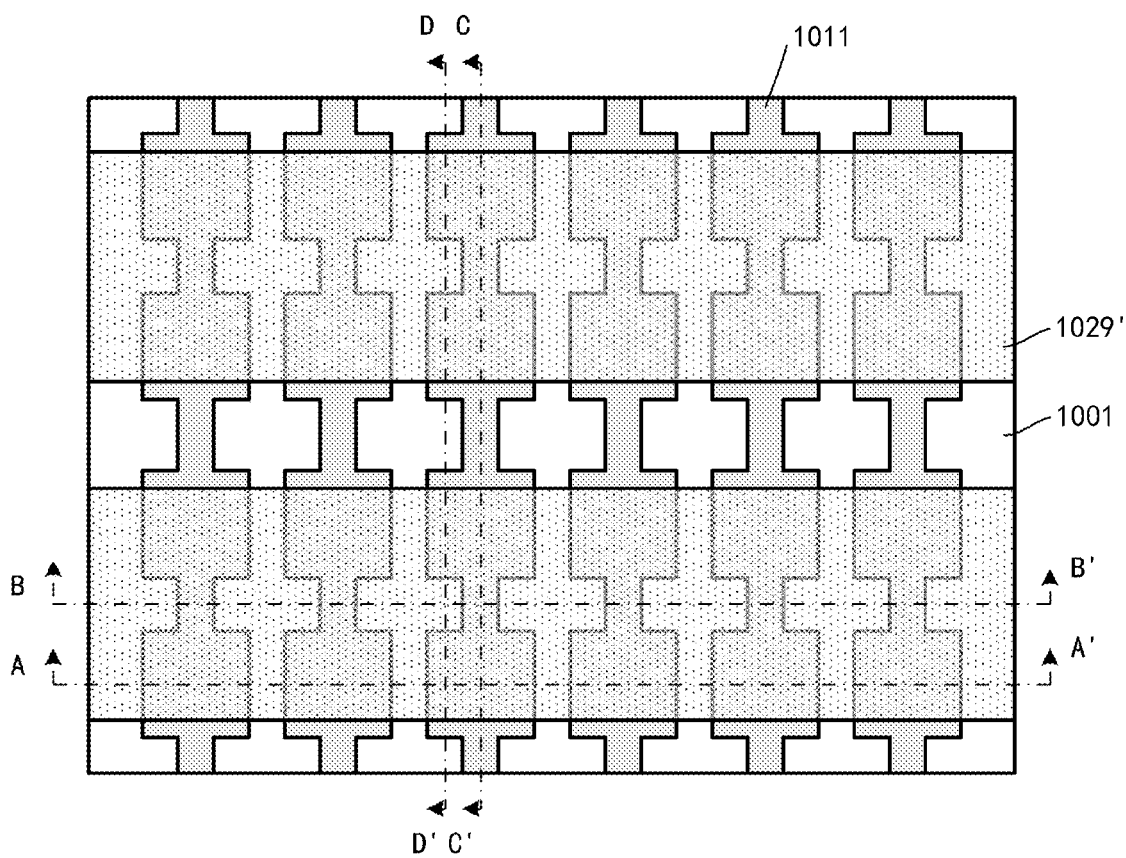
Figure 15A:
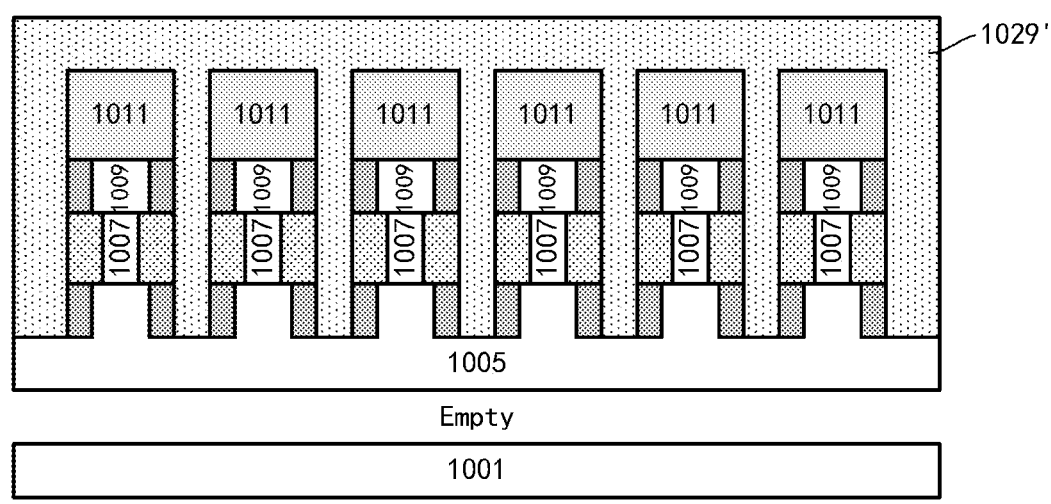
Figure 15B:
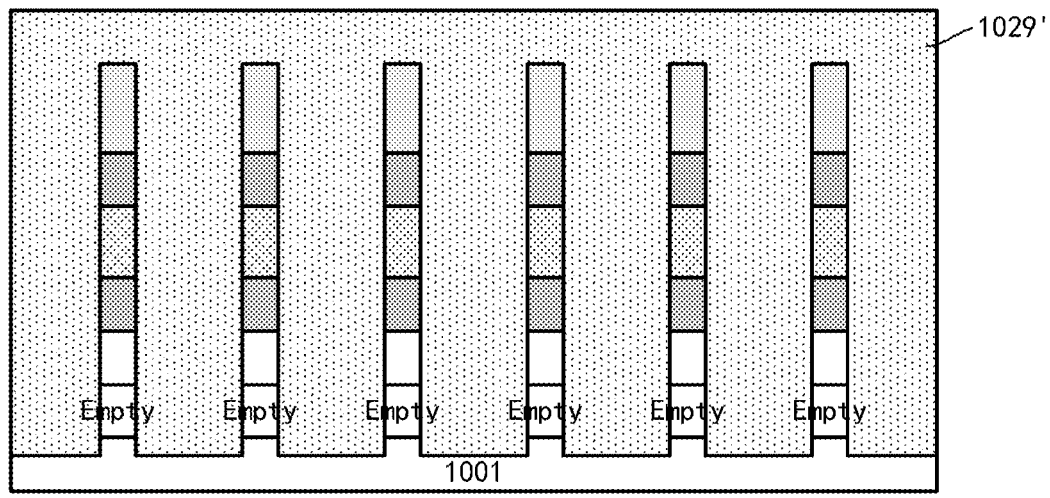
Figure 15C:
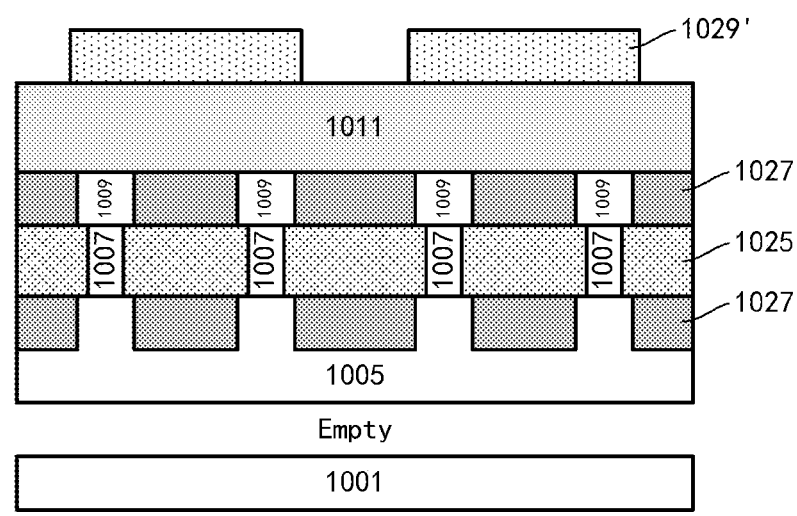
Figure 15D:
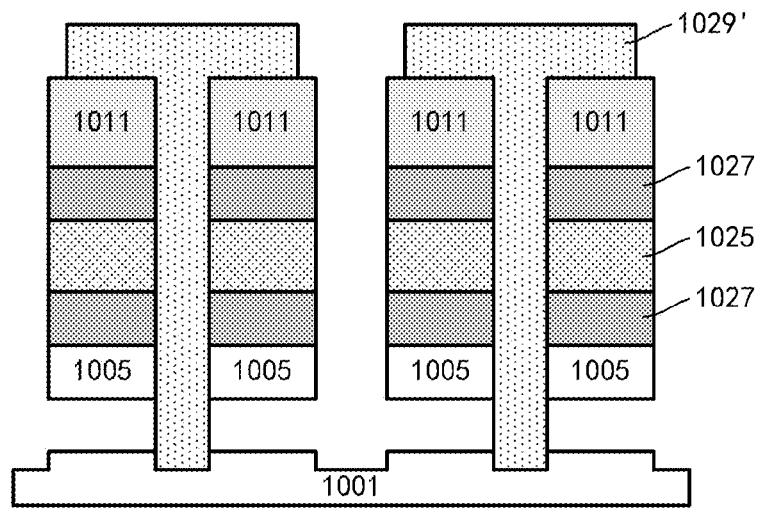
Figure 16A:
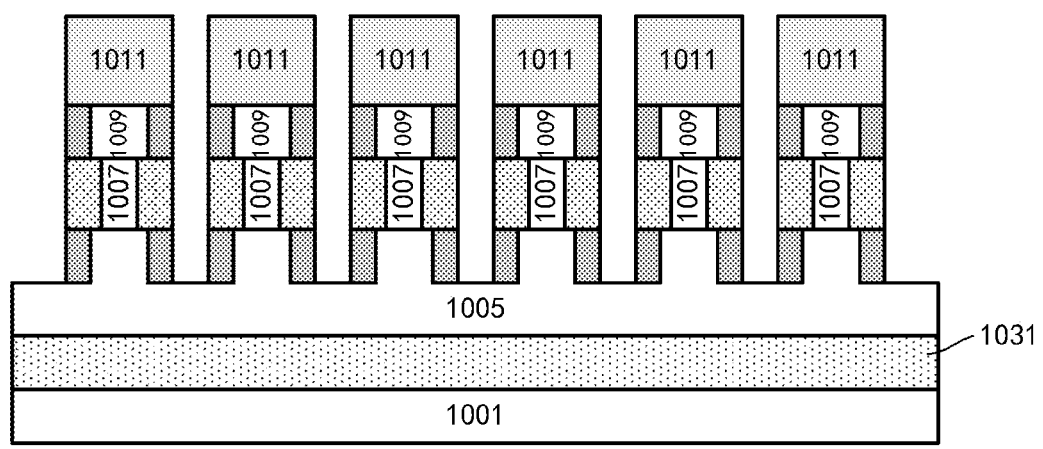
Figure 16B:
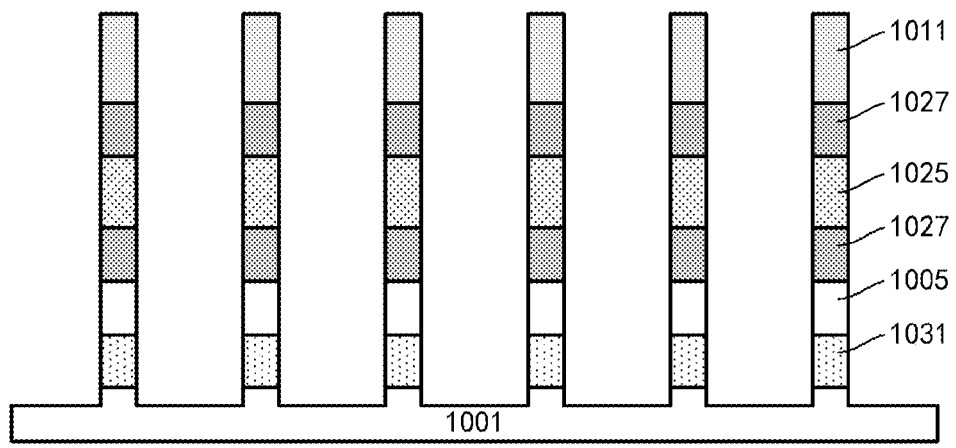
Figure 16C:
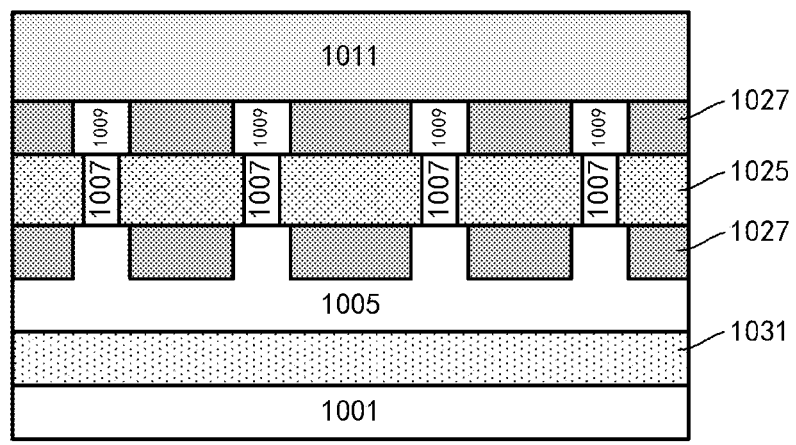
Figure 16D:
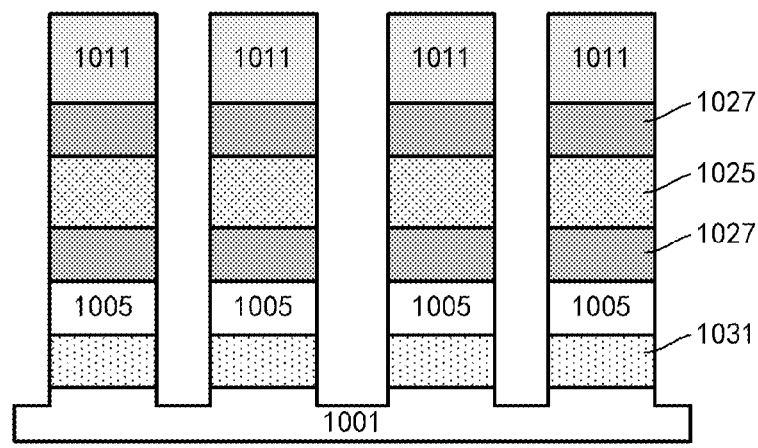
Figure 17A:
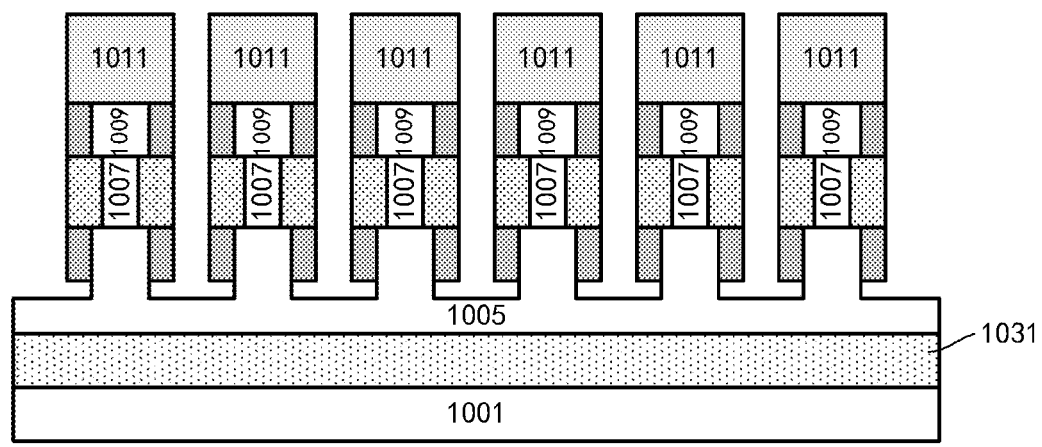
Figure 17B:
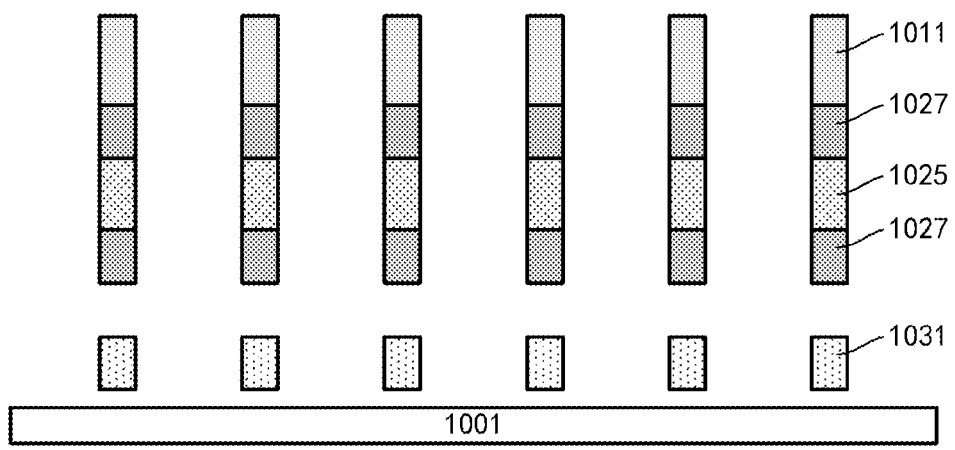
Figure 17C:
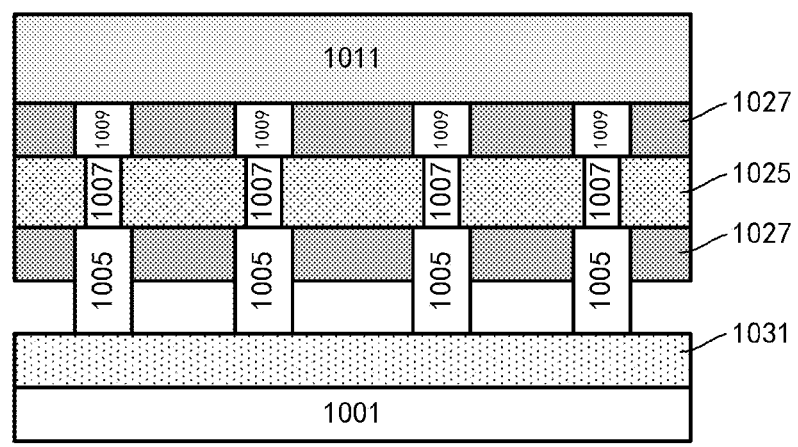
Figure 17D:
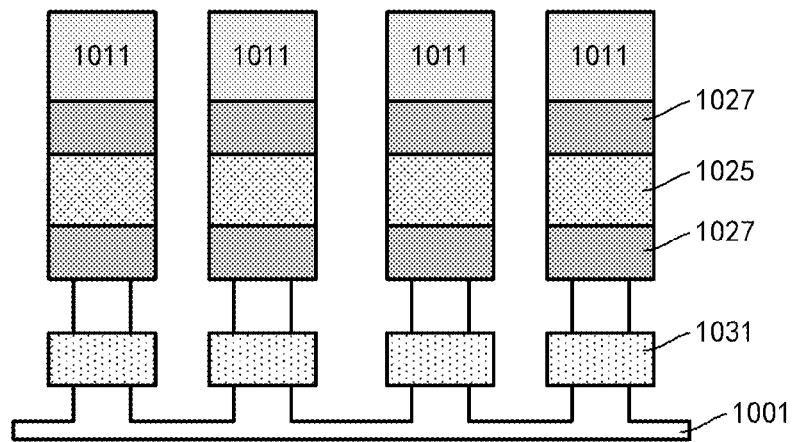

As shown in FIGS. 9(*a*), 9(*b*), 9(*c*) and 9(*d*), the sacrificial gate 1025 includes not only portions surrounding the channel layer 1007 but also bridge portions extending in the first direction.

Similarly, the first source/drain layer 1005 and the second source/drain layer 1009 may be separated. As shown in FIGS. 10(*a*), 10(*b*), 10(*c*) and 10(*d*) (FIGS. 10(*a*), 10(*b*), 10(*c*) and 10(*d*) are sectional views taken along lines AA', BB', CC' and DD' respectively), the first source/drain layer 1005 and the second source/drain layer 1009 (both of Si here) may be selectively etched, particularly, isotropically etched. An amount of etching may be controlled, so that the second source/drain layer 1009 and the upper portions of the first source/drain layer 1005 may be removed at the bridge portions. Thus, the second source/drain layer 1009 and the upper portions of the first source/drain layer 1005 are separated into portions at the respective memory cells, and these portions may form nanowires. In order to facilitate the control of the amount of etching, ALE or digital etching may be used.

Here, an example in which the etched second source/drain layer 1009 and the upper portions of the etched first source/drain layer 1005 are still thicker than the channel layer 1007 is illustrated, but the present disclosure is not limited thereto. For example, the etched second source/drain layer 1009 and the upper portions of the etched first source/drain layer 1005 may have substantially the same size as that of the channel layer 1007 or may be thinner than the channel layer 1007.

In order to maintain the spaces of the gate stacks and protect the source/drain layers or the like, a protection layer 1027 may be filled in spaces formed by the second source/drain layer 1009 and the upper portions of the first source/drain layer 1005 being recessed with respect to the hard mask layer 1011 due to the selective etching. The filling may be achieved by, for example, deposition and then back-etching. In order to provide desired etching selectivity, the protection layer 1027 may include, for example, low-k silicon carbide. In this case, the first spacers 1017 of SiC may be removed during the back-etching process.

Similarly, as shown in FIGS. 10(*a*), 10(*b*), 10(*c*) and 10(*d*), the protection layer 1027 includes not only portions surrounding the source/drain layers but also bridge portions extending in the first direction.

After the process described above is performed, the channel layer and the source/drain layers, as the active regions, have been substantially separated into separate pillar-shaped portions corresponding to the respective memory cells, but the lower portions of the first source/drain layer 1005 remain integrally extended. As described above, in the present embodiment, the bit lines are formed by a silicidation process with respect to the first source/drain layer 1005. To this end, the first source/drain layer 1005 (particularly the lower portions thereof) may be patterned into strips extending below the respective memory cell columns.

As shown in FIGS. 11(*a*), 11(*b*), 11(*c*), 11(*d*) and 11(*e*) (FIGS. 11(*a*), 11(*b*), 11(*c*) and 11(*d*) are sectional views, and FIG. 11(*e*) is a top view with line AA' indicating a position where the sectional view in FIG. 11(*a*) is taken, line BB' indicating a position where the sectional view in FIG. 11(*b*) is taken, line CC' indicating a position where the sectional view in FIG. 11(*c*) is taken, and line DD' indicating a position where the sectional view in FIG. 11(*d*) is taken), a mask material layer 1029 with a substantially uniform thickness may be formed (for example, deposited) on the structure shown in FIGS. 10(*a*), 10(*b*), 10(*c*) and 10(*d*). For example, the mask material layer 1029 may include oxide. In this example, since the second spacers 1019 also include oxide, they are labeled as 1029 along with the mask material layer.

A film thickness of the mask material layer 1029 is selected to be greater than a half of D3 but less than a half of D2. Thus, as shown in FIG. 11(*a*), the mask material layer 1029 formed on respective sidewalls of adjacent sub-stacks in the column direction may converge with each other, thereby filling up spacings (equal to D3) between the respective adjacent sub-stacks in the column direction. On the other hand, as shown in FIG. 11(*d*), the mask material layer 1029 formed on the respective sidewalls of the adjacent sub-stacks in the row direction do not converge together, and thereby there are still gaps in spacings (equal to D1 or D2) between the respective adjacent sub-stacks in the row direction.

In addition, as shown in FIGS. 10(*a*) and 11(*a*), the mask material layer 1029 may also fill up spacings inside the second spacers 1019 due to the presence of the second spacers 1019 and the relatively small spacings therebetween. Thus, the mask material layer 1029 may exhibit substantially strip patterns extending over the respective columns of sub-stacks.

It should be illustrated here that, it is not necessary that the mask material layer 1029 fills up the spacings inside the second spacers 1019. Since the bit lines may be defined by the hard mask layer 1011 itself at the positions of the sub-stacks (or the memory cells), the mask material layer 1029 only needs to fill up spacings between adjacent ones of sub-stacks (or memory cells) in the same column.

Then, as shown in FIGS. 12(*a*), 12(*b*), 12(*c*), 12(*d*) and 12(*e*) (FIGS. 12(*a*), 12(*b*), 12(*c*) and 12(*d*) are sectional views, and FIG. 12(*e*) is a top view with line AA' indicating a position where the sectional view in FIG. 12(*a*) is taken, line BB' indicating a position where the sectional view in FIG. 12(*b*) is taken, line CC' indicating a position where the sectional view in FIG. 12(*c*) is taken, and line DD' indicating a position where the sectional view in FIG. 12(*d*) is taken), the mask material layer 1029 may be etched back. Here, a thickness by which the back-etching is performed is controlled to be greater than that of the deposited mask material layer 1029 (but less than a size of the mask material layer 1029 stacked on the substrate in the vertical direction). In order to better control an amount of back-etching, ALE may be used. As shown in FIG. 12(*a*), portions of the mask material layer 1029 in the spacings between the respective adjacent sub-stacks in the column direction are deposited on the substrate to have a large film thickness, and thereby parts of top portions of the mask material layer 1029 are removed, but the mask material layer 1029 still fills the spacings between the respective adjacent sub-stacks in the column direction. On the other hand, as shown in FIG. 12(*d*), portions of the mask material layer 1029 formed on the respective sidewalls of the adjacent respective sub-stacks in the row direction are removed since the film thickness thereof is less than the thickness by which the back-etching is performed. The remaining portions of the mask material layer form a mask layer, which is still labeled as 1029. According to other embodiments of the present disclosure, there are no such requirements on D1, D2, and D3, and a pattern of the mask material layer 1029 may be defined using a patterning method (for example, photolithography, or the like).

Thus, the mask layer 1029 has strip shapes extending in the second direction or the column direction. These strip patterns extend over the respective memory cell columns, and may expose parts of sidewalls of the hard mask layer 1011 in the respective columns. Thus, in a subsequent patterning or etching process, the hard mask layer 1011 may function as a mask together with the mask layer 1029 and may define positions of the bit lines.

Depending on the spacings inside the second spacers 1029, the mask layer 1029 may not extend continuously in the column direction. The hard mask layer 1011 exist at positions where the mask layer 1029 does not continuous, and therefore there is no influence on the definition of the positions of the bit lines by the mask layer 1029.

Here, as described below, a width Wb of the mask layer 1029 may be greater than a width S of the bridge portions in order to prevent the bit lines from being cut off in subsequent etching.

Then, as shown in FIGS. 13(*a*), 13(*b*), 13(*c*) and 13(*d*) (FIGS. 13(*a*), 13(*b*), 13(*c*) and 13(*d*) are sectional views taken along lines AA', BB', CC' and DD' respectively), the lower portions of the first source/drain layer 1005 may be selectively etched by, for example, RIE (in, for example, the direction substantially perpendicular to the substrate surface) using the mask layer 1029 and the hard mask layer 1011 as a mask. Thus, strip portions extending in the column direction are formed in the lower portions of the first source/drain layer 1005, and these strip portions are located below the respective memory cell columns. Due to the definition function of the hard mask layer 1011, these strip portions (and the bit lines which are subsequently formed thereby) may be self-aligned below the respective memory cells at the positions of the respective memory cells. In addition, due to the presence of the bridge portions in the hard mask layer 1011, there are also bridge portions between the respective strip portions, and these bridge portions may subsequently be removed to separate the bit lines from each other.

In addition, the sacrificial layer 1003 may be removed in order to facilitate separation and silicidation of the lower portions of the first source/drain layer 1005. To this end, paths to the sacrificial layer 1003 may be opened. For example, the sacrificial layer 1003 may continue to be selectively etched by, for example, RIE (in the direction substantially perpendicular to the substrate surface) using the mask layer 1029 and the hard mask layer 1011 as a mask. The RIE may be performed into the substrate 1001. Thus, a series of openings are formed in the sacrificial layer 1003, and the sacrificial layer 1003 may then be removed through these openings.

Here, the mask layer 1029 which is self-aligned with the respective memory cell columns and is used to define the positions of the bit lines may be formed without a mask. Of course, the present disclosure is not limited thereto, and the mask layer 1029 may be formed using a mask by, for example, photolithography.

In order to hold the array of active regions (to prevent collapse) when the sacrificial layer 1003 is removed, a hold layer may be provided, as shown in FIGS. 14(*a*), 14(*b*), 14(*c*), 14(*d*) and 14(*e*) (FIGS. 14(*a*), 14(*b*), 14(*c*) and 14(*d*) are sectional views, and FIG. 14(*e*) is a top view with line AA' indicating a position where the sectional view in FIG. 14(*a*) is taken, line BB' indicating a position where the sectional view in FIG. 14(*b*) is taken, line CC' indicating a position where the sectional view in FIG. 14(*c*) is taken, and line DD' indicating a position where the sectional view in FIG. 14(*d*) is taken). The same hold layer may be shared between two adjacent columns. Then, every two adjacent columns may be taken as a group. A hold layer may be formed between two columns in each group, so that the hold layer may hold the two columns. There may be no hold layer formed between two groups to expose the sacrificial layer.

A hold material layer with a certain film thickness may be deposited using a process similar to that described above. The film thickness of the hold material layer may be selected to be greater than a half of D2 but less than a half of D1, and then a thickness by which the deposited hold material layer is etched back may be greater than the film thickness of the deposited hold material layer. Then, as shown in FIGS. 14(*d*) and 14(*e*), in a spacing (=D2) between two columns in the same group, the hold material layer is remained since it converges with each other and is stacked on the substrate; and in spacings (=D1) between the respective groups, the hold material layer is removed since it does not converge with each other and substantially remains a deposited film thickness. The remaining hold material layer forms a hold layer 1029'. According to other embodiments of the present disclosure, there are no such requirements on D1 and D2, and a pattern of the hold layer 1029' may be defined using a patterning method (for example, photolithography, or the like).

In this example, the hold material layer also includes oxide, and therefore the previous mask layer and the hold material layer together are labeled as 1029'.

As shown in FIG. 14(*e*), the hold layer 1029' forms strip patterns extending in the second direction or the column direction. These strip patterns block a position between two columns in each group, and expose the positions between the respective groups. Further, the sidewalls of the hard mask layer 1011 at the positions between the respective groups may be at least partially or even fully exposed.

It may be seen that the hold layer 1029' is connected to the respective active regions and is connected to the substrate 1001. Thereby, the active regions may be held during subsequent processes to avoid collapse.

In the above example, when the hold material layer is formed, the mask layer 1029 is remained and the same material is used as the hold material layer. This is advantageous for forming the hold layer 1029' which extends continuously in the column direction and has strip patterns, as shown in FIG. 14(*a*). However, the present disclosure is not limited thereto. The hold layer and the mask layer 1029 may include different materials, or even the mask layer 1029 may be firstly removed and then the hold layer is formed.

Similarly, the hold layer 1029' may be formed without a mask here. Of course, the present disclosure is not limited thereto, and the hold layer 1029' may be formed using a mask by, for example, photolithography.

After that, as shown in FIGS. 15(*a*), 15(*b*), 15(*c*) and 15(*d*) (FIGS. 15(*a*), 15(*b*), 15(*c*) and 15(*d*) are sectional views taken along lines AA', BB', CC' and DD' respectively), the sacrificial layer 1003 (of SiGe here) may be removed by selective etching such as RIE against the substrate 1001 and the first source/drain layer 1005 (both of Si here) through gaps between the respective groups. Due to the presence of the hold layer 1029', the active regions may be supported.

Due to the removal of the sacrificial layer 1003, the lower portions of the first source/drain layer 1005, particularly the bottom surface thereof, are sufficiently exposed. The bit lines may be formed below the first source/drain layer 1005 in various manners. For example, bit lines of conductive material such as metal may be formed below the first source/drain layer 1005 in spaces left due to the removal of the sacrificial layer 1003. Alternatively, the bit lines may be formed by performing a silicidation process on the exposed surface of the lower portions of the first source/drain layer 1005 in the spaces left due to the removal of the sacrificial layer 1003.

In addition, the bridge portions are blocked by the hold layer 1029' between adjacent memory cell columns in each group. In an embodiment in which the bit lines are formed by silicidation reaction, in order to separate the bit lines, it is necessary to expose these bridge portions, so that the bridge portions may be removed. That is, the hold layer 1029' needs to be at least partially removed. In order to maintain the hold function of the active regions, as shown in FIGS. 16(*a*), 16(*b*), 16(*c*) and 16(*d*) (FIGS. 16(*a*), 16(*b*), 16(*c*) and 16(*d*) are sectional views taken along lines AA', BB', CC' and DD' respectively), a dielectric material 1031 such as oxide may be filled in the spaces left due to the removal of the sacrificial layer 1003. For the purpose of the quality of the filling process, Atomic Layer Deposition (ALD) may be used.

After the deposition, back-etching may be performed. Thus, the dielectric material 1031 is filled below the hard mask layer 1011. Here, since the hold layer 1029' also includes oxide, it may also be etched back, and the remaining portions thereof are labeled as 1031 along with the dielectric material. The dielectric material 1031, on the one hand, may support the active regions thereabove, and on the other hand, may subsequently electrically isolate the bit lines (from, for example, the substrate 1001).

In this way, a configuration similar to SOI is formed. In a case where an SOI substrate is used, a buried oxide layer of the SOI substrate may provide the hold function, and thereby it is not necessary to provide the sacrificial layer 1031, and it is also not necessary to form the hold layer, remove the sacrificial layer, and fill the dielectric layer as described above.

As described above, the lower portions of the first source/drain layer 1005 are defined by the mask layer 1029 and the hard mask layer 1011 as strip patterns extending in the second direction or the column direction, but there are still bridge portions between the respective strip patterns. These bridge portions need to be removed to separate the respective bit lines. To this end, as shown in FIGS. 17(*a*), 17(*b*), 17(*c*) and 17(*d*) (FIGS. 17(*a*), 17(*b*), 17(*c*) and 17(*d*) are sectional views taken along lines AA', BB', CC' and DD' respectively), the first source/drain layer 1005 may be selectively etched, particularly isotropically etched. An amount of etching may be controlled, so that the first source/drain layer 1005 may be removed at the bridge portions, but the lower portions of the first source/drain layer 1005 remain extending continuously in the column direction. Thus, the lower portions of the first source/drain layer 1005 are separated into a plurality of strips extending in the column direction. For example, this may be achieved by controlling the etching amount or etching thickness to be greater than a half of S (so that the bridge portions may be removed) but less than a half of Wb (to ensure continuous extension in the column direction). In order to facilitate controlling the amount of etching, ALE or digital etching may be used.

Figure 18A:
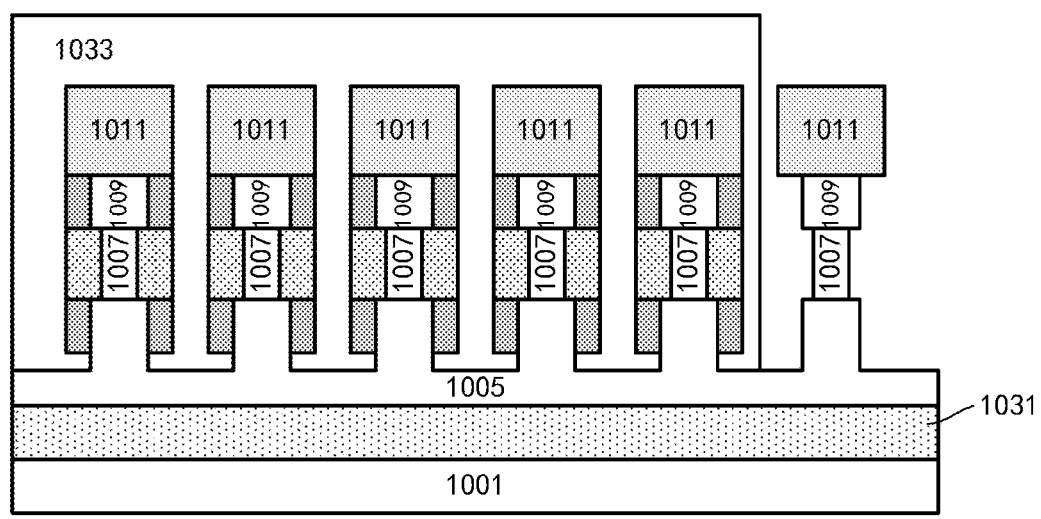
Figure 18B:
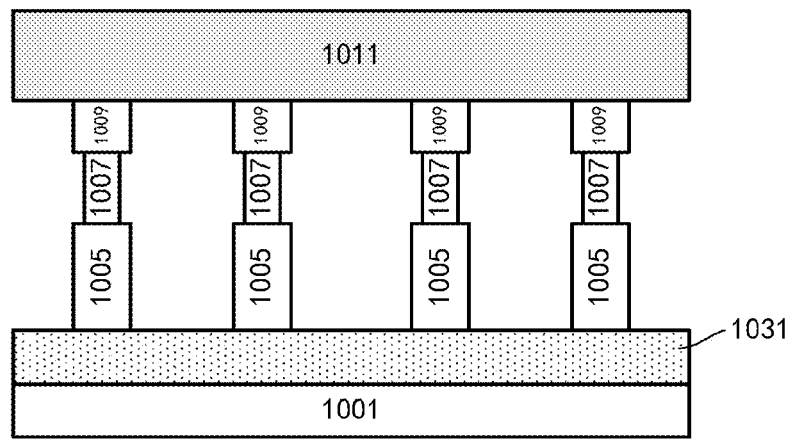
Figure 18C:
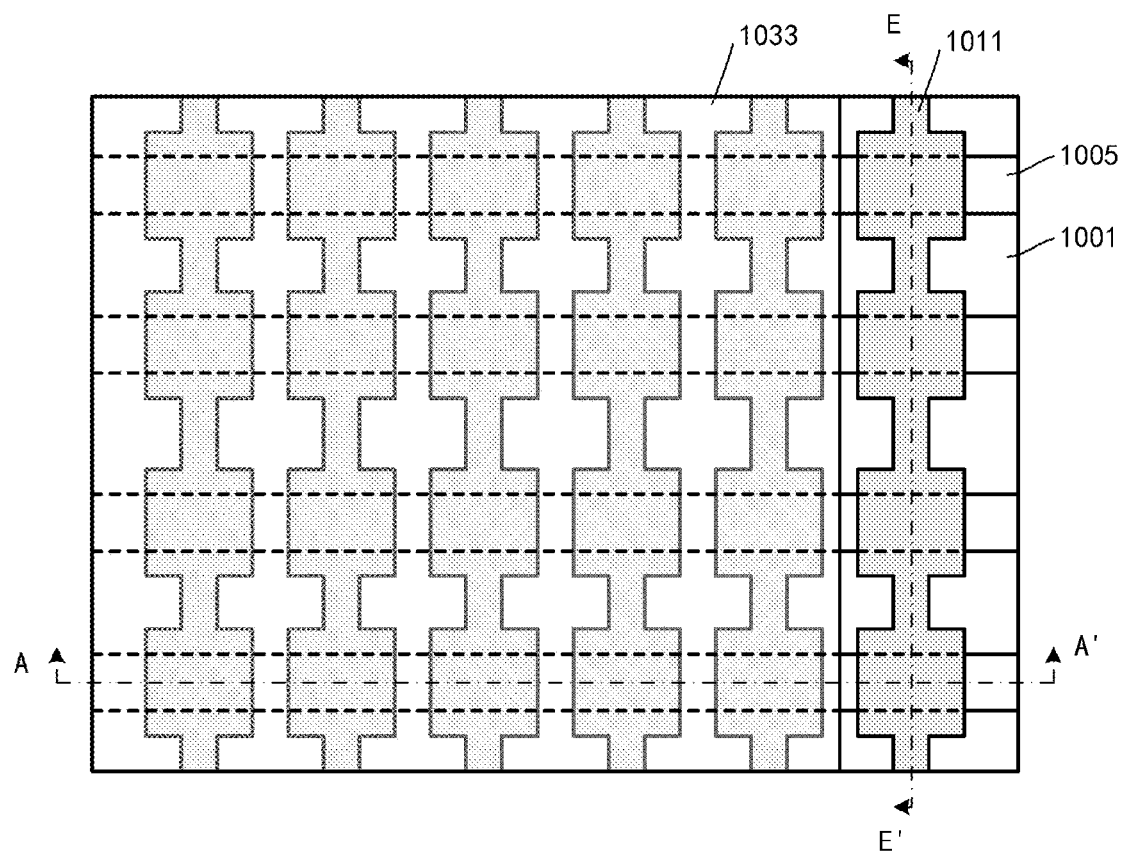
Figure 19A:
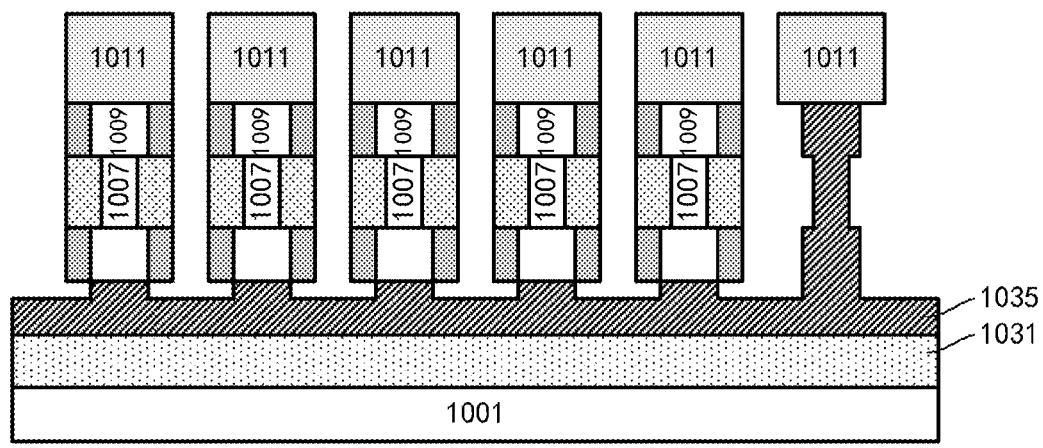
Figure 19B:
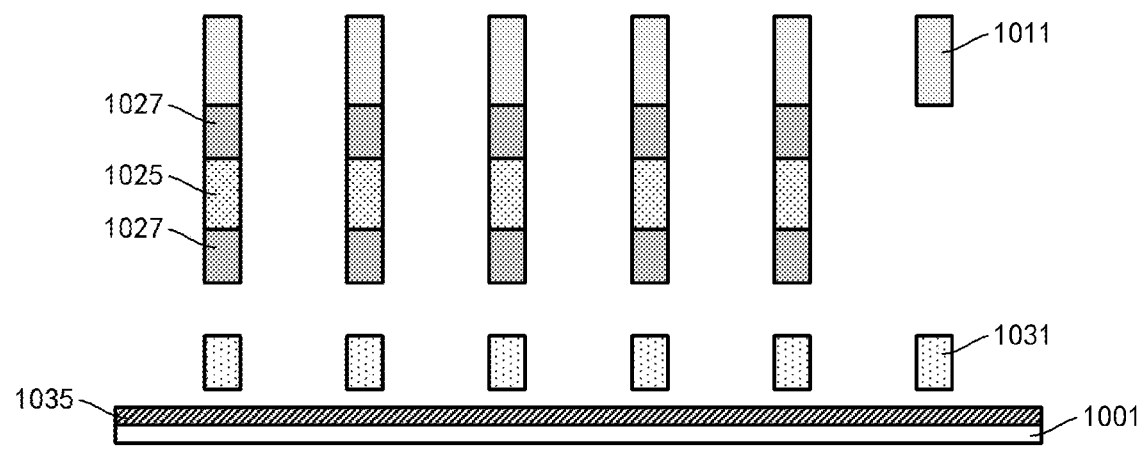
Figure 19C:
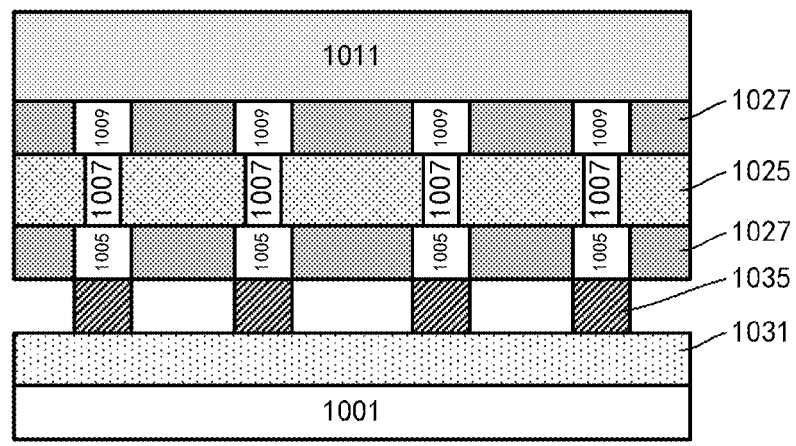
Figure 19D:
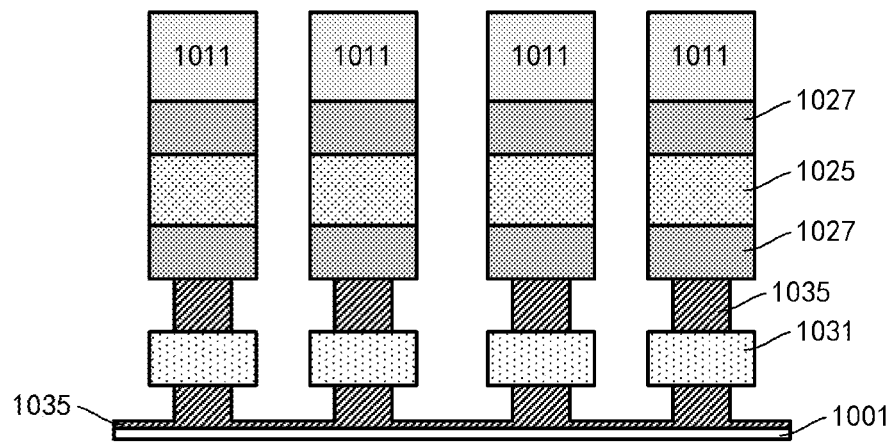
Figure 19E:
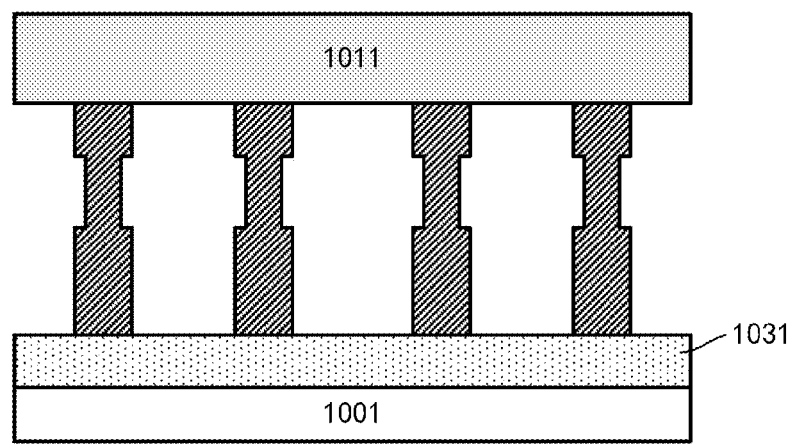

As shown in FIGS. 18(*a*), 18(*b*) and 18(*c*) (FIGS. 18(*a*) and 18(*b*) are sectional views, and FIG. 18(*c*) is a top view with line AA' indicating a position where the sectional view in FIG. 18(*a*) is taken, and line EE' indicating a position where the sectional view in FIG. 18(*b*) is taken), photoresist 1033 may be formed on the substrate and may be patterned to expose a row of sub-stacks (the rightmost row in the figure). This row of sub-stacks may not be used to form memory cells later but to form contacts to the bit lines. Of course, in order to reduce contact resistance, multiple rows of sub-stacks at different positions may be selected to form the contacts to the bit lines. Here, description is made here by taking only one row as an example.

For the row of sub-stacks exposed by the photoresist 1033, the sacrificial gate 1025 and the protection layer 1027 may be removed by selective etching to expose the channel layer and the source/drain layers in the row, which may then undergo silicidation reaction to produce silicide to form conductive contacts.

Then, as shown in FIGS. 19(*a*), 19(*b*), 19(*c*), 19(*d*) and 19(*e*) (FIGS. 19(*a*), 19(*b*), 19(*c*), 19(*d*) and 19(*e*) are sectional views taken along lines AA', BB', CC', DD' and EE' respectively), a silicidation process may be performed through gaps in the stack. For example, metal such as Ni may be deposited by, for example, ALD through these gaps and may be annealed at a temperature of, for example, 200-600° C., so that the deposited metal reacts with a semiconductor material to produce metal silicide 1035. The metal silicide 1035 forms bit lines. Then, unreacted excess metal may be removed by selective etching. The bit lines 1035 thus formed are self-aligned below the first source/drain layer 1005. As shown in FIG. 19(*a*), the bit lines 1035 extend continuously below the memory cell columns, and one of the bit lines may be led from the metal silicide (as contacts) which is produced from the semiconductor in the sub-stacks exposed by the photoresist 1033. The contacts thus formed are self-aligned with the bit lines.

Here, the substrate 1001 may also undergo silicidation reaction.

Although the formation of the bit lines is described here by taking the silicidation reaction of a silicon element with a metal element as an example, the present disclosure is not limited thereto. Depending on the semiconductor element contained in the first source/drain layer, it is also possible to produce a metal semiconductor compound which results from reaction of another semiconductor element such as Ge or the like with one or more of metal elements such as Ni, Pt, Co, Ti, Si, Ge, or the like.

Then, the bit lines 1035 which are buried below the respective active regions and the contacts to the respective bit lines which are self-aligned with the respective bit lines are formed.

Next, gate stacks may be formed.

As shown in FIGS. 20(*a*), 20(*b*), 20(*c*), 20(*d*) and 20(*e*) (FIGS. 20(*a*), 20(*b*), 20(*c*), 20(*d*) and 20(*e*) are sectional views taken along lines AA', BB', CC', DD' and EE' respectively), for the purpose of electrical isolation, a dielectric may be filled in the gaps of the stack. In this example, the dielectric may have the same material, such as oxide, as the dielectric material 1031, and therefore they are collectively shown as 1037. This may be done by, for example, depositing oxide and performing a planarization process such as CMP (which is stopped at the hard mask layer 1011). The dielectric layer 1037 may be etched back so that the dielectric layer 1037 has its top surface lowered to a level below, for example, the bottom surface of the channel layer 1007 to expose the sacrificial gate 1025. Of course, in order to avoid possible influence on the source/drain layers and the bit lines, the dielectric layer 1037 preferably has its top surface at a level above the bottom surface of the protection layer 1027.

The sacrificial gate 1025 (of nitrogen oxide here) may be removed by selective etching. Due to the removal of the sacrificial gate 1025, gaps are left below the hard mask layer 1011. Gate stacks may be formed in the gaps. For example, a gate dielectric layer 1039 and a gate conductor layer 1041 may be sequentially deposited, and the deposited gate conductor layer 1041 (and optionally gate dielectric layer 1039) may be selectively etched by, for example, RIE (in, for example, the direction substantially perpendicular to the substrate surface) to fill the gate stacks in the gaps below the hard mask layer. For example, the gate dielectric layer 1039 may include a high-k gate dielectric such as $HfO_2$ with a thickness of about 1-5 nm; and the gate conductor layer 1041 may include a metal gate conductor. In addition, a work function adjustment layer may further be formed between the gate dielectric layer 1039 and the gate conductor layer 1041. An interface layer of, for example, oxide may further be formed before the gate dielectric layer 1039 is formed.

According to another embodiment, the gate stacks may form a storage configuration. For example, a floating gate layer or a charge trapping layer or a ferro-electric material or the like may be deposited before the gate conductor layer 1041 is deposited.

Figure 20A:
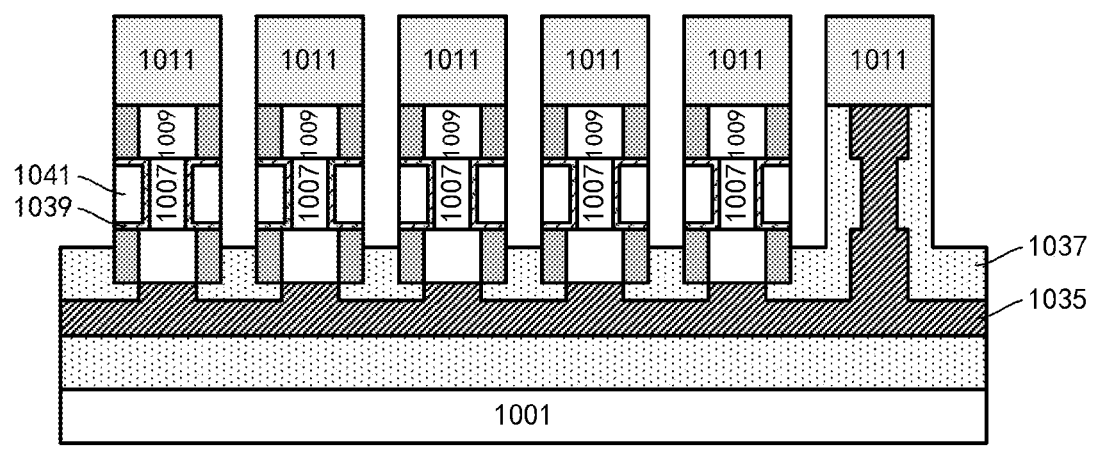
Figure 20B:
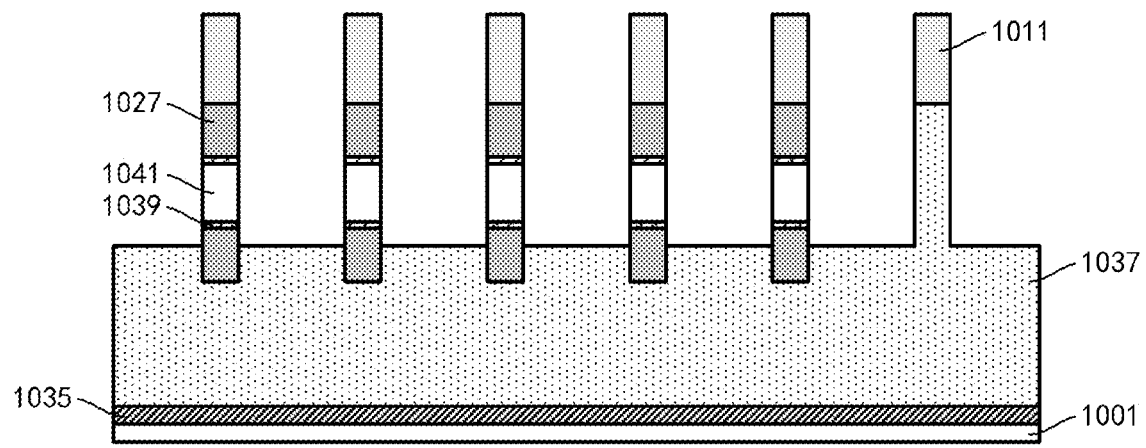
Figure 20C:
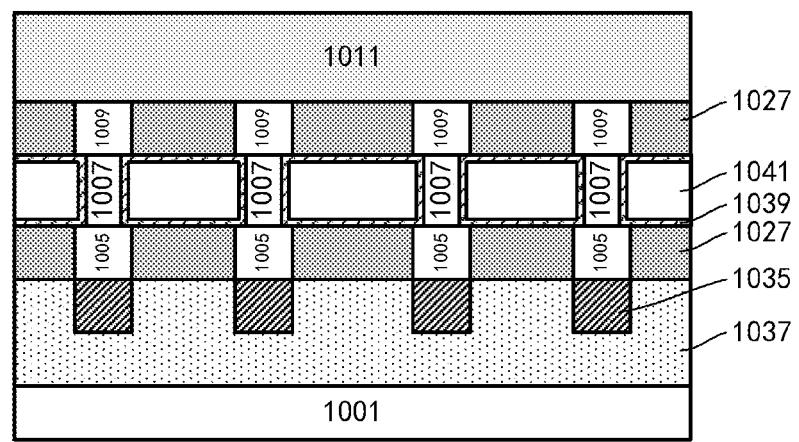
Figure 20D:
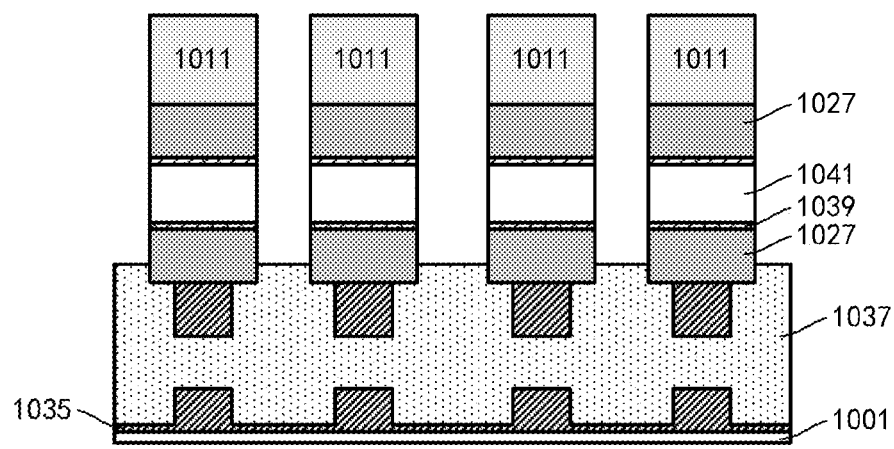
Figure 20E:
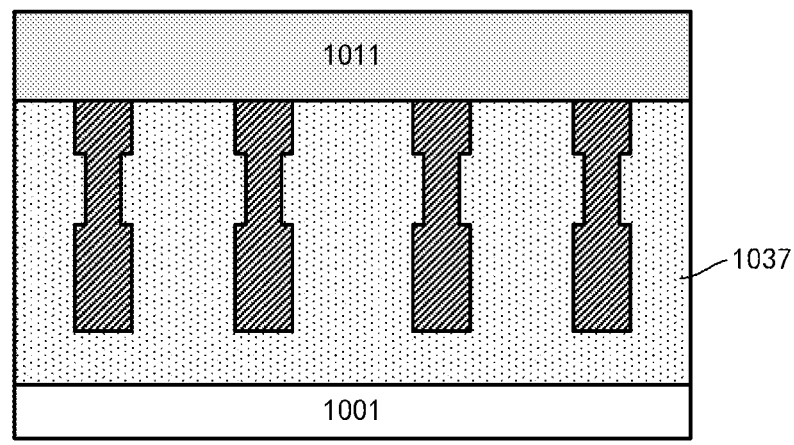

As described above, the sacrificial gate 1025 is self-aligned with the channel layer 1007, and therefore the gate stacks 1039/1041 with which the sacrificial layer 1025 is replaced are also self-aligned with the channel layer 1007. In addition, the gate stacks also have bridge portions corresponding to those of the hard mask layer 1011. That is, as shown in FIG. 20(c), the gate stacks in the same row extend continuously.

Figure 21A:
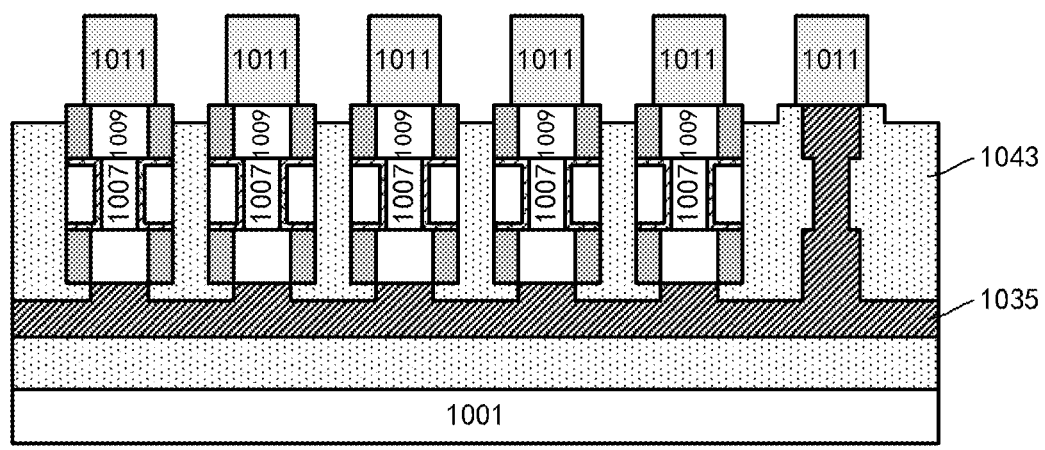
Figure 21B:
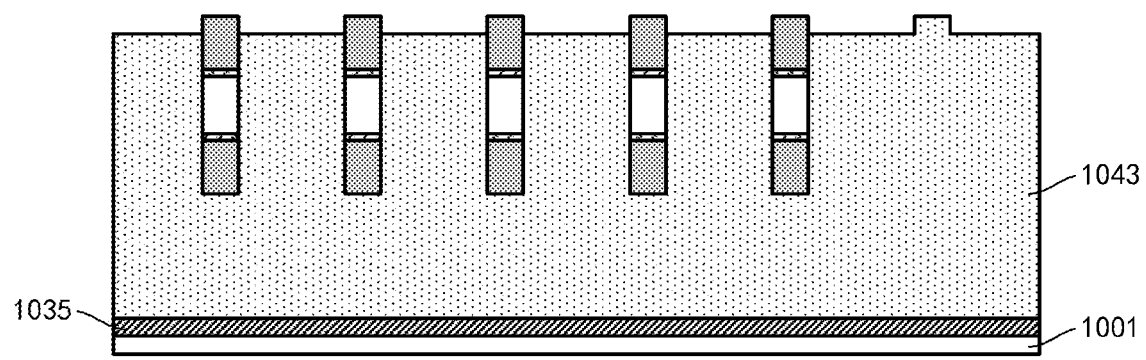
Figure 21C:
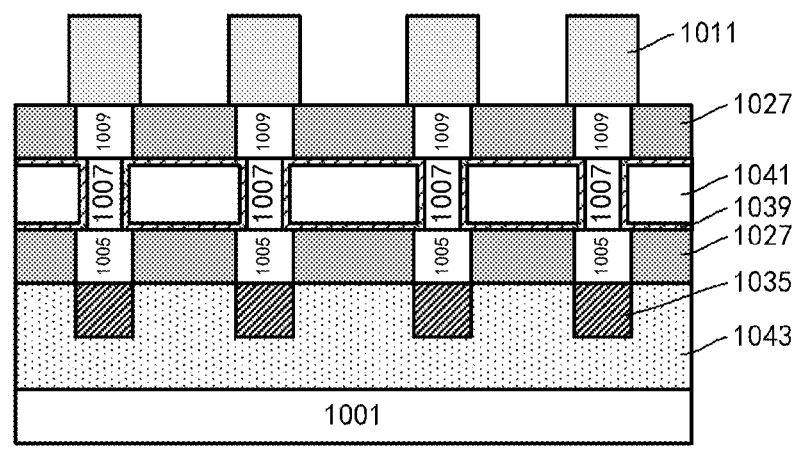
Figure 21D:
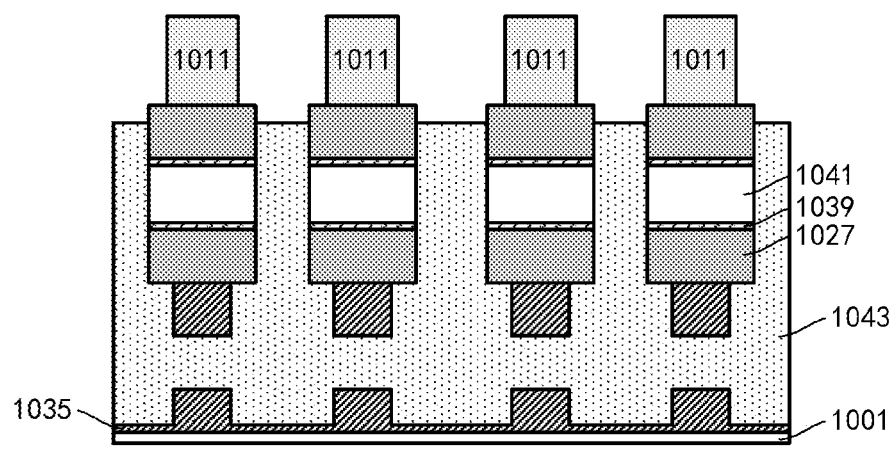
Figure 21E:
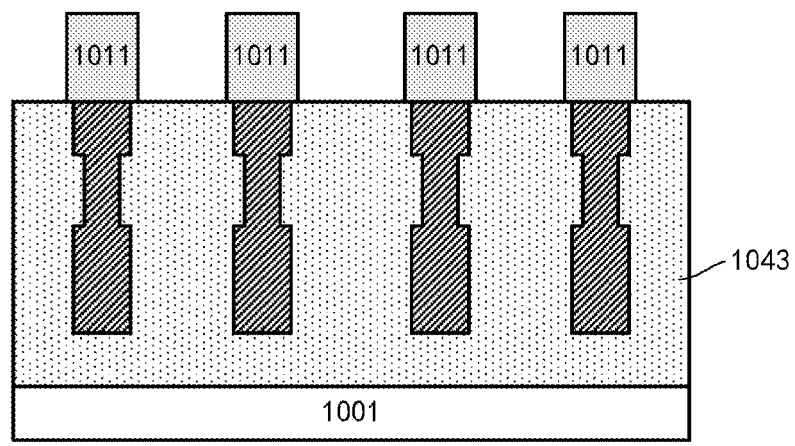
Figure 21F:
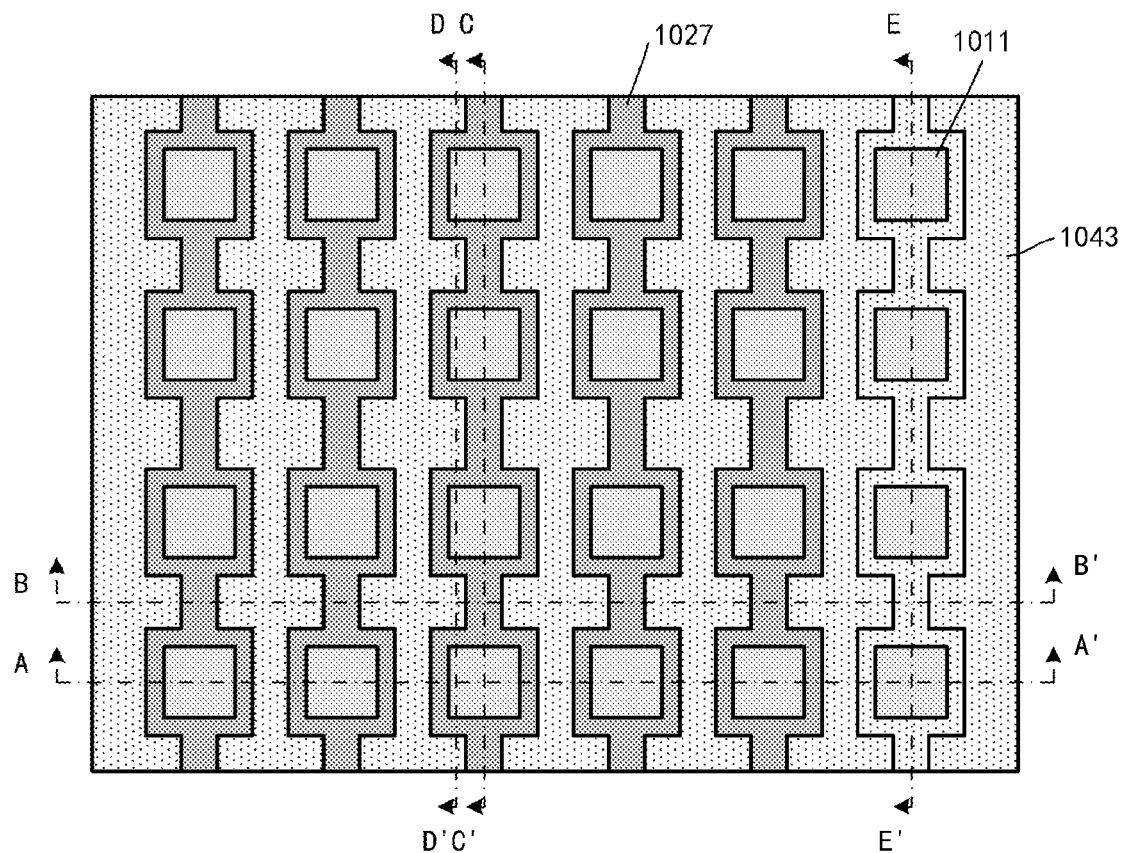

According to an embodiment of the present disclosure, contact plugs which are self-aligned may further be formed using the hard mask layer 1011. To this end, as shown in FIGS. 21(a), 21(b), 21(c), 21(d), 21(e) and 21(f) (FIGS. 21(a), 21(b), 21(c), 21(d) and 21(e) are sectional views, and FIG. 21(f) is a top view with line AA' indicating a position where the sectional view in FIG. 21(a) is taken, line BB' indicating a position where the sectional view in FIG. 21(b) is taken, line CC' indicating a position where the sectional view in FIG. 21(c) is taken, line DD' indicating a position where the sectional view in FIG. 21(d) is taken, and line EE' indicating a position where the sectional view in FIG. 21(e) is taken), for the purpose of electrical isolation, a dielectric may be filled in the gaps of the stack. In this example, the dielectric may have the same material, such as oxide, as the dielectric layer 1037, and therefore they are collectively shown as 1043. This may be done by, for example, depositing oxide and performing a planarization process such as CMP (which is stopped at the hard mask layer 1011). The dielectric layer 1043 may be etched back so that the dielectric layer 1043 has its top surface lowered to a level below, for example, the bottom surface of the hard mask layer 1011 to expose the hard mask layer 1011. Of course, in order to avoid possible influence on the gate stacks, the dielectric layer 1043 preferably has its top surface at a level above the top surface of the channel layer 1007.

In addition, as in the above processing of the channel layer and the source/drain layers, the hard mask layer 1011 may be selectively etched, particularly isotropically etched, to remove the bridge portions thereof, so that the hard mask layer 1011 is separated into portions at the respective sub-stacks. In order to control an amount of etching, ALE or digital etching may be used. Since the processing is performed in the same manner, the separated portions of the hard mask layer 1011 are self-aligned with the respective sub-stacks.

Thus, the manufacturing of the array of memory cells has substantially been completed. The array of memory cells includes an array of memory cells arranged in rows and columns. Gate stacks of respective memory cells in the same memory cell row extend continuously in the row direction, thereby forming word lines. The bit lines are self-aligned below the respective memory cell columns and extend in the column direction.

Then, the respective contacts of the device may be formed.

Figure 22A:
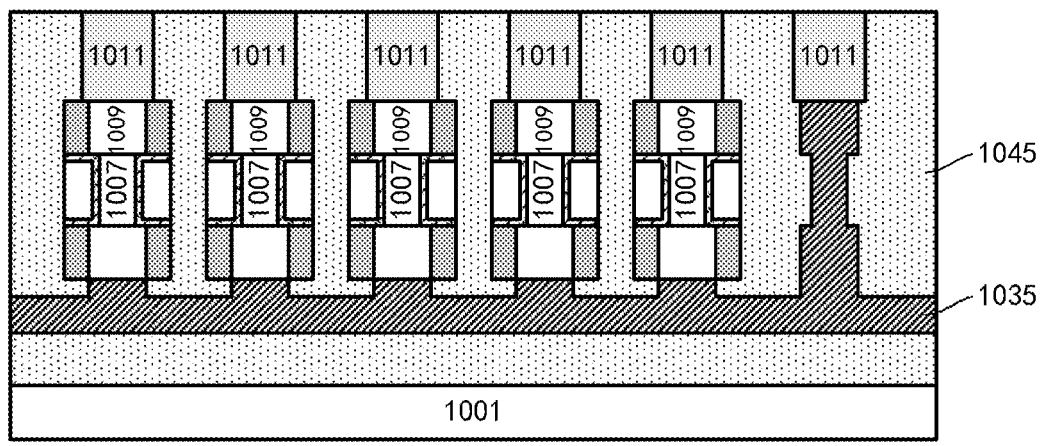
Figure 22B:
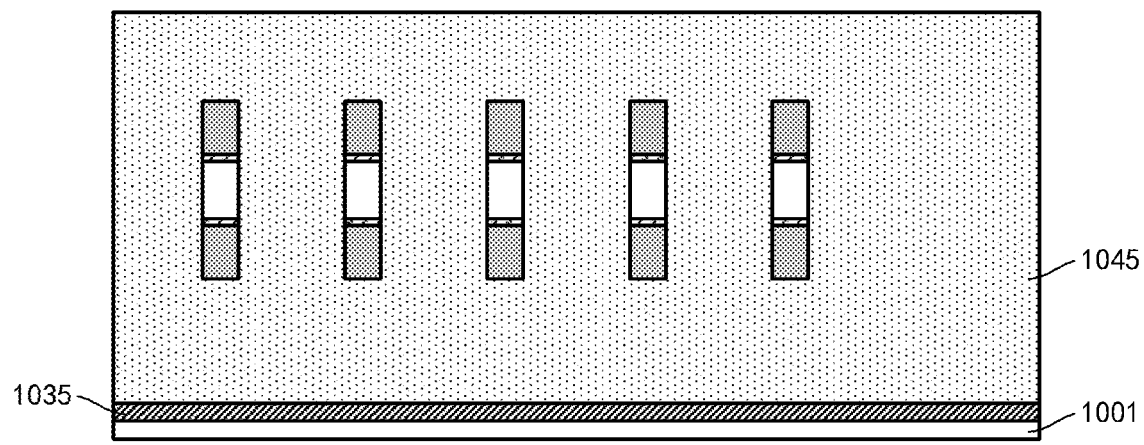

For example, as shown in FIGS. 22(a) and 22(b) (FIGS. 22(a) and 22(b) are sectional views taken along lines AA' and BB' respectively), a dielectric may be filled in the gaps of the stack for electrical isolation. Here, the filled dielectric is still oxide and is thus shown as 1045 along with the previous dielectric layer 1043. For example, oxide may be deposited on the structure shown in FIGS. 21(a), 21(b), 21(c), 21(d), 21(e) and 21(f) and the oxide may be planarized by, for example, CMP (which is stopped at the hard mask layer 1011) to form the dielectric layer 1045.

Figure 23A:
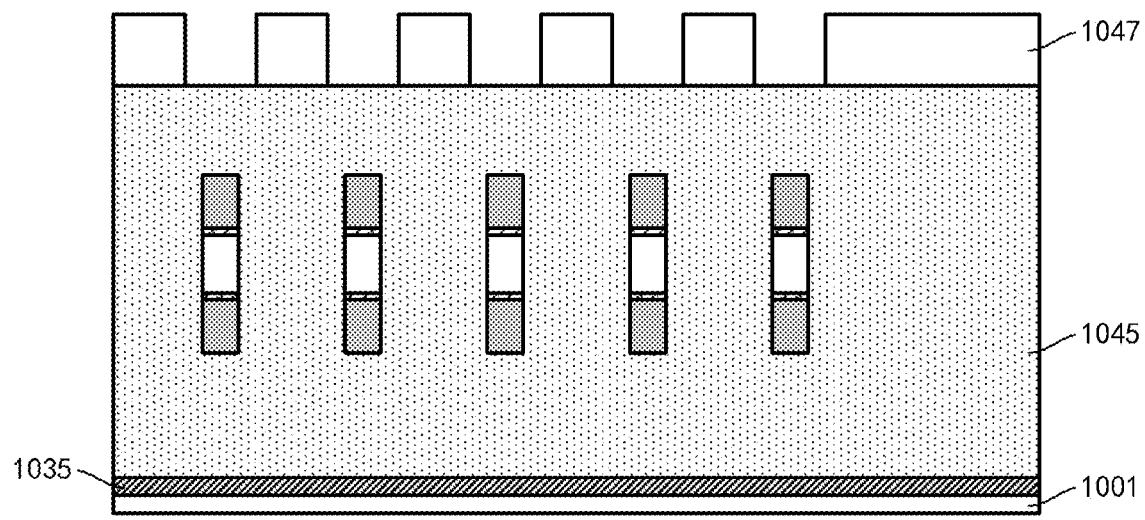
Figure 23B:
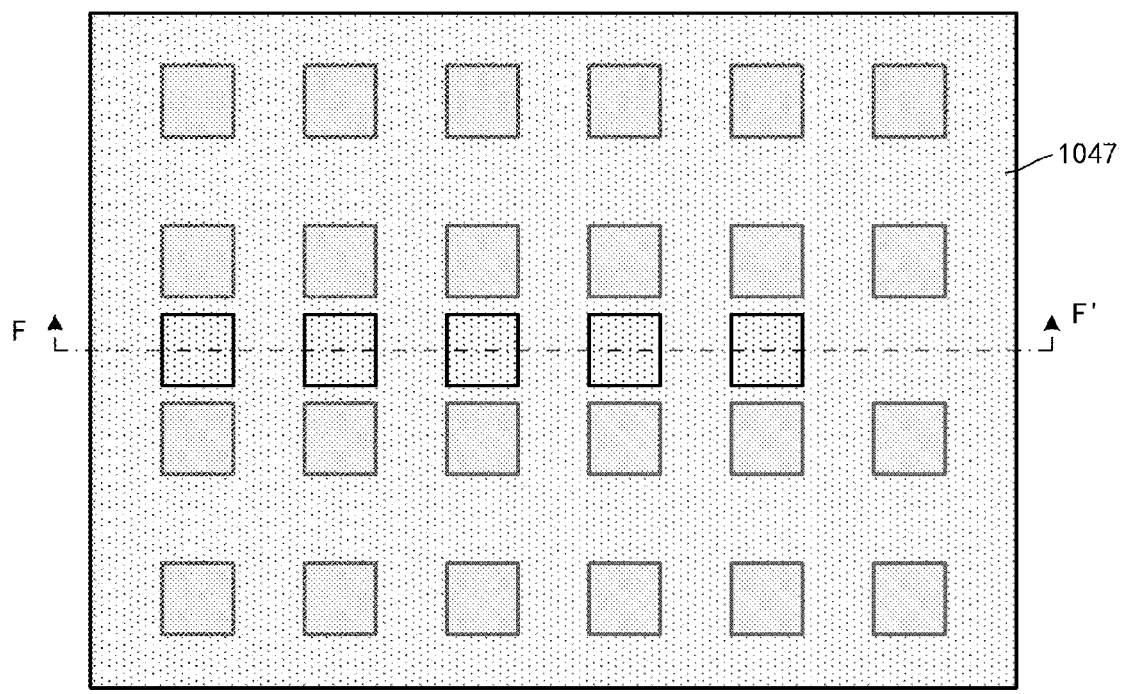

In addition, the positions of the contacts to the word lines may further be defined. For example, as shown in FIGS. 23(a) and 23(b) (FIG. 23(a) is a sectional view, and FIG. 23(b) is a top view with line FF' indicating a position where the sectional view in FIG. 23(a) is taken), a mask layer, such as photoresist 1047, is formed on the dielectric layer 1043 and the dielectric layer 1043 is patterned by photolithography to include several openings which may define the positions of the contacts to the word lines. For example, the openings may be located between the respective columns of sub-stacks, particularly between two groups with a relatively large spacing. Each opening may be located above a corresponding bit line (for example, a bridge portion of a corresponding gate stack) and adjacent openings are spaced apart from one another. Of course, in order to reduce contact resistance, positions between the respective columns of sub-stacks at different positions may be selected to form the contacts to the bit lines.

Figure 24:
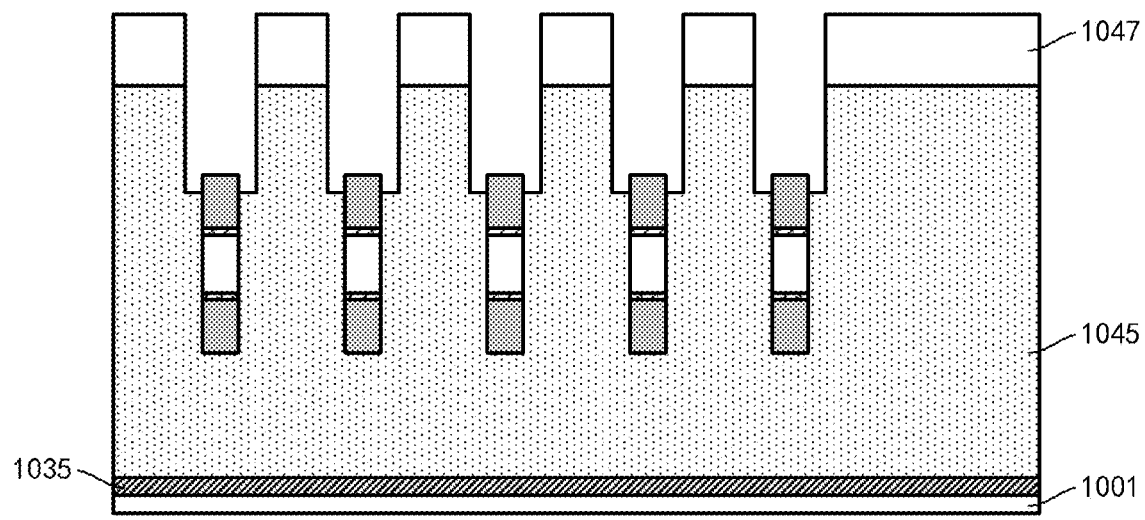

As shown in FIG. 24 (FIG. 24 is a sectional view taken along line FF'), the dielectric layer 1045 may be selectively etched by, for example, RIE (for example, in the direction substantially perpendicular to the substrate surface) using the photoresist 1047 as a mask, until the protection layer 1027 is at least partially exposed. Thus, trenches corresponding to the word lines are formed in the dielectric layer 1045, and (at least) a part of the protection layer 1027 may be exposed by the bottom of each of the trenches. Then, the photoresist 1047 may be removed.

Figure 25A:
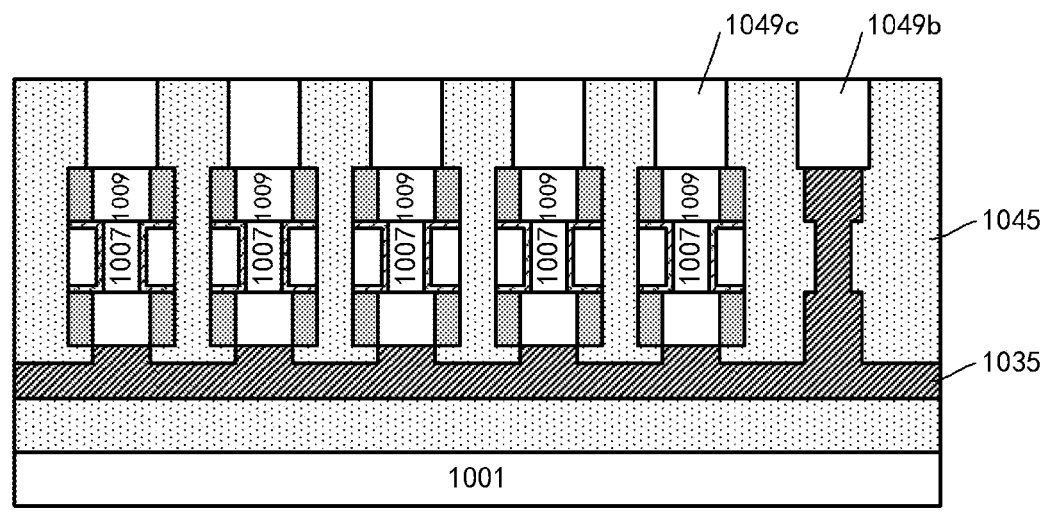
Figure 25:
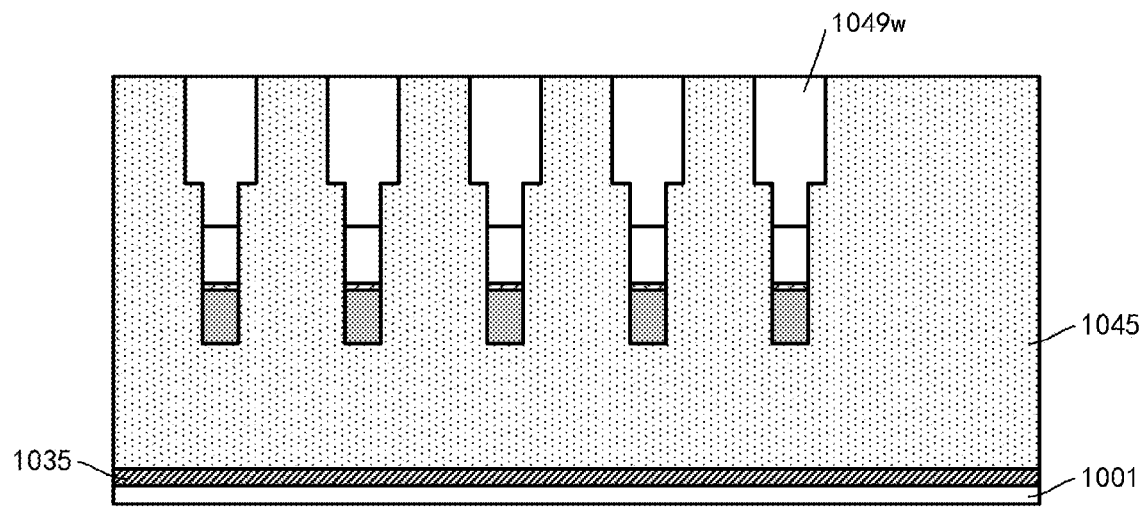

The hard mask layer 1011 may be removed by selective etching such as wet etching or RIE. In addition, the exposed protection layer 1027 and the gate dielectric layer which is exposed due to the removal of the protection layer 1027 may be removed by selective etching such as wet etching or RIE to expose the gate conductor layer in the trenches corresponding to the word lines. A conductive material, for example, metal such as W, may be filled in the spaces left in the dielectric layer 1045 due to the removal of the hard mask layer 1011, the protection layer 1027, and the gate dielectric layer, to form contact plugs 1049c of the memory cells, contact plugs 1049b of the bit lines, contact plugs 1049w of the word lines, as shown in FIGS. 25(a) and 25(b) (FIGS. 25(a) and 25(b) are sectional views taken along lines AA' and FF' respectively). The contact plugs 1049c and 1049b are obtained by replacing the hard mask layer 1011. Since the hard mask layer 1011 is self-aligned with the underlying sub-stacks, as shown in FIG. 25(*a*), the contact plugs 1049*c* of the memory cells are also self-aligned with the respective memory cells (particularly their active regions, such as the second source/drain layer 1009), and the contact plugs 1049*b* of the bit lines are self-aligned with portions of the metal semiconductor compound in the bit line contacts. Further, as shown in FIG. 25(*b*), lower portions of the contact plugs 1049*w* of the word lines are obtained by replacing the protection layer 1027 and the gate dielectric layer, and thus are also self-aligned with the underlying gate conductor layer or the word lines.

Figure 26:
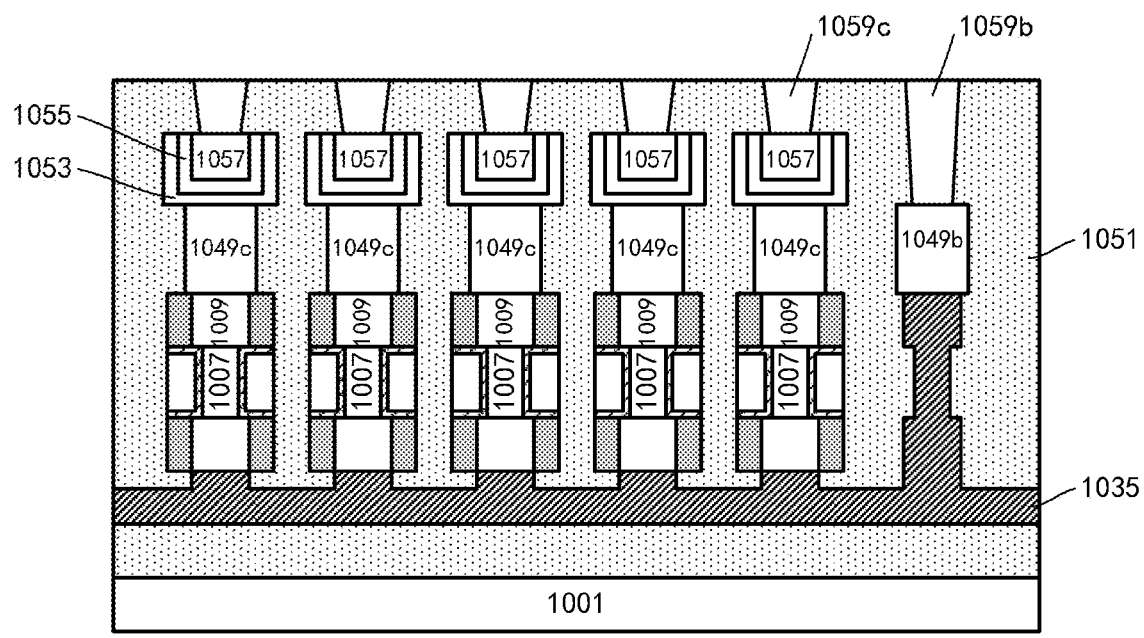
Figure 26B:
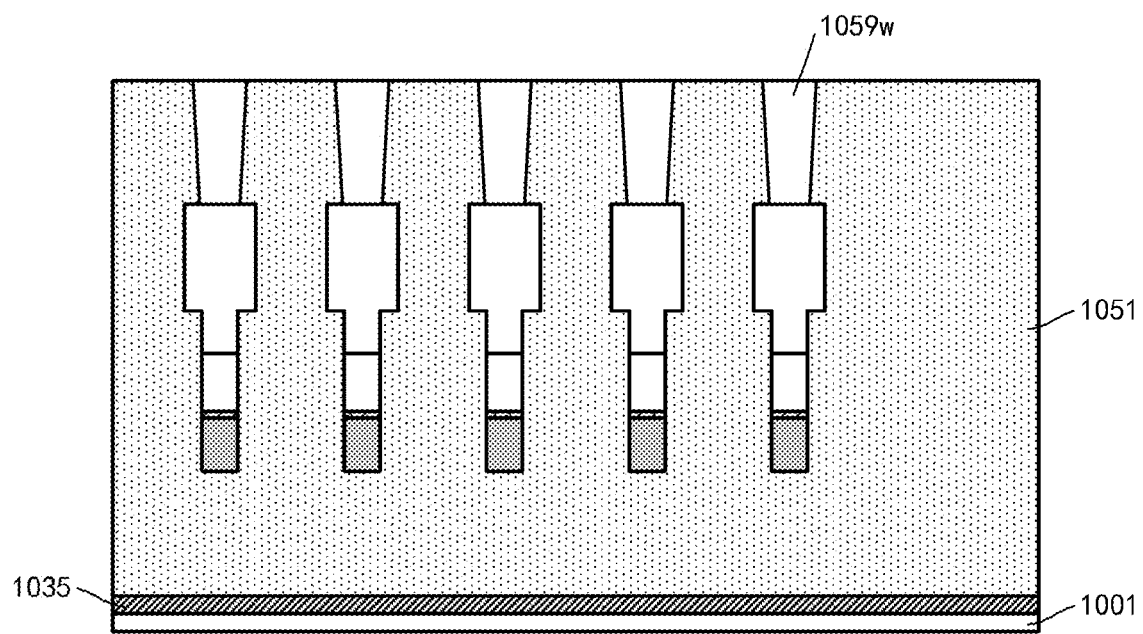
Figure 26C:
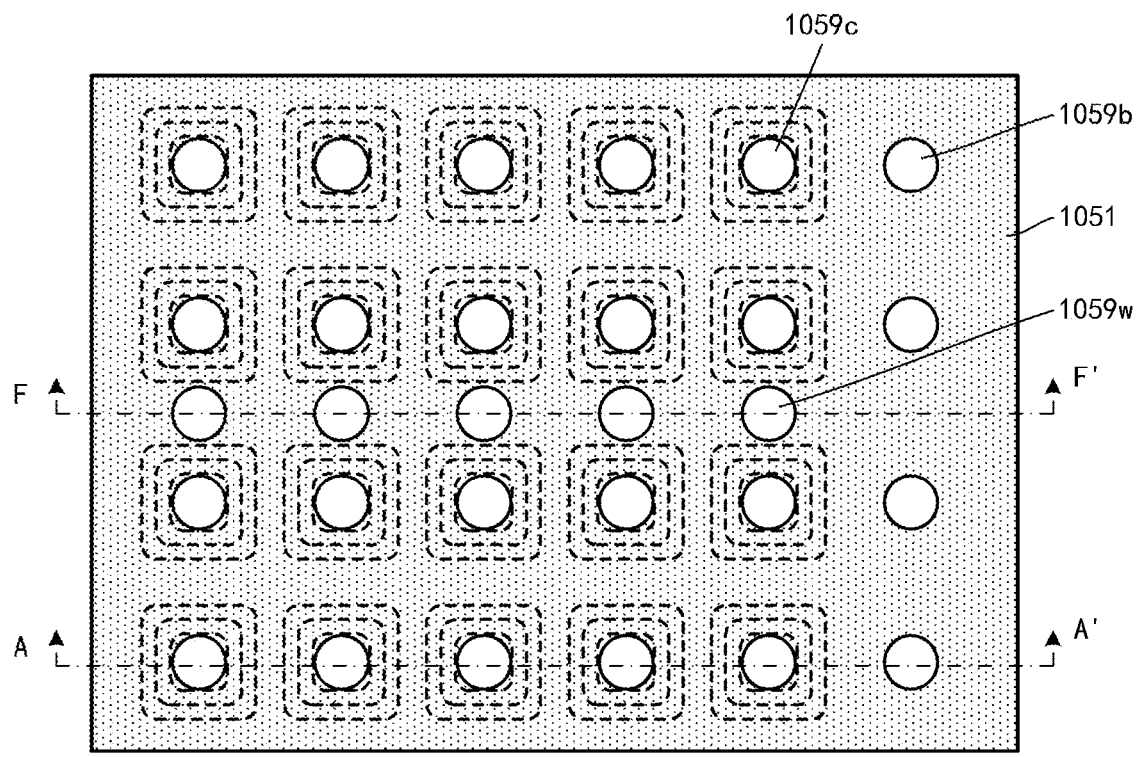

In an example in which a 1T1C configuration is formed, storage elements such as capacitors may further be formed. For example, as shown in FIGS. 26(*a*), 26(*b*) and 26(*c*) (FIGS. 26(*a*) and 26(*b*) are sectional views, and FIG. 26(*c*) is a top view with line AA' indicating a position where the sectional view in FIG. 26(*a*) is taken, and line FF' indicating a position where the sectional view in FIG. 26(*b*) is taken), an interlayer dielectric layer of, for example, oxide, with a first thickness, is formed on the dielectric layer 1045, and storage elements corresponding to the respective vertical devices may be formed in the interlayer dielectric layer with the first thickness. For example, holes corresponding to the respective vertical devices may be etched, and a first plate layer 1053, a capacitive dielectric layer 1055, and a second plate layer 1057 are sequentially filled in the holes to form capacitors as storage elements. For example, the first plate layer 1053 and the second plate layer 1057 may include metal, and the capacitive dielectric layer 1055 may include a high k dielectric. The capacitors may be electrically connected to upper source/drain regions of the respective vertical devices through the respective contact plugs 1049*c*.

Then, an interlayer dielectric layer of, for example, oxide, with a second thickness, may further be formed. The interlayer dielectric layer with the second thickness is shown as 1051 along with the interlayer dielectric layer with the first thickness and the dielectric layer 1045. Electrical contacts 1059*c* to the second plate layer 1061 of the respective capacitors, electrical contacts 1059*b* to the contact plugs 1049*b* of the respective bit lines, and electrical contacts 1059*w* to the contact plugs 1049*w* of the respective word lines may be formed in the interlayer dielectric layer 1051. These contacts may be formed by etching holes in the interlayer dielectric layer and filling a conductive material, for example, metal such as W therein. A diffusion barrier layer of, for example, TiN, may further be formed on sidewalls of the holes before the metal is filled.

The semiconductor memory devices according to the embodiments of the present disclosure are applicable to various electronic devices. For example, the electronic device may include such a memory device and a processor, the processor may read/write data from/to the semiconductor memory device. The electronic device may further comprise components such as a display and a wireless transceiver or the like operatively coupled to the processor. Such an electronic device may be, for example, a smart phone, a computer, a tablet Personal Computer (PC), an artificial intelligence, a wearable device, a mobile power supply, or the like.

In the above descriptions, techniques such as patterning, etching or the like of various layers are not described in detail. It is to be understood by those skilled in the art that various technical measures may be utilized to form the layers, regions or the like in desired shapes. Further, in order to form the same structure, those skilled in the art can devise processes not completely the same as those described above. Although various embodiments are described respectively above, it does not mean that measures in various embodiments cannot be used in combination advantageously.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

I claim:

1. A semiconductor memory device, comprising:
 a substrate;
 an array of memory cells provided on the substrate, wherein the memory cells are arranged in rows and columns, each of the memory cells comprises a pillar-shaped active region extending vertically, wherein the pillar-shaped active region comprises source/drain regions at upper and lower ends respectively and a channel region between the source/drain regions; and
 a plurality of bit lines formed on the substrate, wherein each of the bit lines is located below a corresponding one of the columns of memory cells and is electrically connected to the source/drain regions at lower ends of the respective memory cells in the corresponding column, wherein each of the bit lines is aligned with the source/drain regions at lower ends of the respective memory cells in the corresponding column,
 wherein each of the memory cells further comprises a gate stack formed around a periphery of a corresponding channel region, and a respective one of the rows of memory cells has gate conductor layers included in the gate stacks of the respective memory cells in the row extending continuously in a direction of the row to form a corresponding one of word lines.

2. The semiconductor memory device of claim 1, wherein each of the bit lines extends in a direction of the corresponding column and comprises first portions overlapping the respective memory cells in the corresponding column and second portions extending between the respective first portions, wherein at least a part of a periphery of the first portion of the bit line has a shape substantially the same as a part of a periphery of a corresponding memory cell.

3. The semiconductor memory device of claim 1, wherein each of the bit lines comprises a metal semiconductor compound formed on a surface of the source/drain region at the lower end.

4. The semiconductor memory device of claim 3, wherein the metal semiconductor compound comprises a metal element including Ni, Pt, Co, Ti, Si, Ge or a combination thereof.

5. The semiconductor memory device of claim 3, further comprising bit line contacts to the respective bit lines, wherein each of the bit line contacts comprises a metal semiconductor compound at a bottom thereof.

6. The semiconductor memory device of claim 5, wherein the metal semiconductor compound in each of the bit line contacts has a top surface substantially coplanar with a top surface of the source/drain regions at the upper ends of the memory cells.

7. The semiconductor memory device of claim 5, wherein in a direction of the column, the metal semiconductor compound in each of the bit line contacts is substantially centrally aligned with a corresponding one of the bit lines.

8. The semiconductor memory device of claim 7, wherein each of the bit line contacts further comprises a conductive plug on the metal semiconductor compound, wherein the conductive plug is substantially centrally aligned with the metal semiconductor compound in a vertical direction.

9. The semiconductor memory device of claim 3, wherein the metal semiconductor compound in each of bit line contacts has a shape substantially the same as a shape of the pillar-shaped active region.

10. The semiconductor memory device of claim 1, wherein the gate stacks of the respective memory cells are substantially coplanar.

11. The semiconductor memory device of claim 1, wherein the word lines are substantially coplanar with the gate stacks of the respective memory cells.

12. The semiconductor memory device of claim 1, wherein in the respective memory cells, the channel region and at least one of the source/drain regions have a crystal interface and/or a doping concentration interface therebetween.

13. The semiconductor memory device of claim 1, wherein the source/drain regions and the channel region comprise different semiconductor material layers.

14. The semiconductor memory device of claim 1, further comprising:
    storage elements formed above the respective pillar-shaped active regions and electrically connected to the respective source/drain regions at upper ends of the respective active regions.

15. The semiconductor memory device of claim 14, wherein the storage elements comprise capacitors.

16. The semiconductor memory device of claim 14, further comprising conductive plugs provided between the respective storage elements and the respective source/drain regions at the upper ends of the respective active regions for electrically connecting the respective storage elements with the respective source/drain regions, wherein the respective conductive plugs are substantially centrally aligned with the respective source/drain regions at the upper ends of the respective active regions.

17. The semiconductor memory device of claim 1, wherein the gate stacks of the memory cells comprise a floating gate configuration or a charge trapping layer or a ferro-electric material.

18. The semiconductor memory device of claim 1, wherein the channel regions comprise a single-crystalline semiconductor material.

19. The semiconductor memory device of claim 1, wherein when viewed by taking each two adjacent columns of memory cells as a group, a spacing between adjacent columns in each group is less than a spacing between columns opposing to each other in two adjacent groups.

20. The semiconductor memory device of claim 19, further comprising word line contacts to the respective word lines, wherein each of the word line contacts are provided at a position between two adjacent groups.

21. The semiconductor memory device of claim 20, wherein at least a part of the respective word line contacts which forms electrical connection with the respective word lines is self-aligned with the respective word lines.

22. The semiconductor memory device of claim 19, wherein a spacing between memory cells opposing to each other in adjacent rows is less than the spacing between adjacent columns in each group.

23. An electronic device comprising the semiconductor memory device of claim 1.

24. The electronic device of claim 23, further comprising:
    a processor configured to read/write data from/to the semiconductor memory device; and
    a display and a wireless transceiver operatively coupled to the processor.

25. The electronic device of claim 23, wherein the electronic device comprises a smart phone, a computer, a tablet computer, an artificial intelligence device, a wearable device, or a mobile power supply.

* * * * *